(12) United States Patent
Wang

(10) Patent No.: US 7,741,177 B2
(45) Date of Patent: *Jun. 22, 2010

(54) METHOD AND APPARATUS TRANSPORTING CHARGES IN SEMICONDUCTOR DEVICE AND SEMICONDUCTOR MEMORY DEVICE

(76) Inventor: Chih-Hsin Wang, 6585 Gillis Dr., San Jose, CA (US) 95120

(*) Notice: Subject to any disclaimer, the term of this patent is extended or adjusted under 35 U.S.C. 154(b) by 363 days.

This patent is subject to a terminal disclaimer.

(21) Appl. No.: 11/879,179

(22) Filed: Jul. 16, 2007

(65) Prior Publication Data
US 2007/0281426 A1    Dec. 6, 2007

Related U.S. Application Data

(63) Continuation of application No. 11/169,399, filed on Jun. 28, 2005, now Pat. No. 7,550,800, which is a continuation-in-part of application No. 11/007,907, filed on Dec. 8, 2004, now Pat. No. 7,115,942, which is a continuation-in-part of application No. 10/897,808, filed on Jul. 24, 2004, now abandoned, said application No. 11/879,179 is a continuation-in-part of application No. 11/120,691, filed on May 2, 2005, which is a continuation-in-part of application No. 10/457,249, filed on Jun. 6, 2003, now Pat. No. 6,958,513.

(60) Provisional application No. 60/585,238, filed on Jul. 1, 2004, provisional application No. 60/626,326, filed on Nov. 8, 2004.

(51) Int. Cl.
*H01L 21/336* (2006.01)
*H01L 21/331* (2006.01)
*H01L 21/8238* (2006.01)

(52) U.S. Cl. .......... 438/257; 438/211; 438/259; 438/261; 438/513; 257/314; 257/315; 257/316; 257/324; 257/E21.17; 257/E21.68; 257/E21.585; 257/E27.103; 365/185.18

(58) Field of Classification Search .......... 438/211, 438/257, 259, 261, 513; 257/314, 315, 316, 257/324, E21.17, E21.68, E21.585, E27.103; 365/185.18
See application file for complete search history.

(56) References Cited

U.S. PATENT DOCUMENTS 3,943,543 A    3/1976   Caywood (Continued)

OTHER PUBLICATIONS

U.S. Appl. No. 09/916,555, filed Mar. 2002, Wang et al.

(Continued)

*Primary Examiner*—Dao H Nguyen

(57) ABSTRACT

A method of providing a memory cell comprises providing a semiconductor substrate including a body of a first conductivity type, first and second regions of a second conductivity type and a channel between the first and second regions; arranging a first insulator layer adjacent to the substrate; arranging a charge storage region adjacent to the first insulator layer; arranging a second insulator layer adjacent to the charge storage region; arranging a first conductive region adjacent to the second insulator layer; arranging a layer adjacent to the first conductive region; arranging a second conductive region adjacent to the layer; and increasing mechanical stress of at least one of the first and second conductive regions. The second conductive region overlaps the first conductive region at an overlap surface, and wherein a line perpendicular to the overlap surface intersects at least a portion of the charge storage region.

68 Claims, 25 Drawing Sheets

U.S. PATENT DOCUMENTS

| | | | |
|---|---|---|---|
| 3,944,849 | A | 3/1976 | Tasch, Jr. et al. |
| 4,072,977 | A | 2/1978 | Bate et al. |
| 4,462,090 | A | 7/1984 | Iizuka et al. |
| 4,698,787 | A | 10/1987 | Mukherjee et al. |
| 4,957,877 | A | 9/1990 | Tam et al. |
| 5,029,130 | A | 7/1991 | Yeh |
| 5,053,839 | A | 10/1991 | Esquivel et al. |
| 5,070,480 | A | 12/1991 | Caywood |
| 5,095,344 | A | 3/1992 | Harari |
| 5,115,289 | A | 5/1992 | Hisamoto et al. |
| 5,146,426 | A | 9/1992 | Mukherjee et al. |
| 5,153,880 | A | 10/1992 | Owen et al. |
| 5,161,157 | A | 11/1992 | Owen et al. |
| 5,235,544 | A | 8/1993 | Caywood |
| 5,268,319 | A | 12/1993 | Harari |
| 5,270,980 | A | 12/1993 | Pathak et al. |
| 5,280,446 | A | 1/1994 | Ma et al. |
| 5,286,994 | A | 2/1994 | Ozawa et al. |
| 5,426,316 | A | 6/1995 | Mohammad |
| 5,429,965 | A | 7/1995 | Shimoji |
| 5,432,739 | A | 7/1995 | Pein |
| 5,487,033 | A | 1/1996 | Keeney et al. |
| 5,517,044 | A | 5/1996 | Koyama et al. |
| 5,523,243 | A | 6/1996 | Mohammad |
| 5,557,122 | A | 9/1996 | Shrivastava et al. |
| 5,559,735 | A | 9/1996 | Ono et al. |
| 5,563,083 | A | 10/1996 | Pein |
| 5,621,738 | A | 4/1997 | Caywood et al. |
| 5,714,766 | A | 2/1998 | Chen et al. |
| 5,739,567 | A | 4/1998 | Wong |
| 5,764,096 | A | 6/1998 | Lipp et al. |
| 5,768,192 | A | 6/1998 | Eitan |
| 5,780,341 | A | 7/1998 | Ogura |
| 5,790,455 | A | 8/1998 | Caywood |
| 5,792,670 | A | 8/1998 | Pio et al. |
| 5,822,242 | A | 10/1998 | Chen |
| 5,838,039 | A | 11/1998 | Sato |
| 5,847,427 | A | 12/1998 | Hagiwara |
| 5,847,996 | A | 12/1998 | Guterman et al. |
| 5,883,409 | A | 3/1999 | Guterman et al. |
| 5,966,329 | A | 10/1999 | Hsu et al. |
| 5,973,356 | A | 10/1999 | Noble et al. |
| 6,002,152 | A | 12/1999 | Guterman et al. |
| 6,080,995 | A | 6/2000 | Nomoto |
| 6,088,263 | A | 7/2000 | Liu et al. |
| 6,091,104 | A | 7/2000 | Chen |
| 6,103,573 | A | 8/2000 | Harari |
| 6,104,057 | A | 8/2000 | Nakanishi et al. |
| 6,201,732 | B1 | 3/2001 | Caywood |
| 6,211,562 | B1 | 4/2001 | Forbes et al. |
| 6,303,940 | B1 | 10/2001 | Kizilyalli et al. |
| 6,313,487 | B1 | 11/2001 | Kencke et al. |
| 6,368,915 | B1 | 4/2002 | Montree et al. |
| 6,372,617 | B1 | 4/2002 | Kitamura |
| 6,384,451 | B1 | 5/2002 | Caywood |
| 6,388,922 | B1 | 5/2002 | Fujiwara et al. |
| 6,407,424 | B2 | 6/2002 | Forbes |
| 6,411,545 | B1 | 6/2002 | Caywood |
| 6,426,896 | B1 | 7/2002 | Chen |
| 6,449,189 | B2 | 9/2002 | Mihnea et al. |
| 6,451,652 | B1 | 9/2002 | Caywood |
| 6,469,343 | B1 | 10/2002 | Mura et al. |
| 6,479,863 | B2 | 11/2002 | Caywood |
| 6,503,785 | B2 | 1/2003 | Chen |
| 6,525,371 | B2 | 2/2003 | Johnson |
| 6,525,962 | B1 | 2/2003 | Pai et al. |
| 6,531,731 | B2 | 3/2003 | Jones et al. |
| 6,534,816 | B1 | 3/2003 | Caywood |
| 6,555,865 | B2 | 4/2003 | Lee |
| 6,574,140 | B2 | 6/2003 | Caywood |
| 6,580,124 | B1 | 6/2003 | Cleeves et al. |
| 6,580,642 | B1 * | 6/2003 | Wang ................ 365/185.18 |
| 6,593,624 | B2 | 7/2003 | Walker |
| 6,621,107 | B2 | 9/2003 | Blanchard et al. |
| 6,680,505 | B2 | 1/2004 | Ohba et al. |
| 6,709,928 | B1 | 3/2004 | Jenne et al. |
| 6,721,205 | B2 | 4/2004 | Kobayashi et al. |
| 6,734,105 | B2 | 5/2004 | Kim |
| 6,744,111 | B1 | 6/2004 | Wu |
| 6,745,370 | B1 | 6/2004 | Segal et al. |
| 6,747,310 | B2 | 6/2004 | Fan |
| 6,753,568 | B1 | 6/2004 | Nakazato et al. |
| 6,756,633 | B2 | 6/2004 | Wang et al. |
| 6,790,727 | B2 | 9/2004 | Jones |
| 6,791,883 | B2 | 9/2004 | Swift et al. |
| 6,815,764 | B2 * | 11/2004 | Bae et al. .................. 257/324 |
| 6,847,556 | B2 | 1/2005 | Cho |
| 6,853,583 | B2 | 2/2005 | Diorio et al. |
| 6,873,006 | B2 | 3/2005 | Chen et al. |
| 6,894,339 | B2 | 5/2005 | Fan et al. |
| 6,894,343 | B2 | 5/2005 | Harari et al. |
| 6,897,514 | B2 | 5/2005 | Kouznetsov et al. |
| 6,936,884 | B2 | 8/2005 | Chae et al. |
| 6,952,032 | B2 | 10/2005 | Forbes et al. |
| 6,952,033 | B2 | 10/2005 | Kianian et al. |
| 6,953,970 | B2 | 10/2005 | Yuan et al. |
| 7,015,102 | B2 | 3/2006 | Wang |
| 7,074,672 | B2 | 7/2006 | Kianian et al. |
| 7,115,942 | B2 | 10/2006 | Wang |
| 7,149,118 | B2 | 12/2006 | Diorio et al. |
| 7,190,018 | B2 | 3/2007 | Chen et al. |
| 7,259,984 | B2 | 8/2007 | Kan et al. |
| 7,274,068 | B2 | 9/2007 | Forbest |
| 7,381,604 | B2 * | 6/2008 | Lin et al. ..................... 438/197 |
| 7,505,321 | B2 * | 3/2009 | Scheuerlein et al. ... 365/185.17 |
| 2005/0167734 | A1 | 8/2005 | She et al. |
| 2005/0247972 | A1 | 11/2005 | Forbes |
| 2006/0284236 | A1 | 12/2006 | Bhattacharyya |
| 2007/0281425 | A1 * | 12/2007 | Wang ......................... 438/261 |

OTHER PUBLICATIONS

U.S. Appl. No. 10/848,982, filed Oct. 2004, Wang.
U.S. Appl. No. 10/850,031, filed Oct. 2004, Wang et al.
U.S. Appl. No. 10/105,741, Sep. 2003, Kianian et al.
U.S. Appl. No. 10/192,291, Jul. 2003, Wang.
U.S. Appl. No. 09/925,134, Jan. 2004, Haran et al.
U.S. Appl. No. 10/718,662, Jul. 2004, Kan et al.
U.S. Appl. No. 10/776,483, Aug. 2004, Kianian et al.
U.S. Appl. No. 10/799,180, Sep. 2004, Yuan et al.
U.S. Appl. No. 10/797,296, Dec. 2004, Lee at al.
U.S. Appl. No. 10/183,834, Jul. 2003, Wang et al.
U.S. Appl. No. 09/942,338, Feb. 2004, Caywood.
U.S. Appl. No. 09/955,285, filed Dec. 2002, Kim.
U.S. Appl. No. 09/881,332, filed Dec. 2002, Jones et al.
U.S. Appl. No. 10/330,851, filed Jul. 2003, Lee et al.
U.S. Appl. No. 10/348,267, filed Jul. 2003, Jones et al.
U.S. Appl. No. 10/040,724, filed May 2003, Wang et al.
U.S. Appl. No. 10/409,407, filed Oct. 2004, Chen et al.
U.S. Appl. No. 10/849,975, filed Oct. 2004, Wang et al.
U.S. Appl. No. 10/791,486, filed Aug. 2004, Harari.
U.S. Appl. No. 10/393,896, filed Sep. 2004, Chen et al.
U.S. Appl. No. 09/866,938, filed Oct. 2001, Noble et al.
U.S. Appl. No. 10/066,376, filed Oct. 2002, Kouznetsov et al.
U.S. Appl. No. 10/205,289, filed Mar. 2003, Wang.
U.S. Appl. No. 09/860,704, filed Nov. 2003, Harari et al.
U.S. Appl. No. 10/457,249, filed Dec. 2004, Wang.
Bock et al; "3.3ps SiGe Bipolar Technology," Proceeding of the IEDM, pp. 255-258; 2004.
Caywood, John M. et al; "A Novel Nonvolatile Memory Cell Suitable for Both Flash and Byte-Writable Applications"; IEEE Transactions on Electron Devices, vol. 49, No. 5, May 2002; pp. 802-807.

Kitamura et al; "A Low Voltage Operating Flash Cell with High Coupling Ratio Using Horned Floating Gate with Fine HSG"; 1998 Symposium on FLSI Technology Digest of Technical Papers; pp. 104-105.

Kuo et al; "FEFET—A High Density, Low Erase Voltage, Trench Flash EEPROM"; 1994 Symposium on VLSI Technology Digest of Technigal Papers; pp. 51-52.

Lai, Stefan; "Flash Memories: Where We Were and Where We Are Going"; 1998 IEEE; pp. 971-973.

M. Heiblum et al; "Direct Observation of ballistic Transport in GaAs," pp. 2200-2203, vol. 55, Physical Review Letters; 1985.

SMA5111—Compound Semiconductors; Lecture 2—Metal-Semiconductor Junctions—Outline; C. G. Fonstad; Feb. 2003; 22 pages.

Wang, Chih Hsin; "Three-Dimensional DIBL for Shallow-Trench Isolated MOSFET's"; IEEE Transactions on Electron Devices, vol. 46, No. 1, Jan. 1999; pp. 139-144.

C. A. Mead, "The Tunnel-Emission Amplifier", Proceedings of the IRE, pp. 359-361, 1960.

H. Fujiwara et al, "High-Efficiency Programming with Inter-Gate Hot-Electron Injection for Flash . . . ," Digest of Non-Volatile Semiconductor Memory Workshop, p. 127, Feb. 2000.

S. Sze, "Physics of Semiconductor Devices," Wiley-Interscience, 1981, "Schottky Effect", pp. 250-253.

Lenzlinger and Snow, "Fowler-Nordheim Tunneling into Thermally Grown SiO2," J. Appl. Phys., 40, pp. 278-283 (1969).

Nicollian and Brews, "MOS Physics and Technology," Wiley-Interscience, 1982, "Photo IN method—Basics", pp. 512-515.

Fischetti et al., "Six band k.p calculation of hole mobility in silicon inversion layers: dependence on surface . . . ," Journal of Appl. Physics, vol. 94, pp. 1079-1095, 2003.

Hensel et al., Cyclotron Resonance Experiments in Uniaxially Stressed Silicon: Valence Band Inverse Mass Parameters and Deformation . . . , Phys. Rev. 129, pp. 1141-1062, 1963.

Vogelsang et al., "Electron Mobilities and High-Field Drift Velocity in Strained Silicon on Silicon-Germanium Substrate", IEEE Trans. on Electron Devices, pp. 2641-2642, 1992.

Hinckley et al., "Hole Transport Theory in Pseudomorphic Si1-xGex Alloys Grown on Si(001) Substrates," Phys. Rev. B, 41, pp. 2912-2926, 1990.

Pein, H. et al; "Performance of the 3-D Sidewall Flash EPROM Cell", IEDM Technical Digest, pp. 11-14, Dec. 1993.

First Examination Report from the State Intellectual Property Office of the People's Republic of China dated Aug. 30, 2007 for Chinese Application No. 2005100804259; 9 pages.

First Examination Report from the State Intellectual Property Office of the People's Republic of China dated Sep. 6, 2007 for Chinese Application No. 2005100804314; 8 pages.

* cited by examiner

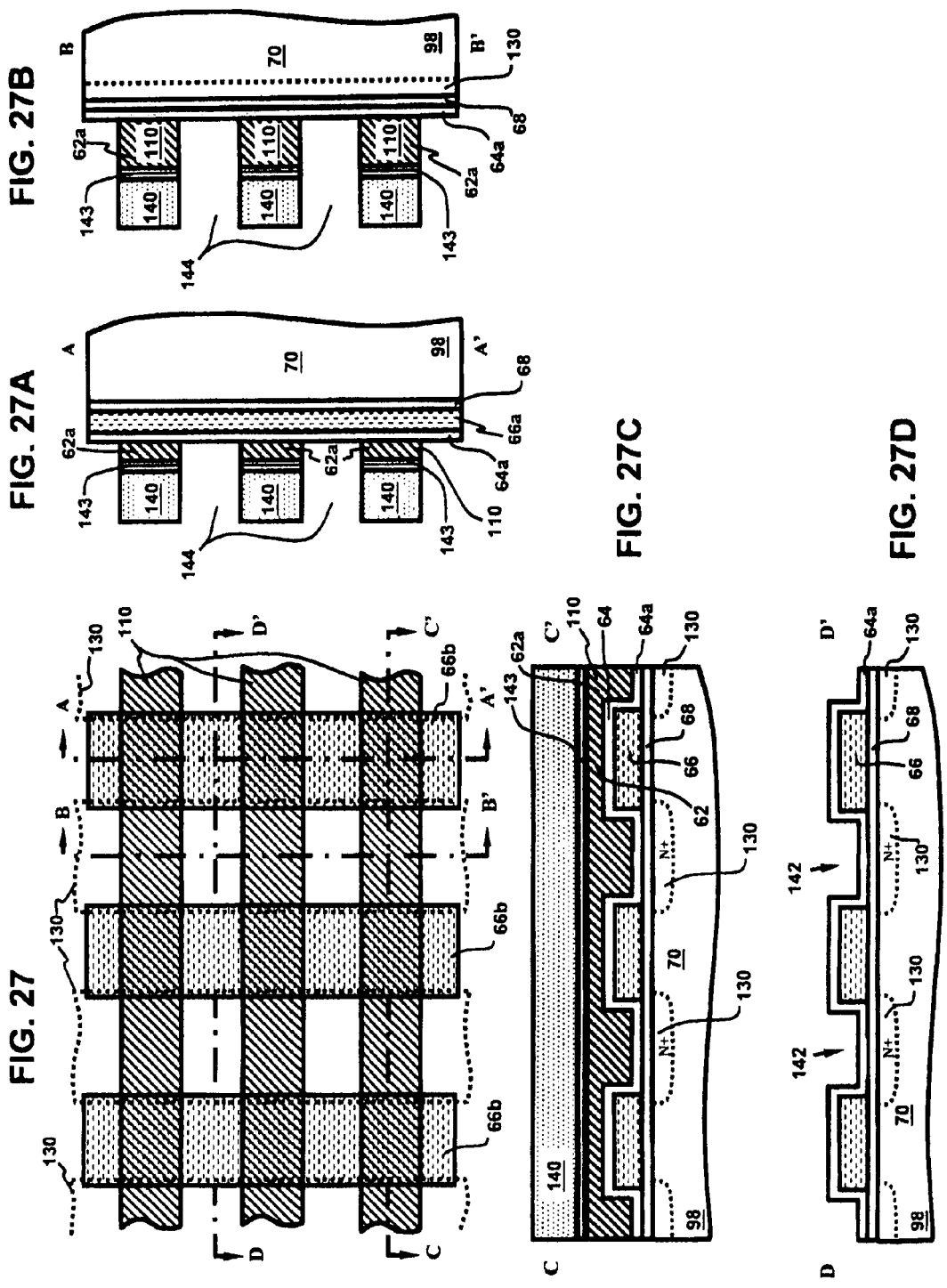

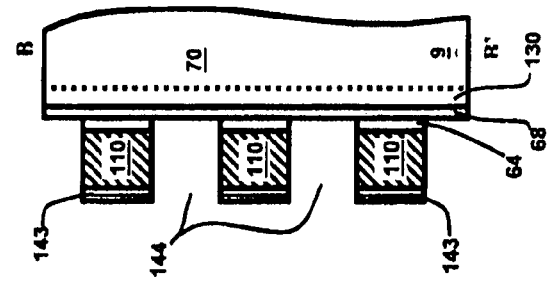
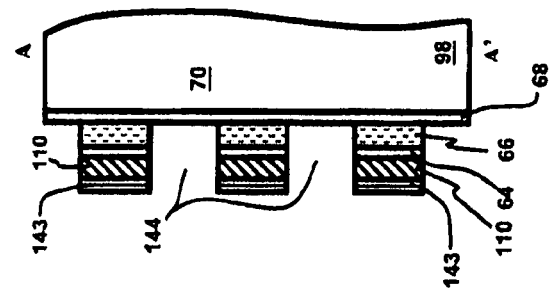
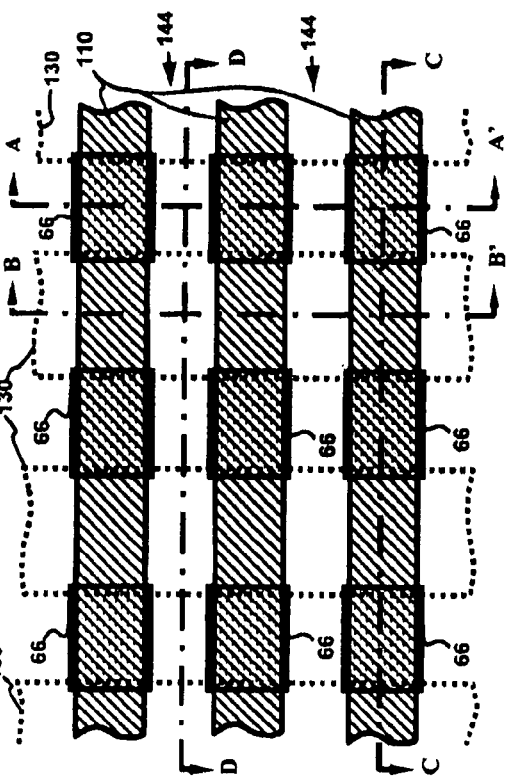
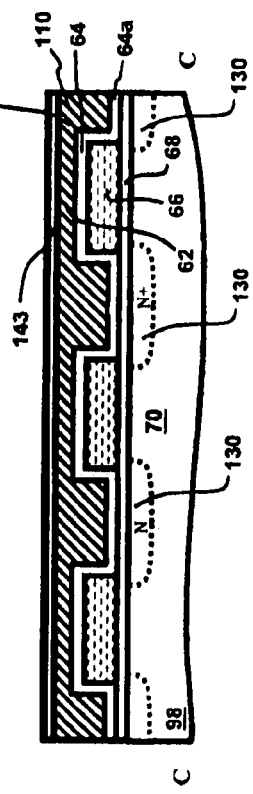
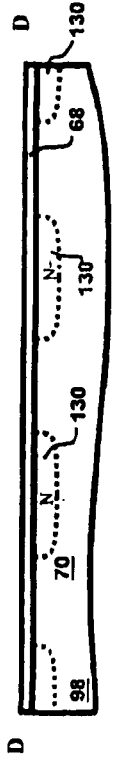

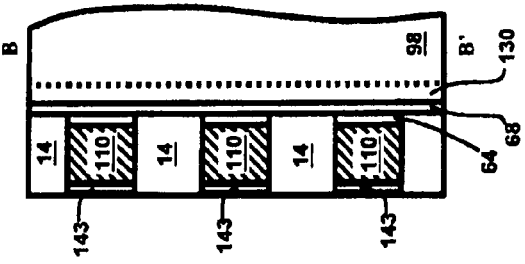
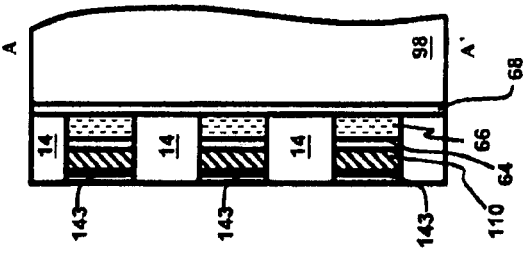
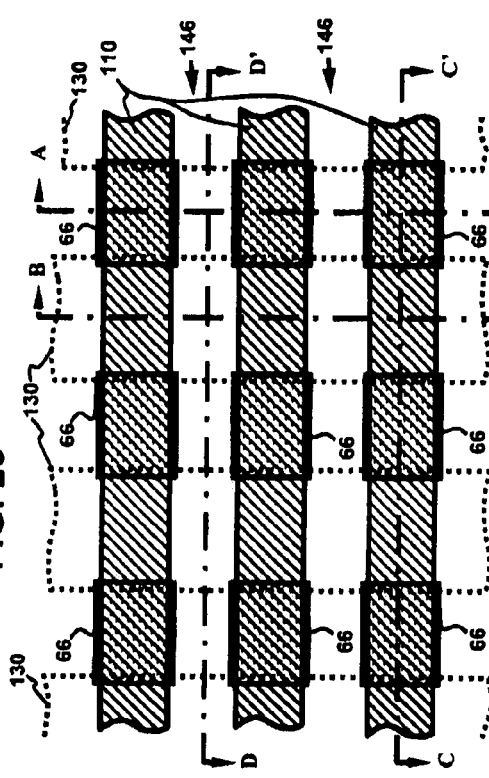
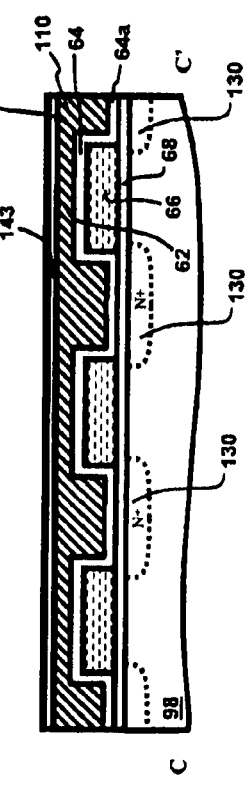
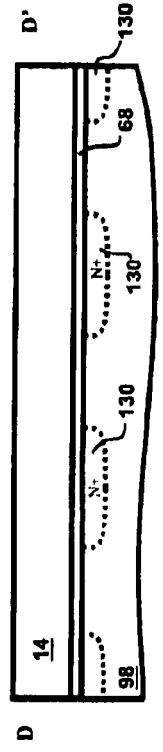

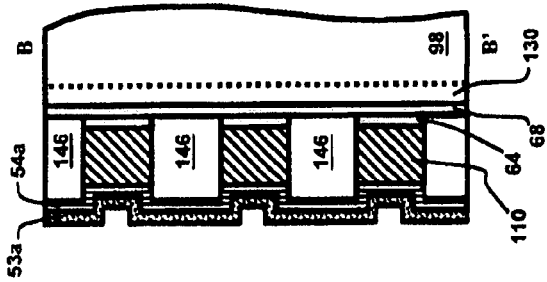
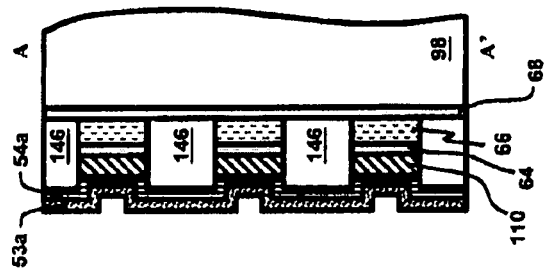
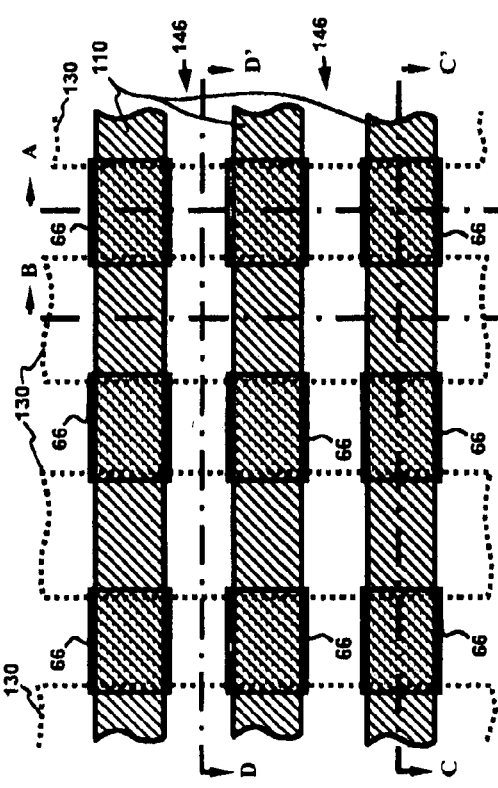
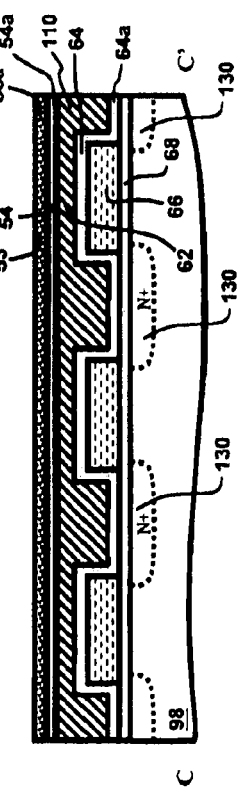
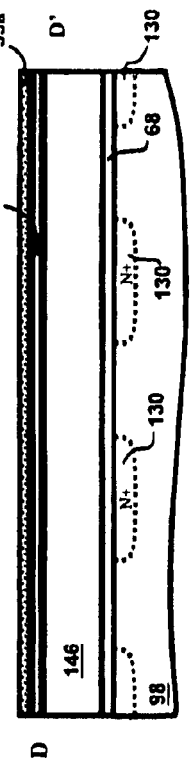

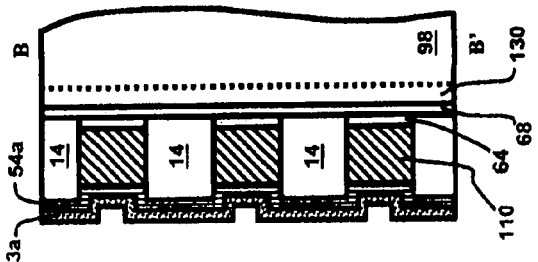
FIG. 31B
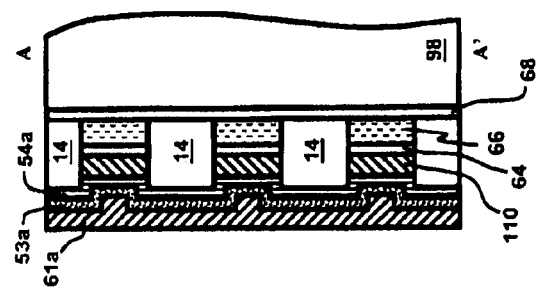
FIG. 31A
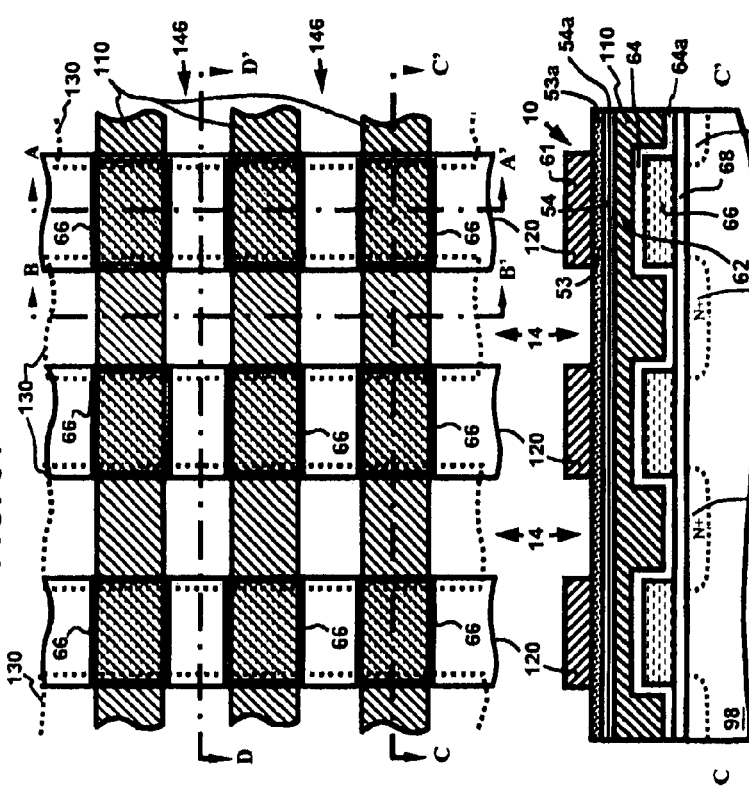
FIG. 31
FIG. 31C
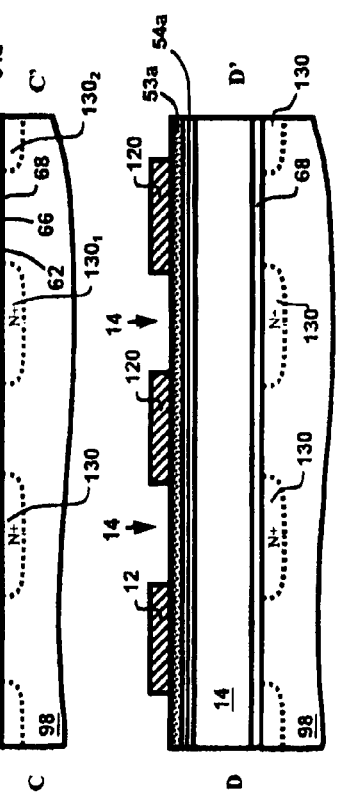
FIG. 31D

METHOD AND APPARATUS TRANSPORTING CHARGES IN SEMICONDUCTOR DEVICE AND SEMICONDUCTOR MEMORY DEVICE

RELATED APPLICATIONS

This application is a continuation of Ser. No. 11/169,399, filed Jun. 28, 2005, which application claims the benefit of U.S. Provisional Patent Application Ser. No. 60/585,238 filed Jul. 1, 2004 and U.S. Provisional Patent Application Ser. No. 60/626,326 filed Nov. 8, 2004. This application is a Continuation-In-Part of U.S. patent application Ser. No. 11/007,907 filed on Dec. 8, 2004, entitled "METHOD AND APPARATUS FOR NONVOLATILE MEMORY", which claims the benefit of U.S. Provisional Patent Application Ser. Nos. 60/626,326 filed Nov. 8, 2004 and 60/585,238 filed Jul. 1, 2004 and which is a Continuation-In-Part of U.S. patent application Ser. No. 10/897,808 filed on Jul. 24, 2004 (now abandoned), which claims the benefit of U.S. Provisional Patent Application Ser. No. 60/585,238 filed Jul. 1, 2004. This application is also a Continuation-In-Part of U.S. patent application Ser. No. 11/120,691 filed on May 2, 2005, entitled "ELECTRICALLY ALTERABLE MEMORY CELL", which claims the benefit of U.S. Provisional Patent Application Ser. No. 60/585,238 filed Jul. 1, 2004. This application is also a Continuation-In-Part of U.S. patent application Ser. No. 10/457,249 filed on Jun. 6, 2003, entitled "FLOATING-GATE MEMORY CELL HAVING TRENCH STRUCTURE WITH BALLISTIC-CHARGE INJECTOR, AND THE ARRAY OF MEMORY CELLS".

TECHNICAL FIELD

The present invention relates to semiconductor device and semiconductor memory device. More particularly, the present invention relates to methods and apparatus on transporting charges in these devices.

BACKGROUND OF THE INVENTION

Image-Force is a well-known subject such as described in a publication by Sze, entitled "Physics of Semiconductor Devices," Wiley, New York, 1981, Chapter 5. The Image-Force can induce barrier-lowering to cause Image-Force barrier lowering effect and is the main mechanism governing the Schottky Effect for charge carrier emission.

Image-Force is also discussed in an article by Lenzlinger and Snow entitled "Fowler-Nordheim Tunneling into Thermally Grown $SiO_2$," J. Appl. Phys., 40, pp. 278-283 (1969), wherein effect of Image-Force is incorporated into Fowler-Nordheim Tunneling mechanism when thermal carriers are tunneled through $SiO_2$ ("oxide") via such mechanism.

A few attempts have been made to profile oxide charge distribution in oxide by utilizing Image-Force in together with Photo I-V measurement method (see publication by Nicollian and Brews, entitled "MOS Physics and Technology," Wiley, New York, 1982, Chapter 11, p. 513). Image-Force and such method have also been utilized on studying barrier heights at interfaces between metal and oxide, and between silicon ("Si") and oxide.

In U.S. Pat. No. 6,744,111 which issued on Jun. 1, 2004 to Wu, a three-terminal semiconductor transistor device having an emitter, a base, and a collector is described. Schottky barrier junctions are formed at interfaces of emitter and base regions, and at interface of collector and base regions. Such device uses Schottky Effect (through Image-Force barrier-lowering mechanism) and permits tunneling currents through the Schottky barrier junctions via controlling the voltage of the base region.

All the above examples and attempts, however, utilize the Image-Force mechanism for applications irrelevant to non-volatile memory.

Non-volatile semiconductor memory cells permitting charge storage capability are well known in the art. The charges are typically stored in a floating gate to define the states of a memory cell. Typically, the states can be either two levels or more than two levels (for multi-level states storage). Mechanisms such as channel hot electron injection (CHEI), source-side injection (SSI), Fowler-Nordheim tunneling (FN), and Band-to-Band Tunneling (BTBT) induced hot-electron-injection can be used to alter the states of such cells in program and/or erase operations. Examples on employing such mechanisms for memory operations can be seen in U.S. Pat. Nos. 4,698,787, 5,029,130, 5,792,670 and 5,966,329 for CHEI, SSI, FN, and BTBT mechanisms, respectively.

All the above mechanisms and attempts, however, have poor injection efficiency (defined as the ratio of number of carriers collected to the number of carriers supplied). Further, these mechanisms require high voltages to support the memory operation, and voltage as high as 10V is often seen. It is believed that the high voltage demands stringent control on the quality of the insulator surrounding the floating gate. The memories operated under these mechanisms thus are vulnerable to manufacturing and reliability problems.

In light of the foregoing problems, it is an object of the present invention to provide an insulating barrier in a conductor-insulator system that can be operated to enhance carrier injection efficiency and to reduce operation voltages. It is another object of the present invention to provide charge carriers (electrons or holes) transporting with tight energy distribution and high injection efficiency. Other objects of the inventions and further understanding on the objects will be realized by referencing to the specifications and drawings.

SUMMARY OF THE INVENTION

It is the object of the present invention to provide method and apparatus for charge filtering and injection in semiconductor devices and memory.

Briefly, one embodiment of the present invention is a conductor-filter system. The conductor-filter system comprises a conductor supplies thermal charge carriers, and a filter contacting the conductor. The filter includes dielectrics for providing a filtering function on the charge carriers of one polarity, wherein the filter includes electrically alterable potential barriers for controlling flow of the charge carriers of one polarity through the filter in one direction.

In addition to controlling the one polarity of charge carriers, the filter further includes another set of electrically alterable potential barriers for controlling the flow of charge carriers of an opposite polarity through the filter in another direction that is substantially opposite to the one direction.

Briefly, another embodiment of the present invention is a conductor-insulator system. The conductor-insulator system comprises a conductor having energized charge carriers with an energy distribution, and an insulator contacting the conductor at an interface. The insulator has an Image-Force potential barrier adjacent to the interface, wherein the Image-Force potential barrier is electrically alterable to permit the energized charge carriers transporting there over. In one preferred embodiment, the energized charge carriers have an energy distribution with an energy spectrum in the range of about 30 meV to about 300 meV.

Briefly, an additional embodiment of the present invention is a charge-injection system. The charge-injection system comprises a conductor-filter system having a conductor for supplying thermal charge carriers, and a filter contacting the conductor and including dielectrics for providing a filtering function on the charge carriers of one polarity. The filter includes one set of electrically alterable potential barriers for controlling flow of the charge carriers of one polarity through the filter in one direction, and further includes another set of electrically alterable potential barriers for controlling flow of charge carriers of an opposite polarity through the filter in another direction that is substantially opposite to the one direction. The charge-injection system further comprises a conductor-insulator system. The conductor-insulator system includes a second conductor contacting the filter and having energized charge carriers from the filter, and an insulator contacting the second conductor at an interface and having an Image-Force potential barrier adjacent to the interface. The Image-Force potential barrier is electrically alterable to permit the energized charge carriers transporting there over.

Briefly, a still additional embodiment of the present invention is a memory cell. The memory cell comprises a conductor-filter system having a conductor for supplying thermal charge carriers, and a filter contacting the conductor and including dielectrics for providing a filtering function on the charge carriers of one polarity. The filter includes a first set of electrically alterable potential barriers for controlling flow of the charge carriers of one polarity through the filter in one direction, and a second set of electrically alterable potential barriers for controlling flow of charge carriers of an opposite polarity through the filter in another direction that is substantially opposite to the one direction.

The foregoing and other objects, features and advantages of the present invention will be apparent from the following detailed description in conjunction with the drawings.

BRIEF DESCRIPTION OF THE DRAWINGS

The invention is herein described, by ways of example only, with reference to the accompanying drawings, wherein

FIGS. 27-32 are top views of the structures showing in sequence the next step(s) in the formation of a memory array and cells in accordance with the present invention;

FIGS. 27A-32A are cross sectional views taken along the line A-A' in FIGS. 27-32 illustrating in sequence the next steps in processing to form the memory cells and array in accordance with the present invention;

FIGS. 27B-32B are cross sectional views taken along the line B-B' in FIGS. 27-32 illustrating in sequence the next steps in processing to form the memory cells and array in accordance with the present invention;

FIGS. 27C-32C are cross sectional views taken along the line C-C' in FIGS. 27-32 illustrating in sequence the next steps in processing to form the memory cells and array in accordance with the present invention;

FIGS. 27D-32D are cross sectional views taken along the line D-D' in FIGS. 27-32 illustrating in sequence the next steps in processing to form the memory cells and array in accordance with the present invention.

DETAILED DESCRIPTION OF THE INVENTION

As used herein, the symbol n+ indicates a heavily doped n-type semiconductor material typically having a doping level of n-type impurities (e.g. arsenic) on the order of $10^{20}$ atoms/cm$^3$. The symbol p+ indicates a heavily doped p-type semiconductor material typically having a doping level of p-type impurities (e.g. boron) on the order of $10^{20}$ atoms/cm$^3$. Where appropriate, the same reference indicators will be used throughout the drawings and the following detailed description to refer to the same or similar parts.

Figure 1:
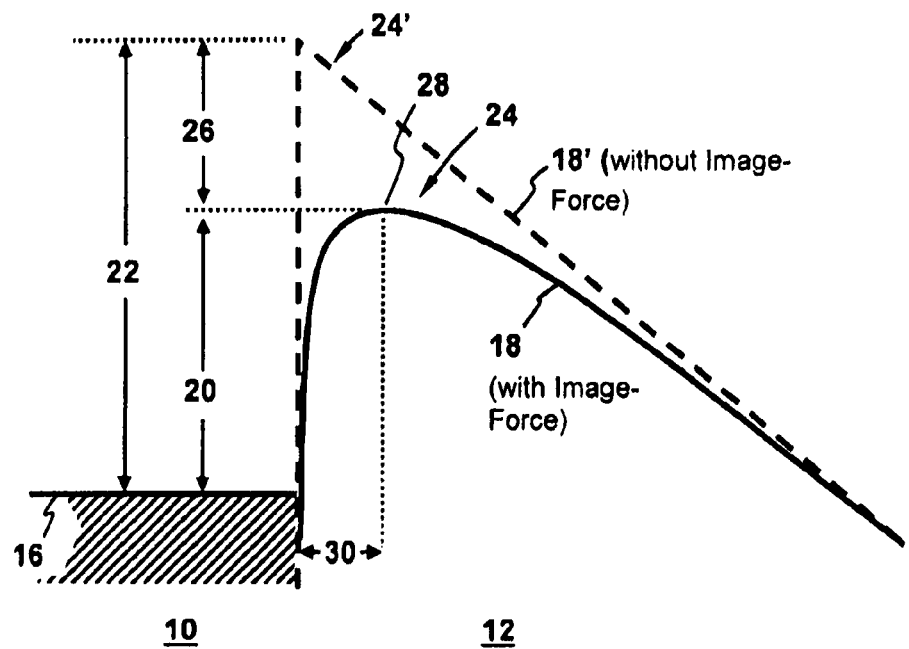
FIG. 1 is an energy band diagram for a conductor-insulator system. The energy-band of the insulator is shown on conduction band for cases with and without the Image-Force effect.

FIG. 1 shows an energy-band diagram for a conductor-insulator system when an electric field is applied. The diagram shows a conductor 10 contacting an insulator 12 and having a Fermi-level energy 16 in its energy-band. Further, the energy-band of the insulator 12 is shown on conduction band 18 and 18' for cases with and without the Image-Force effect, respectively. Additionally, there are shown barrier heights $\phi_b$ 20 and $\phi_{b0}$ 22 of potential barriers 24 and 24' formed by the insulator 12 for cases with and without the Image-Force effect, respectively. The Image-Force effect is shown to alter the shape of the potential barrier from a triangle barrier 24' having a sharp corner at barrier edge to a triangle barrier 24 having a smooth corner ("Image-Force potential barrier" or "Image-Force barrier"). The effect lowers the potential barrier from barrier height 22 to barrier height 20 by a barrier offset $\Delta\phi_b$ 26, and is termed Image-Force barrier lowering effect. A barrier peak 28 is shown at the peak of the Image-Force barrier 24 having a location at a distance $X_m$ 30 away from an interface between conductor 10 and insulator 12.

In FIG. 1, the conductor can be a semiconductor, such as n+ polycrystalline Silicon ("polysilicon"), p+ polysilicon, heavily-doped polycrystalline Silicon-Germanium ("poly SiGe"), or a metal, such as aluminum (Al), platinum (Pt), Au, Tungsten (W), Molybdenum (Mo), ruthenium (Ru), tantalum (Ta), nickel (Ni), tantalum nitride (TaN), titanium nitride (TiN) etc, or alloy thereof, such as platinum-silicide, tungsten-silicide, nickel-silicide etc. The insulator can be a dielectric or air. When dielectric is considered as the insulator, material such as oxide, nitride, oxynitride ("SiON") can be used for the dielectric. Additionally, dielectrics having dielectric constant (or permittivity) k lower or higher than that of oxide ("Low-k dielectrics" or "High-k dielectrics", respectively) can also be considered as the material for the insulator. Such Low-k dielectrics can be fluorinated silicon glass ("FSG"), SiLK, porous oxide, such as nano-porous carbon-doped oxide ("CDO") etc. Such High-k dielectrics can be aluminum oxide ("Al$_2$O$_3$"), hafnium oxide ("HfO$_2$"), titanium oxide ("TiO$_2$"), zirconium oxide ("ZrO$_2$"), tantalum pen-oxide ("Ta$_2$O$_5$") etc. Furthermore, any composition of those materials and the alloys formed thereof, such as hafnium oxide-oxide alloy ("HfO$_2$—SiO$_2$"), hafnium-aluminum-oxide alloy ("HfAlO"), hafnium-oxynitride alloy ("Hf-SiON") etc. can be used for the dielectrics. Moreover, insulator need not be of dielectric materials having a uniform chemical element and need not comprising single layer, but rather can be dielectric materials having graded composition on its element, and can comprise more than one layer.

Figure 2:
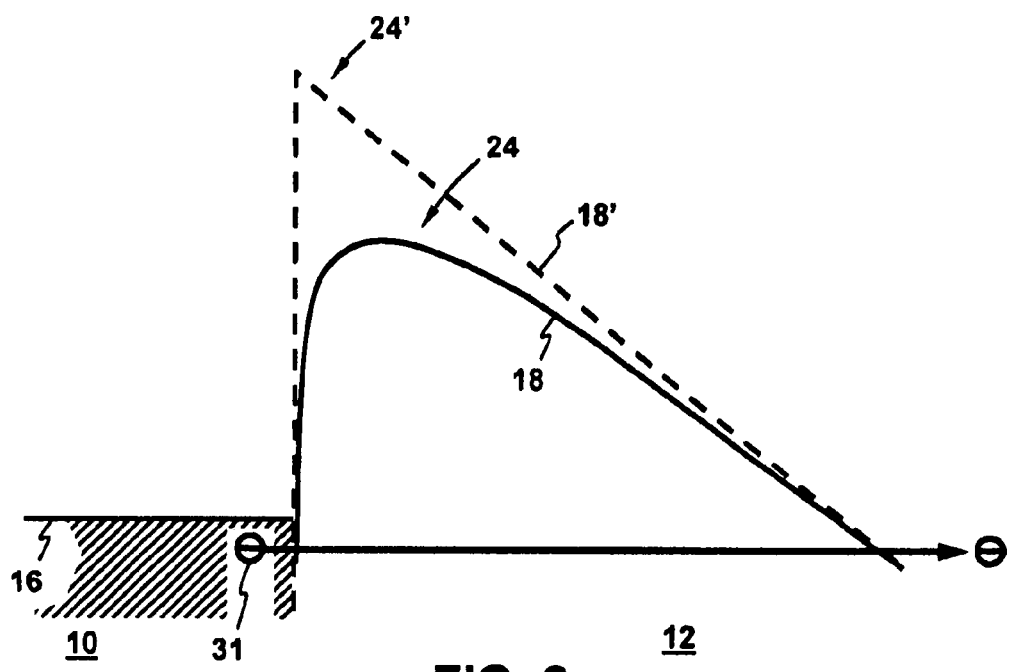
FIG. 2 is an energy band diagram showing thermal electrons tunneling through potential barrier in the energy-band of conductor-insulator system of FIG. 1.

FIG. 2 (prior art) shows electrons 31 transporting through the potential barriers of FIG. 1 via quantum mechanical tunneling mechanism (e.g. Fowler-Nordheim tunneling). The electrons 31 in the conductor 10 are at thermal temperature before tunneling through barriers 24 or 24', and thus the electrons do not have kinetic energy with respect to the Fermi-level 16. Such type of electrons is termed as "thermal electrons", and such type of charge carriers is termed as "thermal charge carriers" or "thermal carriers". The thermal electrons 31 are able to transport through insulator 12 in quantum mechanical tunneling when a large electric field (typically greater than 10 MV/cm) is applied in insulator. Under such a large field, the electrons 31 are shown tunneling through the insulator 12 to enter its conduction band 18 and 18' for cases with and without the Image-Force effect, respectively. Such tunneling mechanism is known to have higher tunneling rate on transporting electrons 31 through the barrier 24 than through barrier 24' when barrier height is lowered by the Image-Force effect.

Figure 3A:
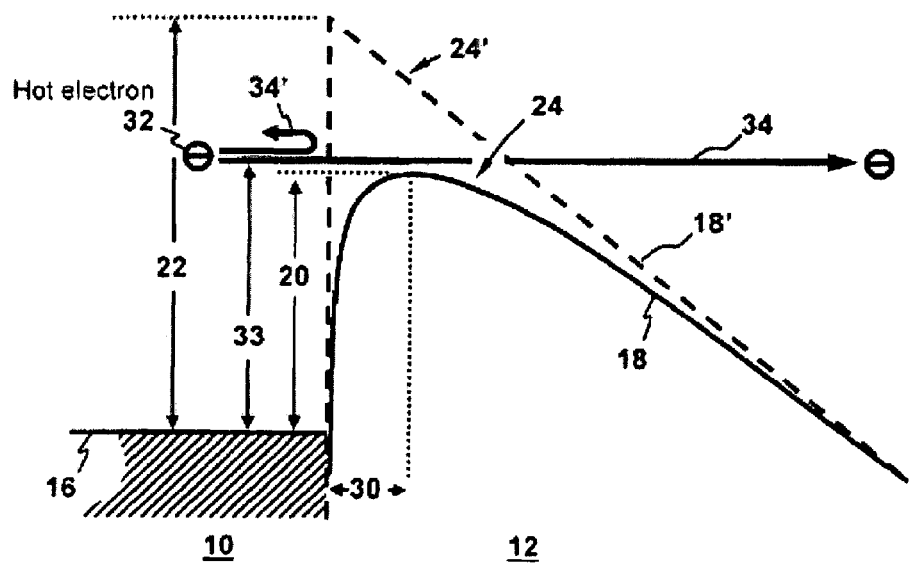
FIG. 3A is an energy band diagram showing hot electrons transporting through potential barrier in the energy-band of conductor-insulator system of FIG. 1.

FIG. 3A shows an energy band diagram for an energized charge carrier (electron 32) transporting over potential barrier of the conductor-insulator system of FIG. 1. The energized charge carrier in a region is defined as charge carrier having a kinetic energy with respect to the Fermi-level energy of that region. For example, in FIG. 3A, the energized electron 32 in the conductor 10 is shown having a kinetic energy 33 with respect to the Fermi-level energy 16 of the conductor 10. Such electron transports in a different mechanism than that of the thermal electron 31 described in connection with FIG. 2. The kinetic energy 33 is shown at a level slightly higher than the barrier height 20 of the Image-Force barrier 24 and lower than the barrier height 22. The electron 32 is shown moving along a forward direction 34 (shown in arrow) from conductor 10 to insulator 12. When potential barrier without Image-Force effect is considered, the kinetic energy 33 is insufficient to support hot electron 32 transporting over potential barrier 24', and hence electron can be blocked by the barrier 24' and moving along a returned path 34'. However, under the Image-Force effect, the lowered barrier height 20 permits the hot electron 32 having same kinetic energy 33 to transport along the forward direction to graze and pass the Image-Force barrier 24 and enter its conduction band 18. This effect is desirable as it can reduce voltage that is required to energize the electrons 32 in order to produce hot electrons for applications in integrated circuit ("IC") and memory.

Figure 3B:
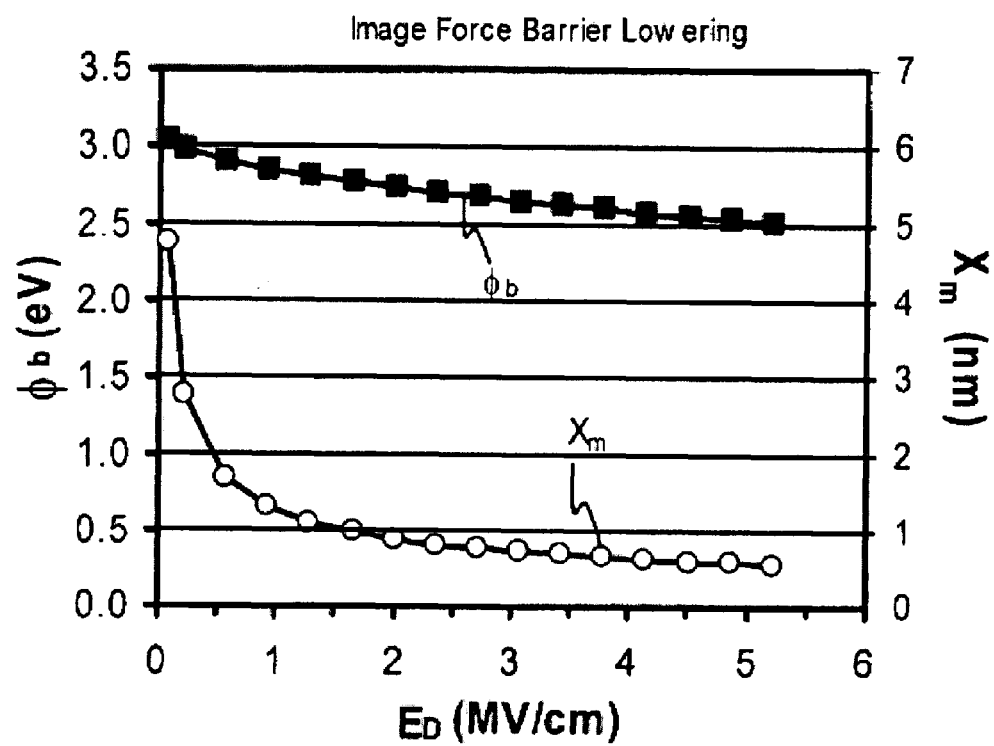
FIG. 3B shows barrier height and location of the barrier peak of the potential barrier as a function of the dielectric field applied to the insulator.

FIG. 3B shows the effect of Image-Force on altering barrier height and location of the barrier peak of the Image-Force potential barrier. The barrier height and location of peak barrier are plotted as a function of electric field $E_D$ applied to the insulator. In illustrating the effect, oxide is assumed as the material for the insulator. FIG. 3B shows that the barrier height 20 can be lowered from 3.1 eV to about 2.5 eV when an electric field $E_D$ of about 5 MV/cm is applied to the insulator. This effect illustrates the Image-Force barrier lowering effect. Further, it illustrates the nature of the Image-Force potential barrier that the Image-Force potential barrier 24 is electrically alterable through electric field. Additionally, it illustrates a means on altering barrier height of the barrier 24 by using an electric field. Typically, such electric field is applied by applying a voltage across the insulator. For example, for an oxide insulator having 6 nm in thickness, a voltage of about 3.0V across the oxide is required to generate 5 MV/cm. This Image-Force effect provides the saving on electron kinetic energy made possible by the applied electric field because the Image-Force and the potential barrier must be combated only to a distance $X_m$, and not to infinity. Once transporting beyond the distance $X_m$, the energized charge carrier 32 is permitted to transport over the Image-Force barrier.

FIG. 3B further shows the peak barrier distance $X_m$ 30 to the conductor/insulator interface can be shortened from a range of infinity (at $E_D$=0 MV/cm) to a range less than 1 nm (at $E_D$=2 MV/cm). It is known in solid-state physics that the polarization of a medium (e.g. the insulator of FIG. 1) cannot follow a moving charge when the transit time of the charge is shorter than the dielectric polarization time of the medium. Shortening peak barrier distance $X_m$, as provided in FIG. 3B, can shorten the charge transit time, and such effect is desirable as it can provide a means on lowering the dielectric constant of the Image-Force barrier 24 ("Image-Force dielectric constant") and hence on enhancing the barrier lowering effect. Other means, such as increasing charge moving velocity (e.g. by increasing its kinetic energy), can also be considered to reduce transit time, and hence reducing the Image-Force dielectric constant. This is considered as another means on altering barrier height of the Image-Force potential barrier. Typically, with such means, the dielectric constant can be lowered from its static value (e.g. about 3.9 for oxide) to a value near the optical one (e.g. about 2.2 for oxide), and results in an enhancement on lowering the Image-Force barrier 24 by about 0.14 eV (for oxide). It is noted that this effect is a result of a short transit time for carriers (electrons) traversing the distance $X_m$ 30, and happens in the absence of interaction with other particles when the carrier transit time is shorter than the dielectric polarization time of the insulator. It is noted that in some situations, it is possible the carriers can interact with quantum mechanical particles (e.g. phonons) within the distance 30. Such interaction can result in the Image-Force dielectric constant of the barrier 24 be slightly larger than its optical one, and hence can slightly weaken the effect on barrier lowering as employing means provided herein.

Figure 3C:
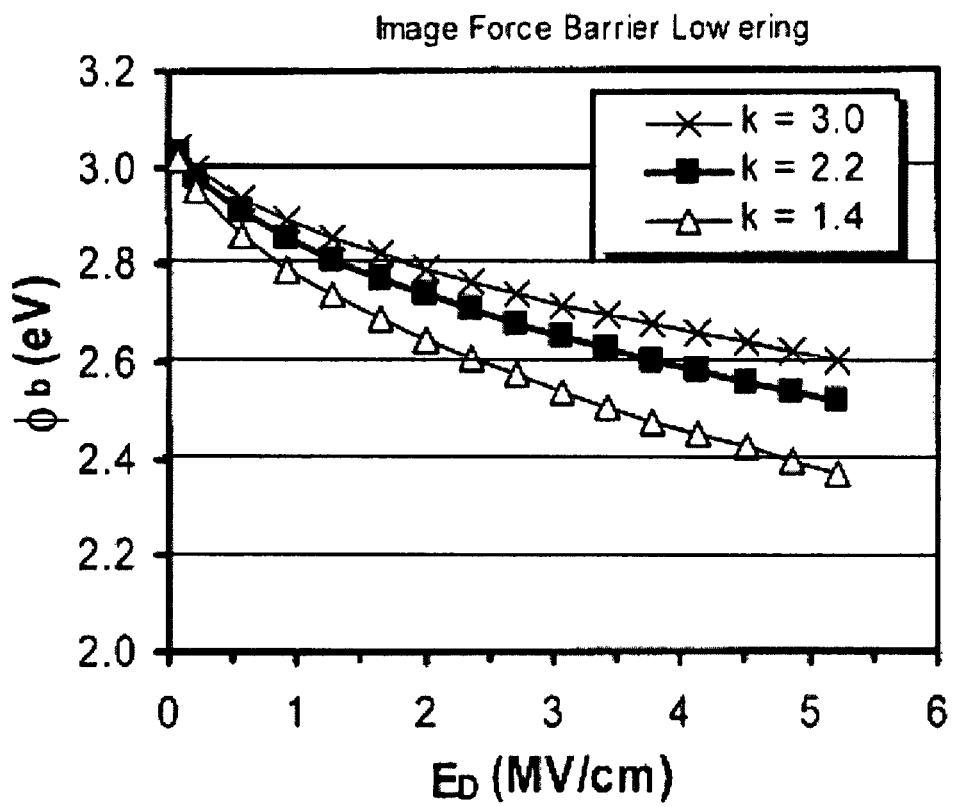
FIG. 3C shows barrier heights of the potential barrier as a function of the dielectric field for various dielectrics having different dielectric constants.

FIG. 3C shows barrier heights of the potential barrier as a function of the electric field for barrier calculated based on various dielectric constants k using Image-Force theory. It is illustrated that the barrier height $\phi_b$ for the lowest k (=1.4) has the strongest dependence on electric field $E_D$. For electric field $E_D$ at about 5 MV/cm, the barrier height is shown can be lowered to about 2.6 eV for k=3.1, and can be further lowered by about 0.2 eV to about 2.4 eV for k=1.4. The results indicate that the Image-Force effect on barrier lowering (Image-Force barrier lowering) can be amplified by choosing insulator having lower dielectric constant and/or by means that can lower the dielectric constant of the Image-Force barrier as described in connection with FIG. 3B.

Figure 4:
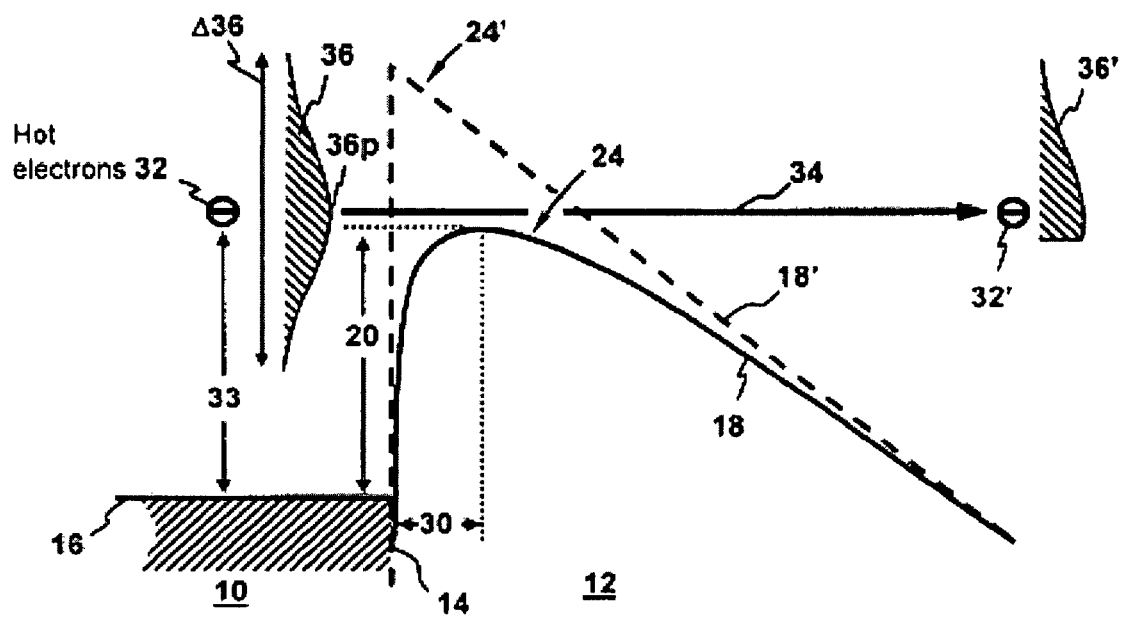
FIG. 4 is an energy band diagram showing hot electrons having broad energy spectrum transporting through potential barrier in the energy-band of conductor-insulator system of FIG. 1.

FIG. 4 is an energy band diagram for one embodiment on the conductor-insulator system of the present invention showing a group of hot electrons 32 transporting through potential barrier 24 of conductor-insulator system of FIG. 1. The conductor-insulator system comprises a conductor 10 having energized charge carriers 32 with an energy distribution 36 and an insulator 12 contacting the conductor 10 at an interface 14 and having an Image-Force potential barrier 24 adjacent to the interface 14, wherein the Image-Force potential barrier 24 is electrically alterable to permit the energized charge carriers 32 transporting there over.

The electrons 32 are shown having an energy distribution 36 on population distributed at different energy levels and the distribution is shown in a Gaussian-shape having a broad energy spectrum $\Delta 36$. The distribution has a peak population $36p$ at the level of the kinetic energy 33, which is at the same kinetic energy level as described in connection with FIG. 3A. In FIG. 4, it is further shown that about a half portion (upper half portion) of the electrons have their energy greater than the barrier height 20, and another half portion (lower half portion) of electrons have their energy lower than the barrier height 20. Without the Image-Force barrier lowering effect, all the electrons 32 are shown blocked by the potential barrier 24' formed in connection with the conduction band 18'. With the Image-Force barrier lowering effect, the upper half portion of electrons in energy spectrum are shown being able to surmount the Image-Force barrier 24 formed in connection with the conduction band 18 and transport along the forward direction 34 (shown in arrow). These electrons can enter the conduction band 18 to become electrons 32' having a distribution 36' in energy. Due to insufficient kinetic energy of the lower half portion of electrons 32, these electrons are blocked by the Image-Force barrier 24. Thus, as shown, the distribution 36' of electrons 32', to a first order, only reflects the distribution of the upper half portion of electrons 32.

In FIG. 4, another Image-Force effect is worth noted and is provided herein. It is noted that the lower half portion of the electrons 32 have a lower kinetic energy than that of the upper half one. Therefore, their transit time on traversing the distance $X_m$ 30 before reaching the peak barrier is longer than that of the upper half portion of electrons. In some situations, their transit time can be longer than the dielectric relaxation time of the insulator, and hence allowing the insulator to fully screen the Image-Force interaction with these electrons. This results in a weaker Image-Force barrier lowering effect due to a larger dielectric constant seen by such type of electrons. Such effect results in a higher barrier height 20 for the lower energy electrons and hence induces a stronger effect on blocking these electrons from surmounting the barrier 24.

The Image-Force effects described in FIG. 4 further provide a filtering function on passing high energy charge carriers and blocking the low energy ones. The selection on energy level ("threshold energy") for carriers to be passed can be made by controlling the barrier height 20 through a selection on the electric field of the insulator based on the barrier height $\phi_b$ dependence on electric field $E_D$ as described in connection with FIG. 3B. For the example illustrated in FIG. 3B, a tunable range on threshold energy can be from 3.1 eV to about 2.5 eV as varying electric field from 0 to 5 MV/cm (or equivalently, by applying voltage from 0 to 3 V across the oxide insulator, assuming an oxide thickness of 6 nm).

In FIG. 4, electrons having broad energy spectrum can be originated by employing mechanisms such as CHEI, SSI, and BTBT well-known in the art. Electrons energized by these types of mechanisms typically involve spherical and non-directional scatterings with lattice atoms and the energy spectrum Δ36 can range from about 0.5 eV to about 3 eV.

Figure 5:
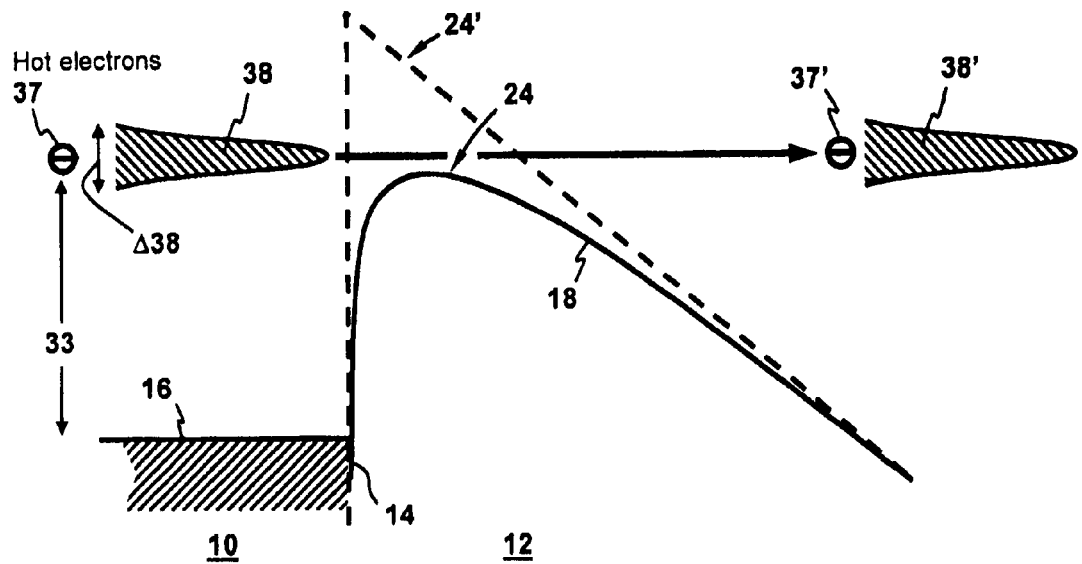
FIG. 5 is an energy band diagram showing hot electrons having narrow energy spectrum transporting through potential barrier in the energy-band of conductor-insulator system of FIG. 1.

FIG. 5 presents an energy band diagram for another embodiment on the conductor-insulator system of the present invention showing energized charge carriers transporting over potential barrier 24 of conductor-insulator system of FIG. 1. In FIG. 5, the conductor-insulator system comprises a conductor 10 having energized charge carriers 37 with an energy distribution 38 and an insulator 12 contacting the conductor 10 at an interface 14 and having an Image-Force potential barrier 24 adjacent to the interface 14, wherein the Image-Force potential barrier 24 is electrically alterable to permit the energized charge carriers 37 transporting there over.

In FIG. 5, the energized charge carriers (hot electrons 37) are shown having energy distribution 38 on population distributed in a narrow energy spectrum Δ38 when transporting over Image-Force barrier 24 of conductor-insulator system. The diagram is in all respects except one the same as that of FIG. 4. The difference is that instead of the broad energy spectrum Δ36 for the hot electrons distribution 36, the diagram is provided with a narrow energy spectrum Δ38 for the hot electrons distribution 38. For hot electrons 37 having peak population at same energy level 33 as electrons 32 described in connection with FIG. 4, all of these electrons 37 are shown being able to surmount the Image-Force barrier 24 formed by the conduction band 18 to become electrons 37' having a distribution 38' on population similar to 38. Typically, the energy distribution 38 of the energized charge carriers 37 has the energy spectrum Δ38 in the range of about 30 meV to about 300 meV.

The unique portion of this embodiment is that electrons 37 are packed in a tight energy distribution and the Image-Force barrier 24 functions as a "Full-Pass Filter" permitting all the hot electrons traversing there through at a lower kinetic energy. It thus brings advantages on higher injection efficiency and lower operation voltage to this embodiment.

Although the forgoing illustrations in connection with FIGS. 2 to 5 are made for electrons as the energized charge carriers and conduction band as energy band of the barrier, it is obvious that the same illustrations can be readily made for other types of energized charge carriers, such as holes, and for other types of energy band, such as valence band.

Figure 6:
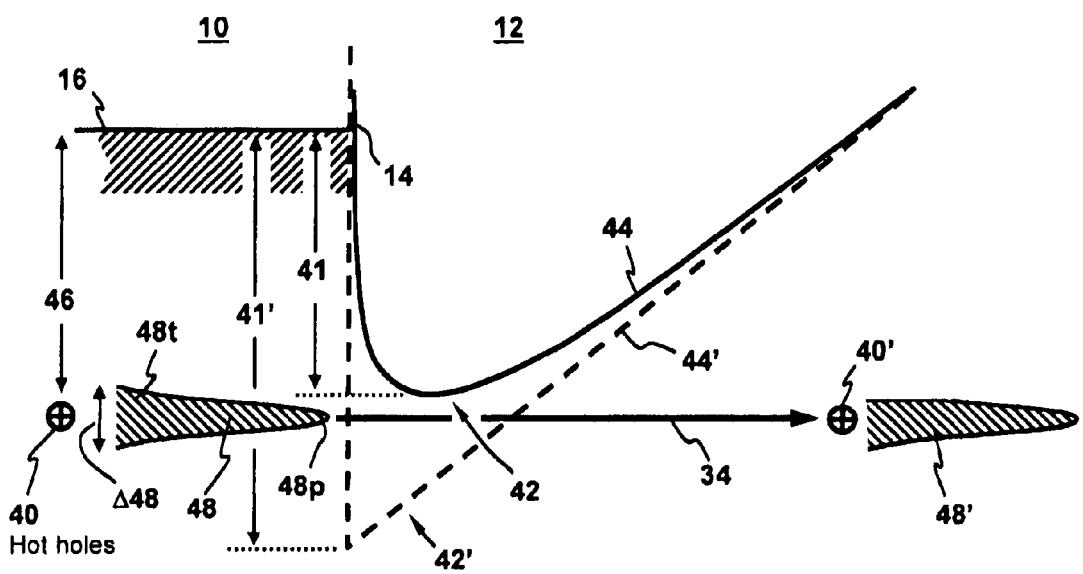
FIG. 6 is an energy band diagram showing hot holes having narrow energy spectrum transporting through potential barrier in the valence band of conductor-insulator system.

FIG. 6 presents an energy band diagram for another embodiment of the present invention with holes as an example for illustration. In FIG. 6, the conductor-insulator system comprises a conductor 10 having energized charge carriers 40 with an energy distribution 48 and an insulator 12 contacting the conductor 10 at an interface 14 and having an Image-Force potential barrier 42 adjacent to the interface 14, wherein the Image-Force potential barrier 42 is electrically alterable to permit the energized charge carriers 40 transporting there over.

The diagram of FIG. 6 is in all respects the same as that of FIG. 5 except few differences. One of the differences is that instead of providing hot electrons 37 as the transporting charge carriers, the diagram is provided with energized holes 40 (or "hot holes" 40). Additionally, barriers formed by the insulator are now in connection with valence band of the insulator. Also shown are a barrier height 41' of a potential barrier 42' in connection with a valence band 44' for case without the Image-Force effect, and a barrier height 41 of an Image-Force barrier 42 at valence band 44 of the conductor-insulator system of FIG. 1. The barrier height 41 is lowered by the Image-Force barrier lowering effect in similar way as described for barrier height 20 in connection with FIGS. 1, 3B and 3C while an electric field is applied to insulator.

In FIG. 6, hot holes 40 are shown having an energy distribution 48 on population distributed in a Gaussian-shape profile having a narrow energy spectrum Δ48. The distribution 48 is shown having a peak distribution 48p and a tail distribution 48t. The holes at the peak distribution 48p are shown having a kinetic energy 46 with respect to the Fermi-level 16 of the conductor. The kinetic energy 46 is shown slightly higher than the Image-Force barrier height 41 and lower than the barrier height 41'. Without the Image-Force barrier lowering effect, holes 40 having the distribution 48 are shown having their energy below barrier height 41' and thus are unable to surmount the barrier 42'. However, with the Image-Force effect, holes 40 are shown having a majority portion (except the tail portion 48t) being able to surmount the Image-Force barrier 42, transporting along the forward direction 34 to become holes 40' having an energy distribution 48' on their population. Such holes 40' have energy higher than the valence band 44 and can continue transporting within the insulator along the same direction to reach material adjacent to the other side of the insulator (not shown). Also illustrated in FIG. 6 for holes is the high-pass filtering effect that is similar to the effect described in connection with FIG. 4 for electrons. As shown, the holes 40 within the tail distribution 48t are shown having kinetic energy slightly below the barrier height 41. Such holes are blocked from surmounting Image-Force barrier 42 and are not included in the distribution 48'. However, due to the tight energy spectrum Δ48 of holes 40, situation on blocking holes 40 within the tail distribution 48t can be easily avoided by lifting energy of such holes through applying an additional small voltage (e.g. about 100 mV).

It is now clear that with the Image-Force barrier lowering effect employed in the present invention, hot carriers (electrons or holes) can be transported through insulator barrier at lower kinetic energy, and the operation voltage can be lowered when employing such effect for operating memory cell or semiconductor devices. To achieve high injection efficiency, it is desirable that carriers having tight energy spectrum on energy distribution are provided as the hot carriers and are used along with the Image-Force barrier lowering effect for memory cell operations.

It is to be understood that the present invention is not limited to the illustrated herein and embodiments described above, but encompasses any and all variations falling within the scope of the appended claims. For example, although the carriers distributions 36, 38 and 48 of the present invention is illustrated in Gaussian shape, it should be apparent to those having ordinary skill in the art that the distribution can be extended to any other type of shapes, and the shape need not be symmetrical in the energy.

Figure 7:
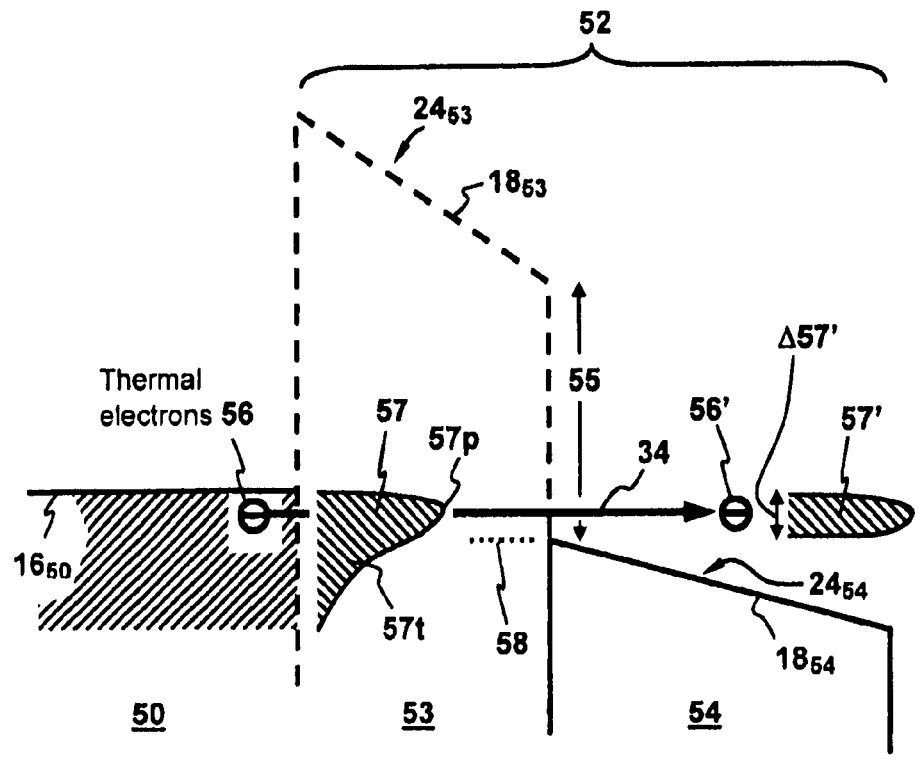
FIG. 7 is an energy band diagram for a conductor-filter system in accordance with the present invention.

FIG. 7 provides an energy band diagram for a conductor-filter system in accordance with another embodiment of the present invention. In the conductor-filter system of FIG. 7, there are shown a filter 52 contacting a conductor 50. The conductor 50 supplies thermal charge carriers of electrons 56. The filter 52 contacts the conductor 50 and includes dielectrics 53 and 54 for providing a filtering function on the charge carriers 56 of one polarity (negative charge carriers, electrons 56), wherein the filter 52 includes electrically alterable potential barriers 24$_{53}$ and 24$_{54}$ for controlling flow of the charge carriers 56 of one polarity through the filter 52 in one direction (forward direction 34).

FIG. 7 is an example of the filtering function. The conductor 50 has Fermi-level energy 16$_{50}$ and can be a semiconductor, such as n+ polysilicon, p+ polysilicon, heavily-doped polycrystalline Silicon-Germanium ("poly SiGe"), or a metal, such as aluminum (Al), platinum (Pt), Au, Tungsten (W), Molybdenum (Mo), ruthenium (Ru), tantalum (Ta), nickel (Ni), tantalum nitride (TaN), titanium nitride (TiN) etc, or alloy thereof, such as platinum-silicide, tungsten-silicide, nickel-silicide etc. The filter 52 is shown comprising a tunneling dielectric TD 53 and a blocking dielectric BD 54. The tunneling dielectric TD 53 is shown having a barrier $24_{53}$ formed in the conduction band $18_{53}$ of TD 53. The blocking dielectric BD 54 is shown having a barrier $24_{54}$ formed in the conduction band $18_{54}$ of BD 54 and the conduction band $18_{54}$ is shown having an offset 55 with the conduction band $18_{53}$ of TD 53. TD 53 is disposed adjacent to the conductor 50, and BD 54 is disposed adjacent to TD 53. Typically, BD 54 has an energy band gap narrower than that of TD 53. The filter 52 can have different band bending on conduction bands as a voltage is applied across the filter. The conduction band $18_{54}$ of BD 54 is shown having a less band bending than that shown for conduction band $18_{53}$ of TD 53. The conductor 50 supplies thermal electrons 56 having an energy distribution 57 on population. The energy distribution 57 of electrons 56 is shown below Fermi-level energy $16_{50}$ and has a peak distribution 57p and a tail distribution 57t in its distribution profile. The conductor 50 provides charge carriers having energy lower than Fermi-level energy, and hence functions somewhat like a "low-pass" carrier provider. With electric fields applied in the filter 52, electrons 56 in the peak portion distribution 57p are shown being able to transport through TD 53 in quantum mechanical tunneling mechanism (e.g. direct tunneling) through the barrier $24_{53}$ of TD 53, and can enter the conduction band $18_{54}$ of BD 54 to become electrons 56' having a tight energy spectrum Δ57' on energy distribution 57'. In a contrast, the electrons 56 within the tail distribution 57t are shown unable to tunnel through barriers $24_{53}$ and $24_{54}$. The barrier $24_{54}$ of BD 54 provided in the filter 52 forms an additional tunneling barrier for the electrons 56 within the tail distribution 57t and a blocking effect on these electrons takes place and can be made by keeping barrier $24_{54}$ at an energy level ("threshold energy" 58) higher than the energy of these electrons. The threshold energy 58 is to first order established by both barriers $24_{53}$ and $24_{54}$ (it's controlled by a voltage drop in barrier $24_{53}$ and the offset 55 between barriers $24_{53}$ and $24_{54}$). The blocking effect of barrier structure of filter 52 thus provides a filtering mechanism producing a high-pass filtering effect on tunneling charge carriers 56. This filtering effect is unique and is somewhat different than the filtering effect on energized carriers (e.g. hot electrons 32) described in connection with FIG. 4. While TD 53 and BD 54 are shown in the filter 52 of FIG. 7, such showing is only by way of example and any additional layers having potential barriers suitable for controlling carrier flow can be employed. Such layers can be a semiconductor or a dielectric and can be disposed in between TD 53 and BD 54 or can be disposed adjacent to only one of them.

The unique portion of the conductor-filter system of FIG. 7 lies on its capability of providing charge carriers transporting in tight energy distribution. Such capability is a result of the "low-pass" carrier provider function of the conductor 50 and the high-pass filter function of the filter 52. Combing both such functions, the conductor-filter system of FIG. 7 provides a "band-pass" filtering function that permits charge carriers having narrow energy spectrum in their distribution be transported. The band-pass filtering function is one embodiment of the filtering function of filter 52, and permits the conductor-filter system functioning as a "band-pass filter" having a "bandwidth" controlled by the Fermi-level energy $16_{50}$ and the threshold energy 58. Typically, the energy spectrum is in the range from about 30 meV to about 300 meV.

The filter 52 provides filtering effect on passing electrons having energy higher than the threshold energy 58. This results in passing electrons in the peak distribution 57p and blocking electrons in the tail distribution 57t. The energy distribution 57' of electrons 56' is shown as an example illustrating the "band-pass" filtering function of the conductor-filter system of FIG. 7, and the distribution 57' is shown similar to the peak distribution 57p of the distribution 57 to illustrate this effect. For best "band-pass" filtering effect, the energy spectrum Δ57' of distribution 57' typically can be narrowed or widen by adjusting the threshold energy 58 at a higher or a lower level, respectively, than level shown in FIG. 7. Ability on adjusting energy spectrum Δ57' is desirable as it permits a modulation on "bandwidth" of the band-pass filter for filtering effect in any practical application. This can be done by adjusting the voltage applied across filter 52 or by adjusting other parameters to be described in following paragraphs.

In constructing the filter 52 of FIG. 7, BD 54 having a larger dielectric constant relative to that of TD 53 is usually desirable for following considerations. First, it reduces the electric field in BD 54, which can reduce the tunneling probability of electrons in the tail distribution 57t, and hence can enhance the blocking effect on these electrons. Furthermore, when applying a voltage across the filter 52 for the filtering effect, the larger dielectric constant for BD 54 permits a larger portion of the applied voltage appearing across TD 53. This enhances voltage conversion between applied voltage and voltage across TD, thus has advantages on lowering the applied voltage required for the filtering effect, increasing sensitivity of the applied voltage on the filtering effect, and increasing blocking range in energy spectrum for electrons distributed in the tail distribution.

Additionally, other parameters can also be considered in constructing the filter 52 of FIG. 7 for adjusting the energy spectrum Δ57'. One such parameter is the conduction band offset 55 between BD and TD. The conduction band offset 55 can be tailored at different values to control the threshold energy 58 beyond which electrons 56 in the distribution 57 are permitted to tunnel through the filter 52. This can be done by properly choosing materials for BD 54 and for TD 53. In a specific example, when choosing oxide as the material for TD 53, a dielectric film of oxynitride system ("$SiO_xN_{1-x}$") will be a good candidate for BD 54 because of its well-proven manufacturing-worthy film quality and process control. In $SiO_xN_{1-x}$, the "x" is the fractional oxide or the equivalent percentage of oxide in the oxynitride film. For example, x=1 is for case where the film is a pure oxide; similarly x=0 is for case where the film is a pure nitride. As the fractional oxide x is changed from 0 to 1, the conduction band offset 55 can be changed from about 1 eV to 0 eV. Thus, a tailoring on the fractional oxide x in $SiO_xN_{1-x}$ permits a tailoring on the conduction band offset 55 to a desired range for filter 52, and hence provide method on adjusting the energy spectrum Δ57' (i.e. the "bandwidth" of the band-pass filter) to range desired for use in practical applications.

Figure 8:
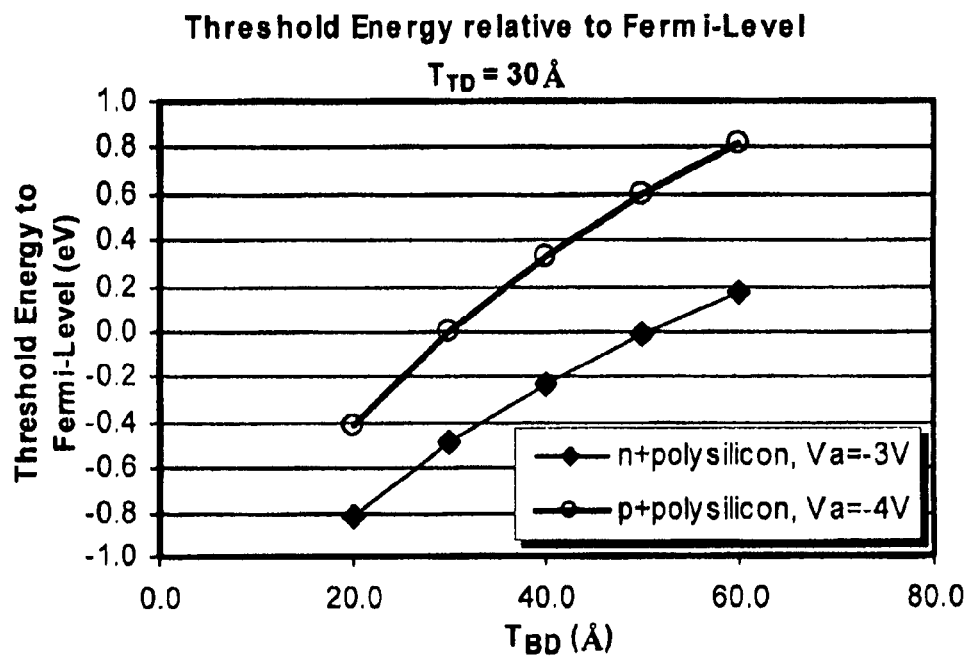
FIG. 8 shows relative energy level of threshold energy to Fermi-level with the applied voltage Va as the plotting parameter.

Other parameters such as thicknesses of TD 53 and BD 54 and Fermi-level energy $16_{50}$ of conductor 50 can also be used to provide method adjusting the threshold energy level 58, and its level relative to the Fermi-level energy $16_{50}$, and hence the "band-width" of the band-pass filter. These parameters are considered herein in constructing the conductor-filter system of FIG. 7. For illustration purpose, polysilicon, oxide, and nitride are assumed as the materials for conductor, TD 53, and BD 54, respectively, of the conductor-filter system of FIG. 7. The oxide of TD is assumed having a thickness of 30 Å. FIG. 8 shows the relative energy level of the threshold energy 58 to the Fermi-level $16_{50}$ for two cases illustrated here. The range where threshold energy to Fermi-level is in negative value corresponds to situation where threshold energy is at level lower than the Fermi-level, and the difference between them corresponds to the "band-width" of the band-pass filter. The two cases have differences on Fermi-level of the polysilicon (n+ vs. p+ polysilicon) and on applied voltage Va across the filter 52. The applied voltage Va can determine the kinetic energy of electrons 56' after tunneling through the filter. Referring to FIG. 8, for the case with p+ polysilicon and Va=−4V, the range where threshold energy is under the Fermi-level ranges from 0 eV to about 0.4 eV as reducing a thickness of BD ("$T_{BD}$") from about 30 Å to about 20 Å. For the case with n+ polysilicon and Va=−3V, a wider range (about 0.8 eV) for threshold energy under the Fermi-level is shown for $T_{BD}$ within the range of 50 Å to 20 Å.

It should now be clear that the threshold energy relative to Fermi-level of conductor can be adjusted by method adjusting thicknesses of TD and BD in the filter and/or by adjusting Fermi-level of conductor. Such method can be used to tailor the band-width of the transporting charge to a desired range for a practical application. The kinetic energy of transporting charge carriers can be controlled and targeted to an application by employing this method.

The conductor-filter system of FIG. 7 can be used to provide band-pass filter function for other type of charge carriers, such as holes (e.g. light-holes ("LH") or heavy holes ("HH")). Similar considerations as described in connection with FIGS. 7 and 8 for electrons can be readily applied to these holes by considering the tunneling barriers of filter 52 formed in the valence band of energy band diagram. Due to the opposite charge polarity of holes to electrons, band-pass filtering holes can be done by reversing the voltage polarity across filter 52 from the one shown in FIG. 7.

It should also be clear to those of ordinary skill in the art that the teachings of this disclosure can be applied to modify the dielectrics of filter through which the filtered charge distribution can be tailored for the filtering effect. For example, although the dielectric constant of BD 54 is illustrated to be greater than that of TD 53, it should be clear that the teaching of this disclosure can be applied to modify the BD 54 to material having dielectric constant similar to that of TD 53 to effectively pass charge carriers in peak distribution during tunneling transport. Furthermore, TD 53 and BD 54 need not be of materials having a uniform chemical element but can be materials having graded composition on its element. In addition, any appropriate dielectric, such as aluminum oxide ("$Al_2O_3$"), hafnium oxide ("$HfO_2$"), titanium oxide ("$TiO_2$"), zirconium oxide ("$ZrO_2$"), tantalum pen-oxide ("$Ta_2O_5$") etc. can be used in place of oxide, nitride, or oxynitride. Furthermore, any composition of those materials and the alloys formed thereof, such as hafnium oxide-oxide alloy ("$HfO_2$—$SiO_2$"), hafnium-aluminum-oxide alloy ("HfAlO"), hafnium-oxynitride alloy ("HfSiON") etc. can be used in place of oxide, nitride, or oxynitride.

Figure 9:
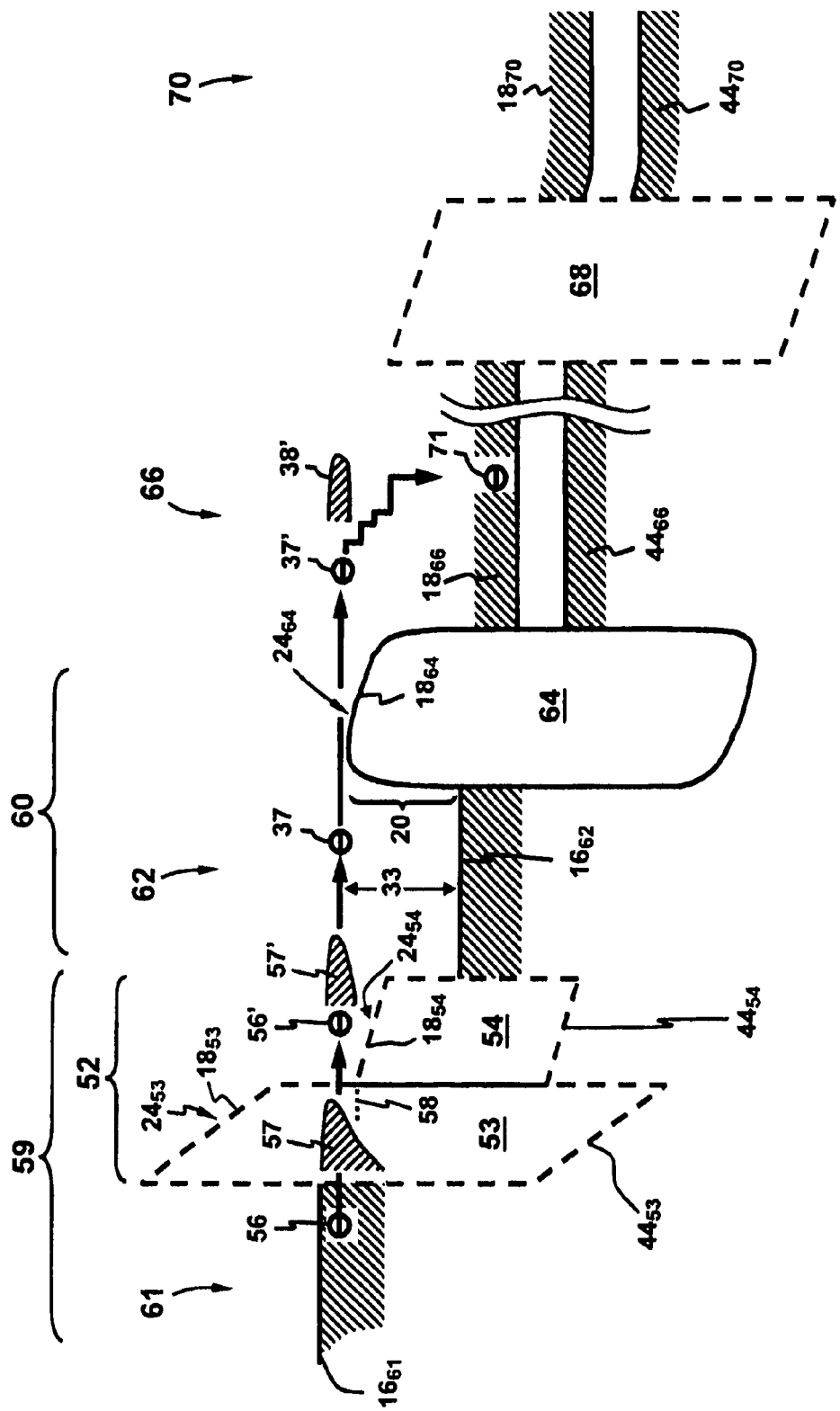
FIG. 9 is an energy band diagram in accordance with one embodiment on charge-injection system of the present invention illustrating the filtering and the image-force barrier lowering for ballistic-electrons-injection mechanism.

FIG. 9 provides an energy band diagram of a charge-injection system for one embodiment of the present invention on injecting charges having tight energy distribution. The energy band structure of the charge-injection system is illustrated on injecting electrons. Referring to FIG. 9, there is shown a conductor-filter system 59 of the type described in connection with FIG. 7, a conductor-insulator system 60 of the type described in connection with FIGS. 1 and 5, a charge storage region ("CSR") 66, a channel dielectric ("CD") 68, and a body 70. The energy band structure of FIG. 9 is shown with its full band structure. For example, in the conductor-filter system 59, there are also shown valence bands $44_{53}$ and $44_{54}$ in addition to the conduction bands $18_{53}$ and $18_{54}$ of FIG. 7. The conductor-filter system 59 comprises a tunneling-gate ("TG") 61, and a charge filter 52. The filter 52 includes potential barriers $24_{53}$ and $24_{54}$, and has a threshold energy 58 established by the barriers for controlling its filtering effect as described in connection with FIG. 7. The filter 52 further comprises the tunneling dielectric ("TD") 53 and the blocking dielectric ("BD") 54 as described in connection with FIG. 7. The conductor-insulator system 60 comprises a ballistic gate ("BG") 62 and a retention dielectric ("RD") 64 as the conductor and the insulator of the system, respectively. The energy band diagram of the charge-injection system in regions from TG 61 to RD 64 is constructed by "contacting" the filter 52 of the conductor-filter system 59 to the conductor (BG 62) of the conductor-insulator system 60. TG 61 and BG 62 are of metals having work function with Fermi-levels $16_{61}$ and $16_{62}$, respectively. CSR 66 is shown insulated from BG 62 and body 70 by dielectrics RD 64 and CD 68, respectively, and comprises semiconductor having a conduction band $18_{66}$ and a valence band $44_{66}$ and of n-type conductivity. CSR 66 may comprise semiconductor of other type of conductivity (e.g. p-type), and may comprise metal or any other suitable material (e.g. nano-particles or traps in dielectrics) used for storing charge carriers. Body 70 comprises semiconductor having conduction bands $18_{70}$, and valence band $44_{70}$, respectively, and can be used to modulate an Image-Force barrier $24_{64}$ of the conductor-Insulator system 60 by coupling voltage into CSR 66 through CD 68. Dielectrics RD 64 and CD 68 are shown in single layer and can generally comprise more than one layer to form a composite layer.

FIG. 9 further provides illustration on process forming and injecting charges having tight energy distribution. There are shown thermal electrons 56 having an energy distribution 57 on population be supplied by TG 61 as supplied carriers. These electrons 56 are filtered by filter 52 during their tunneling transport through the filter 52 via mechanisms described in connection with FIG. 7. After filtered, thermal electrons become electrons 56' having a tighter energy distribution 57' than the distribution 57 before filtered. Such electrons 56' are fed to the conductor-insulator system 60. In one case, a portion of the electrons 56' can transport through BG 62 without scattering ("ballistic transport") at a kinetic energy 33 higher than the Fermi-level $16_{62}$ of BG 62 to become energized electrons 37 at the interface of BG 62 and RD 64. Such electrons 37 (termed "ballistic electrons") do not experience scattering with other particles (e.g. electrons, phonons etc.), and hence can conserve their kinetic directional energy and momentum along original movement. In another case, electrons 56' can transport through BG 62 in partial scattering ("partially ballistic transport") with other particles and can still maintain their kinetic energy 33 high enough and directional toward the interface of BG 62 and RD 64 to become electrons 37. In all cases, such energized electrons 37 can surmount a barrier height 20 of the Image-Force barrier $24_{64}$ in mechanism as described in connection with FIGS. 3B and 5, entering a conduction band $18_{64}$ of RD 64, making their way there through to become electrons 37' having an energy distribution 38' on their population, and finally got collected and stored on CSR 66 as electrons 71 in the conduction band $18_{66}$. Such process in forming and injecting charges (either in the ballistic transport or in the partially ballistic transport) is termed as ballistic-charge injection mechanism. When electrons are selected as the charge carriers, such mechanism is termed as ballistic-electron injection. Typically, the energy distribution of the energized charge carriers (electrons 37) has an energy spectrum in the range of about 30 meV to about 300 meV. The injection efficiency (defined as the ratio of number of carriers collected to the number of carriers supplied) of such electrons typically ranges from about $10^{-4}$ to about $10^{-1}$. The injection efficiency can be further enhanced by injecting piezo-electrons (see the piezo-ballistic-electron injection mechanism as described in connection with FIG. 17 B).

The ballistic-charge injection shown in FIG. 9 illustrates the ballistic-electron injection and is done by applying a voltage between TG 61 and BG 62 such that electrons 37 have a kinetic energy 33 higher than the Image-Force barrier height 20 of the conductor-insulator system 60. Such voltage can be lowered by lowering barrier height 20 of the Image-Force barrier $24_{64}$ by using means as described in connection with FIGS. 3A, 3B and 3C. This can be done by for example coupling a positive voltage (e.g. from about +1 V to about +3 V) to CSR 66. Alternately, the barrier height 20 can be lowered by choosing material for CSR 66 having a lower work-function (or a higher Fermi-level energy) than that of BG 62.

Figure 10:
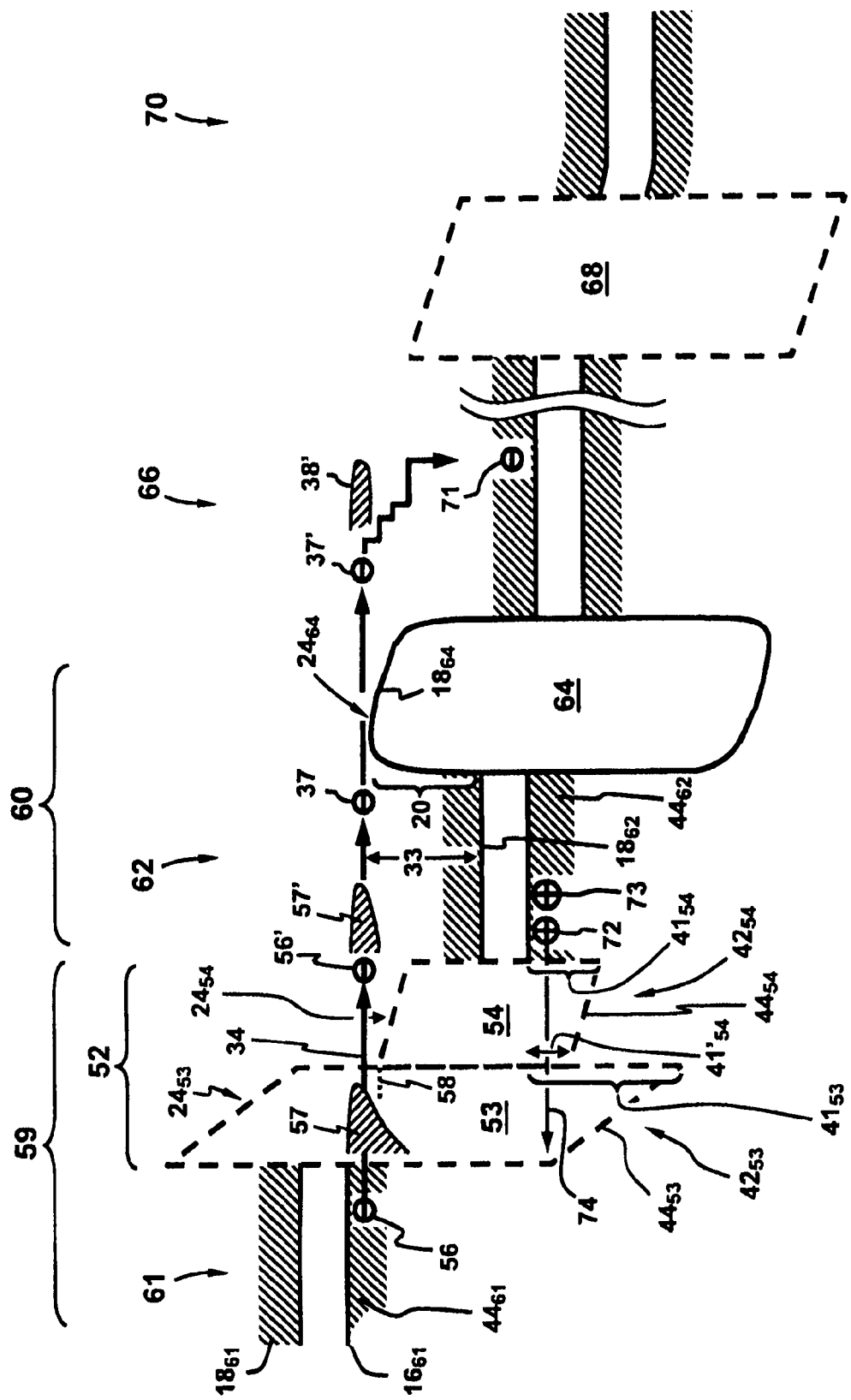
FIG. 10 is an energy band diagram in accordance with another embodiment on charge-injection system of the present invention illustrating the filtering and the image-force barrier lowering for ballistic-electrons-injection mechanism.

FIG. 10 provides an energy band diagram for another embodiment of the charge-injection system on injecting electrons having tight energy distribution. In the conductor-filter system 59 of FIG. 10, the conductor 61 supplies thermal charge carriers 56. The filter 52 contacts the conductor 61 and includes dielectrics 53 and 54 for providing a filtering function on the charge carriers 56 of one polarity (negative charge carriers), wherein the filter includes electrically alterable potential barriers $24_{53}$ and $24_{54}$ for controlling flow of the charge carriers 56 of one polarity through the filter 52 in one direction (forward direction 34). In addition to controlling the one polarity of charge carriers (negative charge carrier, electrons 56), the filter 52 further includes electrically alterable potential barriers $42_{53}$ and $42_{54}$ for controlling the flow of charge carriers of an opposite polarity (positive charge carriers, LH 72 and HH 73) through the filter in another direction (backward direction 74) that is substantially opposite to the one direction.

Such filtering function permits charge carriers of one polarity type transporting along the forward direction 34 (i.e. from TG 61 to BG 62) and blocks charge carriers of an opposite polarity type transporting along a backward direction 74 (i.e. from BG 62 to TG 61). Thus, the filter 52 provides a charge-filtering function that can "purify" the charge flow. The charge-filtering function is another embodiment of the filtering function of filter 52.

The diagram in FIG. 10 is in all respects the same as that of FIG. 9 except few differences. One of the differences is that instead of using metal as material for the conductor regions of the conductor-filter system 59 and of the conductor-insulator system 60, these conductor regions (i.e. TG 61 and BG 62) are now provided with semiconductor having conduction band $18_{61}$ and valence band $44_{61}$, and conduction band $18_{62}$ and valence band $44_{62}$ for TG 61 and BG 62, respectively. TG 61 is shown of a p-type semiconductor having thermal electrons 56 in the valence band $44_{61}$ as the supplied carriers. Such electrons 56 and their energy distribution 57 go through identical transport processes as described in connection with FIG. 9, and a portion of electrons 56 are able to enter CSR 66 to become electrons 37' having energy distribution 38', and finally be collected and stored on CSR 66 as electrons 71 in similar way as described in connection with FIG. 9.

For the example shown in FIG. 10, when applying voltage having polarity to inject electrons 56 in TG 61 along the forward direction 34, it simultaneously induces holes LH 72 and HH 73 to transport along the backward direction 74. The backward transporting LH 72 and HH 73 can result in undesired problems. For example, it can trigger impact-ionization in TG 61 when they got backward transported into that region due to their higher energy than the valence band $44_{61}$. Further, these holes do not contribute to memory operation when employing the ballistic-electron-injection for a program operation of a memory cell. Therefore, it can waste electrical current and hence power. It is thus desirable to block LH 72 and HH 73 from backward transporting into TG 61.

The energy band structure in FIG. 10 shows the backward-transporting carriers (i.e. LH 72 and HH 73) has to transport through more barriers than the forward-transporting carriers (i.e. electrons 56) do, and hence provides filtering effect on blocking the backward-transporting carriers. The filtering effect is based on the energy band structure constructed by potential barriers in filter 52. A first potential barrier $42_{54}$ blocking the backward transporting holes 72 and 73 comprises barrier heights $41_{54}$ and $41'_{54}$ at an entrance side and at an exit side of barrier $42_{54}$, respectively. Both barrier heights $41_{54}$ and $41'_{54}$ are referenced to valence band $44_{54}$ of BD 54. A second potential barrier $42_{53}$ having a barrier height $41_{53}$ at its entrance side forms another barrier blocking holes 72 and 73. The barrier height $41_{53}$ is referenced to valence band $44_{53}$ of TD 53 at the interface between TD 53 and BD 54.

The filter 52 provided herein is based on a barrier height engineering concept. One specific embodiment on the conductor-filter and conductor-insulator systems 59 and 60 that is used for illustrating the concept comprises a p+ polysilicon for TG 61, an oxide layer for TD 53, a nitride layer for BD 54, an n+ polysilicon for BG 62, and an oxide layer for RD 64. The n+ polysilicon is considered for BG 62 due to several considerations. A major consideration lies in the much higher solid solubility for n-type impurities (e.g. Arsenic, phosphorous etc) than that for p-type impurities (e.g. Boron). Impurity with a higher solid solubility is desirable as it usually can dope the silicon heavier to result in a lower sheet resistance, and is favorable for integrated circuits (IC) application. In the embodiment, polysilicon is employed as the material for TG 61 and BG 62 due to its well proven yield, manufacturability, and compatibility with state of the art IC technology. An oxide with a thickness of about 7 nm to 10 nm is employed for RD 64 due to the same reason. The oxide layer used for TD 53 can be with a thickness in the range of about 1.5 nm to 4 nm and preferably in the range of about 2 nm to 3.5 nm. The thickness of TD 53 layer is chosen in the range where charge-carriers (electrons, LH or HH) transporting across the layer are primarily through the direct tunneling mechanism. The thickness of BD 54 is chosen to block any type of charge-carriers from tunneling transport through both BD 54 and TD 53 layers when a modest voltage in the range of about 1 V to about 2.5V is applied between TG 61 and BG 62. The thickness of BD 54 is further chosen to permit one type of charge carriers (e.g. electrons) transporting in the forward direction and to block the other type of charge carriers (e.g. LH) from transporting in the backward direction when in a higher voltage range (3V or higher). As will be described in the barrier height engineering theory hereinafter, the selection on thickness of BD 54 is also determined by it dielectric constant. In general, the thickness of BD 54 can be thinner or thicker than that of TD 53 provided filter 52 can effectively meet the forgoing requirements. For example, in the specific embodiment here, if an oxide with 3 nm (or 30 Å) is chosen for TD 53, then the minimum thickness for BD 54 can be about 2 nm (or 20 Å) or thicker. For the specific embodiment, the oxide for TD 53 can be a HTO (high temperature oxide) or a TEOS layer formed by using conventional deposition technique, or a thermal oxide by using thermal oxidation technique well-known in the art. The nitride for BD 54 can be a high quality nitride without charge trapping centers in its band gap. This high quality nitride can be formed in $NH_3$ (ammonia) ambient at a high temperature (e.g. 1050° C.) by using, for example, RTN (Rapid Thermal Nitridation) technique well-known in the art.

While oxide and nitride are shown as the materials for TD 53 and BD 54, respectively, in the specific embodiment, such showing is only by way of example and any other types of dielectric materials and their combination can be readily employed for TD and BD. For example, in another embodiment, TD 53 can comprises oxide having a thickness in a range of about 1.5 nm to about 4 nm and BD 54 can comprises material selected from the group consisting of nitride, oxynitride, $Al_2O_3$, $HfO_2$, $TiO_2$, $ZrO_2$, $Ta_2O_5$, and alloys formed thereof. In still another embodiment, TD 53 can comprises oxynitride having a thickness in a range of about 1.5 nm to about 4 nm and BD 54 can comprises material selected from the group consisting of nitride, $Al_2O_3$, $HfO_2$, $TiO_2$, $ZrO_2$, $Ta_2O_5$, and alloys formed thereof.

Barrier Height Engineering for Ballistic-Charges-Injection

Figure 11:
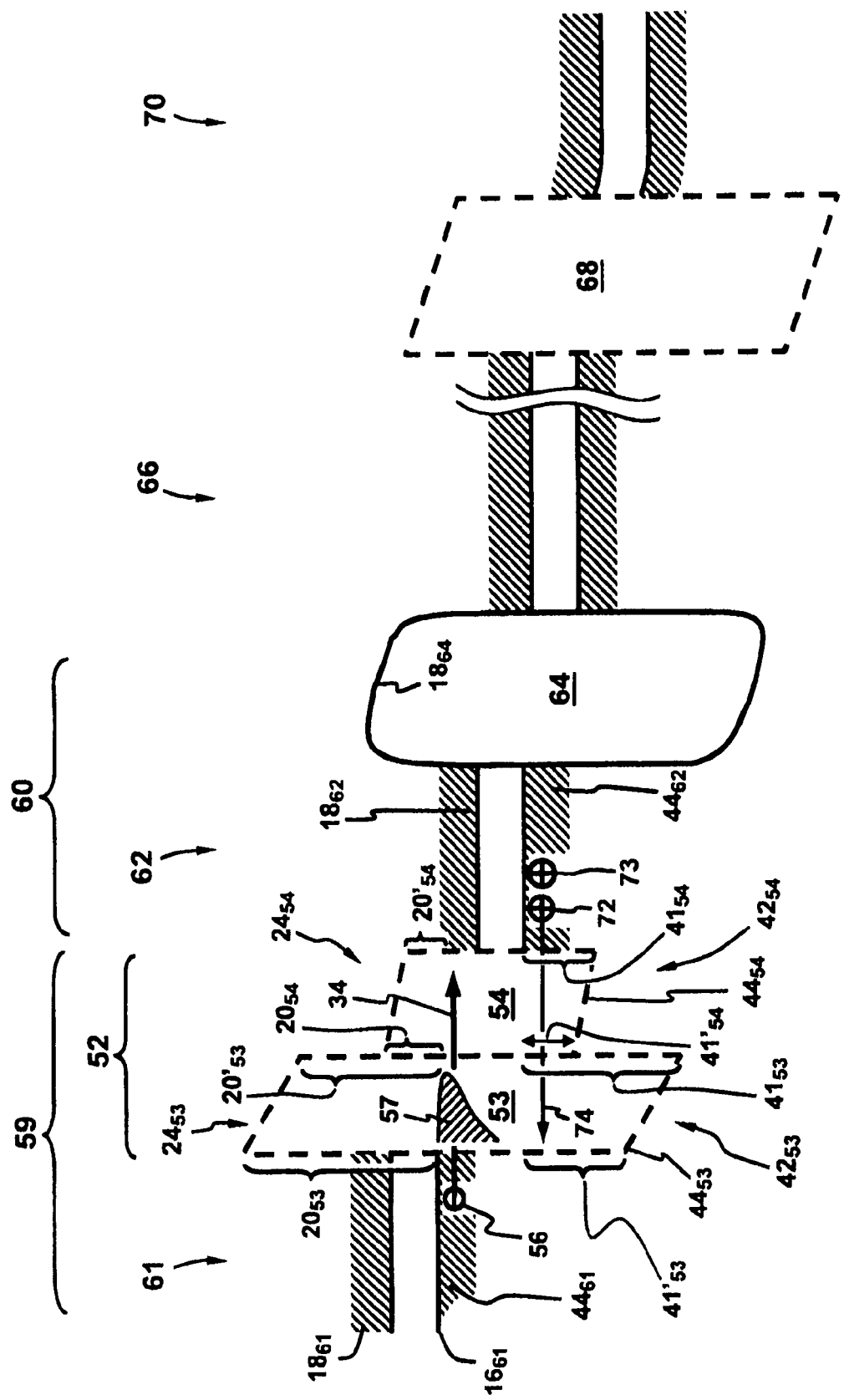
FIG. 11 is an energy band diagram in accordance with the present invention illustrating the barrier height engineering for ballistic-electrons-injection mechanism.

A greater detail on the barrier height engineering concept is now provided. FIG. 11 illustrates an energy band diagram similar to that in FIG. 10 except with less band bending in the energy band of filter 62 to reveal more details on barrier heights. In addition to those regions and their reference indicators shown in FIG. 10, in FIG. 11 there is shown a barrier height $41'_{53}$ of valence band offset between $44_{62}$ and $44_{53}$. The barrier height $41'_{53}$ is at the exit side of the second hole potential barrier $42_{53}$ for blocking the backward transporting LH 72 and HH 73. Moreover, there is shown a first electron potential barrier $24_{53}$ formed by TD 53 and having barrier heights $20_{53}$ and $20'_{53}$ at the entrance and the exit sides, respectively, of barrier $24_{53}$ for blocking the forward transporting electrons 56. Further, there is shown a second electron potential barrier $24_{54}$ formed by BD 54 and having barrier heights $20_{54}$ and $20'_{54}$ at the entrance and the exit sides of barrier $24_{54}$, respectively. The second electron potential barrier $24_{54}$ also has the effect on blocking the forward transporting electrons 56.

It is now clear that with the energy band structure in accordance with the present invention, there are two electron barriers $24_{53}$ and $24_{54}$ relevant to the forward transporting charges of electrons 56. Similarly, there are two hole barriers $42_{54}$ and $42_{53}$ relevant to the backward transporting holes 72 and 73 of BG 62. To permit an efficient ballistic-electrons-injection, it is desirable that the barriers heights of the first and the second electrons barriers $24_{53}$ and $24_{54}$ can be electrically altered to assist the transport along the forward direction 34. In a contrast, to block holes 72 and 73 of BG 62 from backward transporting to TG 61, it is desired to keep the barrier heights of the first and the second hole barrier $42_{54}$ and $42_{53}$ high enough through out the voltage range for the ballistic charge injection.

Referring to FIG. 11, the barrier height $20_{54}$ ($\Delta\Phi_{VE\_TB}$) of the second electron barrier $24_{54}$ can be expressed to a first order by following formula:

$$\Delta\Phi_{VE\_TB} = \Delta\Phi_{CB\_TB} + Eg - |V_{TD}| \quad (1)$$

where $\Delta\Phi_{CB\_TB}$ is the conduction band offset between TG 61 and BD 54 when under the flat-band condition, $V_{TD}$ is the voltage drop across TD during ballistic-electron-injection, and is expressed as $$V_{TD} = (V_a - V_{fb})/[1 + (\in_{TD}*T_{BD})/(\in_{BD}*T_{TD})];$$

$V_a$ is the applied voltage across TG 61 and BG 62 (i.e. voltage drop across filter 52);

$V_{fb}$ is the flat-band voltage;

Eg is the energy gap of TG 61;

Similarly, the barrier height $41_{53}$ ($\Delta\Phi_{VH\_GT}$) of the second hole barrier $42_{53}$ for blocking backward transporting holes can be expressed as following formula:

$$\Delta\Phi_{VH\_GT} = \Delta\Phi_{VB\_GT} - |V_{BD}| \quad (2)$$

where $\Delta\Phi_{VB\_GT}$ is the valence band offset between BG 62 and TD 53 under flat-band condition, $V_{BD}$ is the voltage drop across BD 54 during ballistic-electron-injection, and is expressed as $$V_{BD} = (V_a - V_{fb})/[1 + (\in_{BD}*T_{TD})/(\in_{TD}*T_{BD})].$$

From the foregoing formula (1) and (2), it is clear that barrier height $20_{54}$ ($\Delta\Phi_{VE\_TB}$) and barrier height $41_{53}$ ($\Delta\Phi_{VH\_GT}$) have different dependence on Va. The barrier height dependence on voltage is asymmetrical and is primarily determined by the combined effects of dielectric constant and dielectric thickness (i.e. the "$\in T$ effect").

Figure 12B:
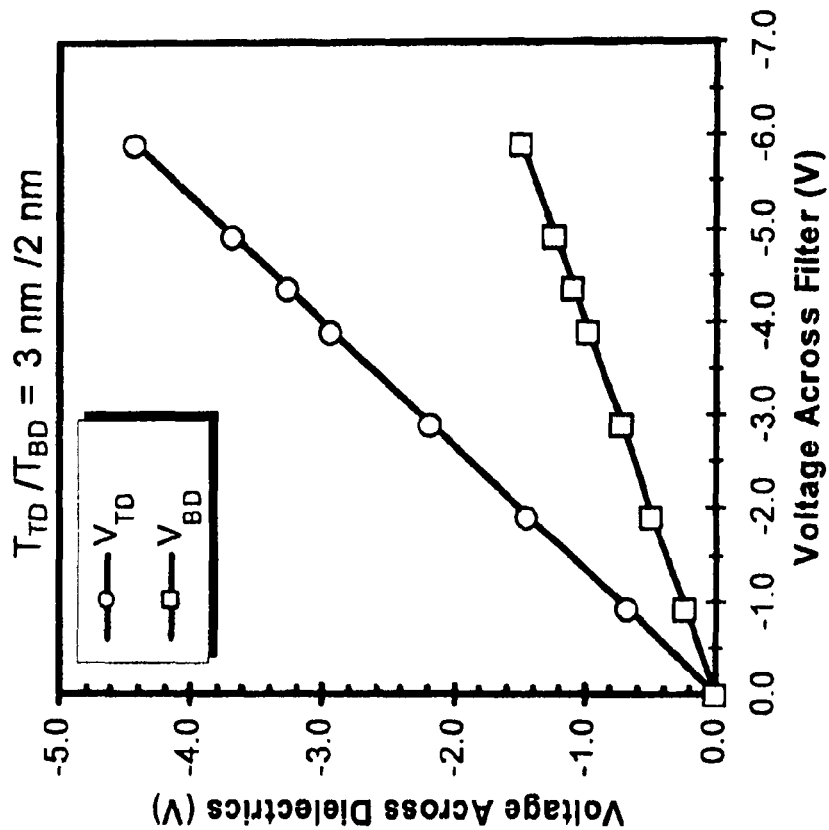
FIG. 12B illustrates the effect of the voltage divider function in accordance with the present invention.
Figure 12A:
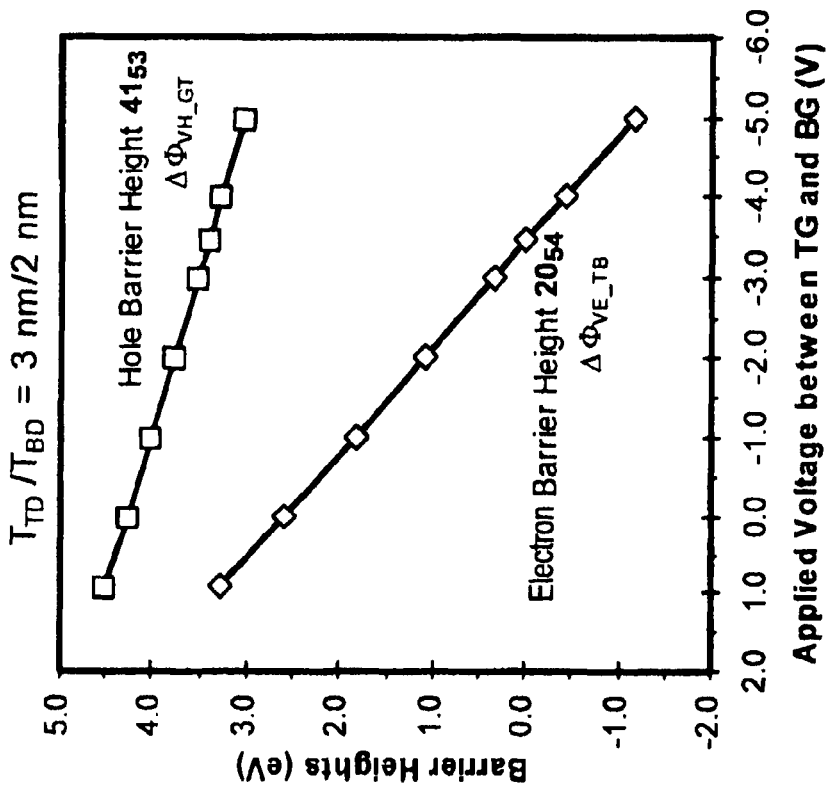
FIG. 12A illustrates the effect of the barrier height engineering in accordance with the present invention for ballistic-electrons-injection, wherein the barrier height of the forward transporting electrons and the barrier height of the backward transporting holes can be altered in different degree by voltage between TG and BG.

FIG. 12A illustrates an example on the barrier height engineering concept using the theory described herein for ballistic-electron-injection. As is apparent, when decreasing the applied voltage between TG 61 and BG 62, the barrier height $20_{54}$ ($\Delta\Phi_{VE\_TB}$) for electrons at TG 61 decreases faster than the barrier height $41_{53}$ ($\Delta\Phi_{VH\_GT}$) for LH 72 and HH 73 in BG 62. In other words, barrier height $41_{53}$ has a weaker voltage-dependence than barrier height $20_{54}$. With such difference on voltage-dependence, the barrier height $20_{54}$ ($\Delta\Phi_{VE\_TB}$) in fact are shifted under the Fermi-level energy $16_{61}$ (i.e. at barrier height equals zero) at an applied voltage of about −3.5V while there is still a sufficient barrier height of about 3.4 eV remained for the barrier height $41_{53}$ ($\Delta\Phi_{VH\_GT}$). FIG. 10 illustrates the energy band diagram for situation when the applied voltage is decreased beyond this voltage level. As shown in FIG. 10, the second barrier $24_{54}$ for electrons 56 shown in FIG. 11 is now under Fermi-level energy $16_{61}$ as the applied voltage is decreased beyond this voltage level. Therefore, electrons 56 of TG 61 having energy higher than the threshold energy 58 can transport through filter 52 without being blocked by BD 64 layer. This permits the band-pass filtering function of the conductor-filter system 59 to inject electrons having tight energy distribution 57' along the forward direction 34. The much weaker dependence of barrier height $41_{53}$ ($\Delta\Phi_{VH\_GT}$) on the applied voltage maintains the barrier $42_{53}$ for blocking holes in this voltage range and hence can prevent holes from backward transport. Therefore, the barriers engineering concept here actually provides a method through which an electrically alterable filter is constructed for ballistic-electron-injection. The filter provides unique feature filtering out the unwanted carriers (i.e. the backward transporting LH 72 and HH 73) without affecting the transport of the wanted carriers (i.e. the forward transporting electrons 56).

The illustrations on formula (1) and (2) and on results shown in FIG. 12A are made by way of example to demonstrate voltage-dependence of barrier heights on two barrier heights $20_{54}$ and $41_{54}$. Similar illustrations can be readily made on other barrier heights (such as $20'_{53}$ and $20'_{54}$ of barriers $24_{53}$ and $24_{54}$, respectively, and $41'_{53}$ and $41_{53}$ of barrier $42_{53}$) of filter 52 in FIG. 11. It is thus clear that the barrier heights of the potential barriers controlling the backward transporting charge carriers have a weaker voltage-dependence on voltage drop across the filter than barrier heights of the potential barriers controlling the forward transporting charge carriers have.

It is desirable to keep the voltage across BD ($V_{BD}$) be less than the barrier height $41_{54}$ in voltage range normally used for ballistic-electrons-injection. Keeping $V_{BD}$ lower than barrier height $41_{54}$ is desirable because it can maintain a trapezoidal-shaped band structure for holes barrier $42_{54}$ in BD 64 to block the backward injected LH 72 and HH 73 more effectively. This barrier structure can become clear by referring to FIG. 10, wherein barrier height $41_{54}$ forms one side of the barrier $42_{54}$ (the entrance side for holes 72 and 73) and barrier height $41'_{54}$ forms the other side of the barrier (the exit side for holes 72 and 73). The barrier height $41'_{54}$ at the exit side of the trapezoidal barrier $42_{54}$ to first order equals $\Delta\Phi_{VB\_GB} - V_{BD}$, where $\Delta\Phi_{VB\_GB}$ is the barrier height $41_{54}$. In the specific embodiment for band structure of FIG. 10, for an applied voltage of −4V between TG 61 and BG 62, the barrier height $41'_{54}$ is about 0.7 eV, and hence the trapezoidal structure for barrier $42_{54}$ is maintained. It is clear that barrier height $41'_{54}$ can be made higher by lowering $V_{BD}$ through optimizing dielectric constant and thickness of TD 53 and BD 54, as taught in the foregoing theory.

For the specific embodiment, voltage of TG 61 is chosen in the range of about −3.5 V to about −4.5 V relative to voltage of BG 62 for the ballistic-electrons-injection. Such voltage can be further lowered by lowering the Image-Force barrier height 20 of the conductor-insulator system 60 as described in connection with FIGS. 3A, 3B and 3C. This can be done by coupling a voltage in the range of about 1 V to about 3 V to CSR 66. Alternately, the Image-Force barrier can be lowered by choosing material for CSR 66 having a smaller work-function (or a higher Fermi-level energy) than that of BG 62.

Lowering voltage applied between TG 61 and BG 62 by lowering the Image-Force barrier brings desirable effects to the present invention. One of the major advantages is on lowering the electric field in dielectrics between TG and BG, and can prevent high-field related problems from occurring in the dielectrics (e.g. dielectric breakdown, which can result in permanent damage to the dielectrics).

The filter 52 further provides a voltage divider function in accordance with another embodiment of the present invention. The voltage-divider function reduces voltage drops in the dielectrics of the filter 52.

FIG. 12B illustrates an example on the voltage divider function using the barrier height engineering concept described herein for ballistic-electron-injection. Referring to FIG. 12B, there is shown voltages across various dielectrics versus voltage across the filter 52. As is apparent, the voltage across the filter 52, and hence voltage applied between TG 61 and BG 62, is divided and shared by regions within the filter 52. The voltage divider function provided by the filter 52 thus permits voltage applied between TG 61 and BG 62 be divided and shared by BD 54 and TD 53 without compromising ballistic-charge-injection. The voltage divider function reduces the voltage withheld by each of these dielectrics and can prevents the dielectric breakdown problem.

One of the unique portions of the present invention lies in the effects provided by the barrier height engineering concept and its implementation in the filter 52. Such effects provide the voltage divider function and prevent dielectric breakdown problem that can happen during the charge injection. Moreover, impact-ionization problem in TG 60, which can be triggered by the backward transporting charge carriers, can be effectively prevented while suppressing these carriers from backward transport by employing the filtering effect on charge blocking.

It is thus clear the filter and the energy band structure illustrated in the present invention can effectively block charge carriers of one polarity type from transporting along a backward direction while passing charge carriers of an opposite polarity type transporting along a forward direction during the ballistic-charge-injection. Thus, the filter 52 provides a charge-filtering function that can "purify" the charge flow. Though not required, it is generally desirable that the material for BG 62 has a Fermi level in the flat band condition lies in about the middle of the energy band gap of BD 54 of filter 52 to best utilize the charge-filtering function when the band structure and the injection mechanism are employed in constructing memory cells.

The forgoing illustration on the ballistic-charge-injection and the barrier height engineering theory is made on electrons. Similar illustration can be readily made for light-holes and heavy-holes to achieve similar effects on charge filtering and injection.

Figure 13:
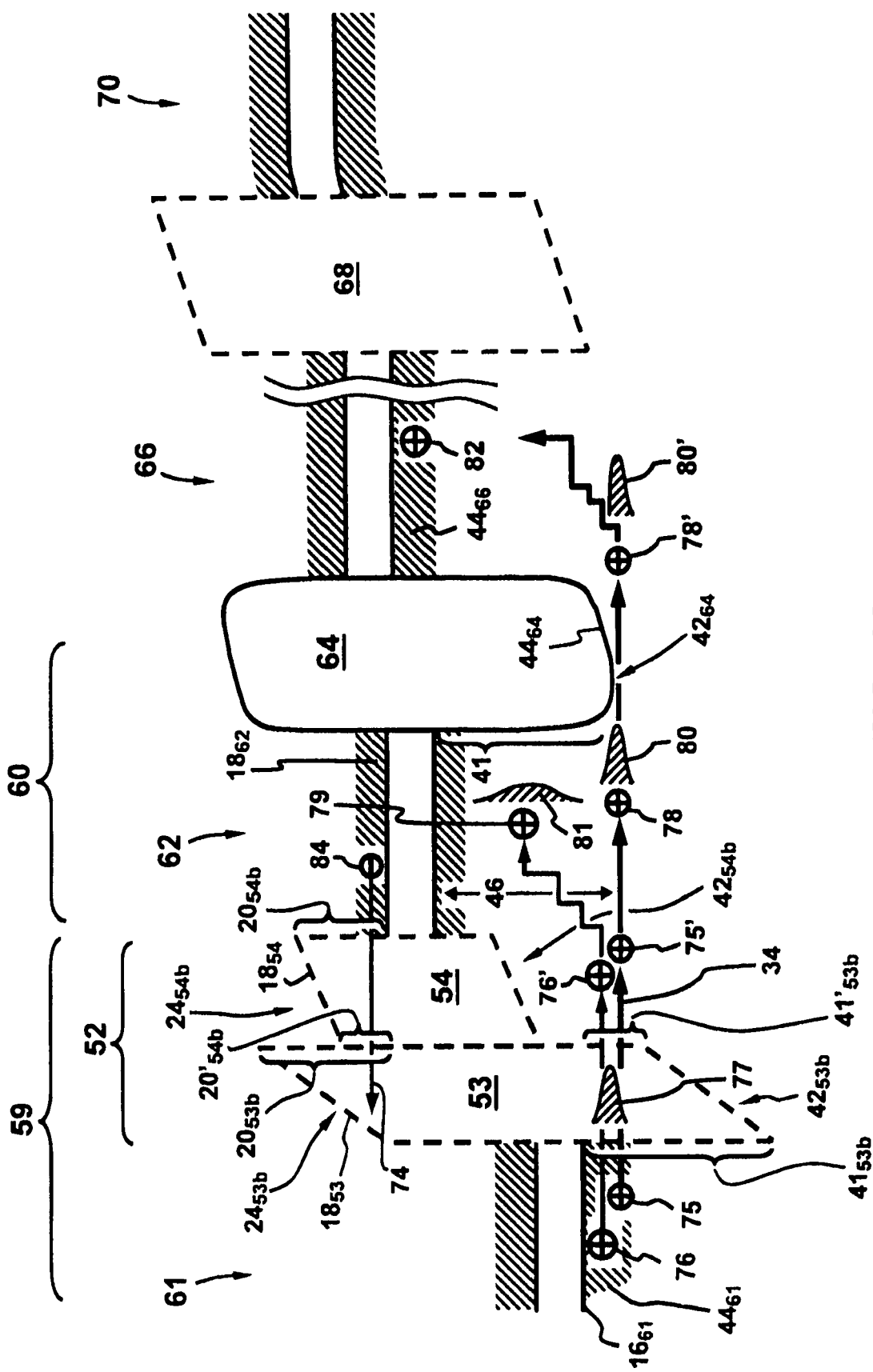
FIG. 13 is an energy band diagram in accordance with another embodiment of the present invention illustrating the charge-filtering and the image-force barrier lowering for ballistic-light-holes-injection mechanism.

FIG. 13 provides an energy band diagram to illustrate the ballistic-charge-injection and filtering effect for holes in the charge-injection system of the FIG. 10 type. In the conductor-filter system 59 of FIG. 13, the conductor 61 supplies thermal charge carriers 75 and 76. The filter 52 contacts the conductor 61 and includes dielectrics 53 and 54 for providing a filtering function on the charge carriers 75 and 76 of one polarity (positive charge carriers), wherein the filter includes electrically alterable potential barriers $42_{53b}$ and $42_{54b}$ for controlling flow of the charge carriers 75 and 76 of one polarity through the filter 52 in one direction (forward direction 34). In addition to controlling the one polarity of charge carriers (positive charge carriers 75 and 76), the filter 52 further includes electrically alterable potential barriers $24_{53b}$ and $24_{54b}$ for controlling the flow of charge carriers of an opposite polarity (negative charge carriers, electrons 84) through the filter in another direction (backward direction 74) that is substantially opposite to the one direction.

Such filtering function permits charge carriers of one polarity type transporting along the forward direction 34 and blocks charge carriers of an opposite polarity type transporting along a backward direction 74. Thus, the filter 52 provides a charge-filtering function that can "purify" the charge flow. The charge-filtering function is another embodiment of the filtering function of filter 52, and is similar to the charge-filtering function as described in connection with FIG. 10.

Referring to FIG. 13, there is shown LH 75 and HH 76 in the valence band 446, of TG 61 as the supplied carriers for injection. LH 75 and HH 76 are shown transporting along the forward direction 34 in an energy distribution 77 on their population. Although energy distribution for LH 75 and HH 76 are shown in same distribution 77, it is noted that LH 75 and HH 76 can have different energy distributions on their population due to differences on their effective masses.

In FIG. 13, both LH 75 and HH 76 are shown transporting through barriers of filter 52 in quantum mechanical tunneling mechanism to become LH 75' and HH 76' having a kinetic energy 46 with respect to the valence band of BG 62 that is slightly higher than a barrier height 41 of an Image-Force barrier $42_{64}$. When these carriers transport further along the forward direction, their transport behaviors through BG 62 are very different due to their difference on effective mass. For HH 76', due to their heavy effective mass, the mean-free-path can be very short. Therefore, HH 76' are prone to experience scattering events with other particles (e.g. phonons), and have low ballistic transport efficiency ("ballisticity"). In FIG. 13, HH 76' are shown experiencing scattering events and losing their energy to become HH 79. Further, these scattered HH 79 are shown having a broad energy distribution 81 than original one 77 due to scattering. Such holes 79 are shown transporting at energy below a barrier height 41 of an Image-Force barrier $42_{64}$ at the valence band $44_{64}$ of RD 64, and hence are blocked from transporting over barrier $42_{64}$ and cannot enter CSR 66. In a contrast, the LH 75' has a lighter effective mass, and hence a much longer mean-free-path than that of HH 76' (for example, in silicon, the mean-free-path of LH is about 3 times of that of HH). In one case, a portion of these LH 75' can transport through BG 62, without scattering (i.e. in ballistic transport), at the kinetic energy 46 to become energized charge carriers LH 78 at the interface of BG 62 and RD 64. Such LH 78 (also termed "ballistic LH") do not experience scattering with other particles (e.g. phonons), and hence can conserve their kinetic directional energy and momentum along original movement and their energy distribution 80 similar to the original one 77. In another case, LH 75' can transport through BG 62 in the partial ballistic scattering, and still can maintain their kinetic energy 46 high enough and directional toward the interface of BG 62 and RD 64 to become LH 78. In all cases, such LH 78 can surmount the barrier height 41 of the Image-Force barrier $42_{64}$ in mechanism as described in connection with FIG. 6, entering a valence band $44_{64}$ of RD 64, making their way there through to become LH 78' having an energy distribution 80' on their population, and finally got collected and stored on CSR 66 as holes 82 in the valence band $44_{66}$. Such process in filtering and injecting hole charges (either in the ballistic transport or in the partially ballistic transport) is termed as ballistic-holes-injection mechanism. Typically, the energy distribution 80 of the energized charge carriers (LH 78) has an energy spectrum in the range of about 30 meV to about 300 meV. The injection efficiency (defined as the ratio of number of carriers collected to the number of carriers supplied) of such holes typically ranges from about $10^{-6}$ to about $10^{-3}$. The injection efficiency can be further enhanced by injecting piezo-holes (see the piezo-ballistic-hole injection mechanism as described in connection with FIGS. 17 B, 17C).

For the specific embodiment on materials for systems 59 and 60 as described in connection with FIG. 10, voltage of TG 61 is chosen in the range of about +5V to about +6.0 V relative to voltage of BG 62 for the ballistic-holes-injection. Such voltage can be further lowered by lowering the Image-Force barrier height 41 of the conductor-insulator system 60 as described in connection with FIG. 6. This can be done by for example coupling a voltage in the range of about −1 V to about −3 V to CSR 66. Alternately, the Image-Force barrier height can be lowered by choosing material for CSR 66 having a larger work-function (or a lower Fermi-level energy) than that of BG 62.

The voltage applied between TG 61 and BG 62 can be further reduced by employing materials having similar Fermi-level energy for these regions. This constitutes another specific embodiment on materials for systems 59 and 60 for the ballistic-hole-injection. For example, the charge-injection system can comprise a p+ polysilicon for TG 61, an oxide layer for TD 53, a nitride layer for BD 54, a p+ polysilicon for BG 62, and an oxide layer for RD 64. Such embodiment allows voltage of TG 61 relative to voltage of BG 62 be chosen in a lower range (e.g. from about +4.5 V to about +5.5 V) for the ballistic-holes-injection.

FIG. 13 further shows that electrons 84 in conduction band $18_{62}$ of BG 62 can transport along the backward direction 74 while biasing the energy band structure in the voltage polarity for transporting LH 75 and HH 76 along the forward direction 34. The backward transporting electrons 84 can result in undesired problems such as impact-ionization in TG 61, current and power waste etc. that are similar to those problems caused by backward transporting holes as described in connection with FIG. 10. It is thus desirable to block electrons 84 from backward transporting into TG 61 by using the filter 52.

The energy band structure in FIG. 13 shows the backward-transporting carriers (i.e. electrons 84) have to transport through more barriers than the forward-transporting carriers (i.e. LH 75 and HH 76) do. A first electron barrier $24_{54b}$ blocking the backward transporting electrons 84 comprises barrier heights $20_{54b}$ and $20'_{54b}$ at an entrance side and an exit side, respectively, of the barrier $24_{54b}$. Barrier heights $20_{54b}$ and $20'_{54b}$ are referenced to conduction band $18_{54}$ of BD 54 at interface between BD 54 and BG 62 and between TD 53 and BD 54, respectively. A second electron barrier $24_{53b}$ is shown having a barrier height $20_{53b}$ at its entrance side and forms another barrier blocking electrons 84. The barrier height $20_{53b}$ is referenced to conduction band $18_{53}$ of TD 53 at the interface between TD 53 and BD 54. A barrier height $20'_{53b}$ (not shown) exists at an exit side of barrier $24_{53b}$, and is referenced to conduction band $18_{53}$ of TD 53 at the interface between TG 61 and TD 53. In the example shown here, barrier height $20'_{53b}$ is below the energy level of electrons 84, and hence is not shown in FIG. 13. Both barriers $24_{54b}$ and $24_{53b}$ form an energy band structure in the conduction band of filter 52 to block backward-transporting electrons 84.

There are two similar barriers for holes 75 and 76 on their transporting path along the forward direction 34. A first potential barrier $42_{53b}$ is formed by TD 53 and has barrier heights $41_{53b}$ and $41'_{53b}$ at the entrance and the exit sides, respectively, of barrier $42_{53b}$. A second barrier $42_{54b}$ is formed by BD 54 and has barrier heights $41_{54b}$ and $41'_{54b}$ (not shown) at the entrance and the exit sides of barrier $42_{54b}$, respectively. Both the first and the second barriers $42_{53b}$ and $42_{54b}$ form energy band structure in the valence band of filter 52 and have effect on blocking the forward transporting holes 75 and 76. In FIG. 13, the energy band structure is biased to inject holes. Both barrier heights $41_{54b}$ and $41'_{54b}$ are below the energy level of forward transporting holes, and hence are not shown in FIG. 13.

Figure 14:
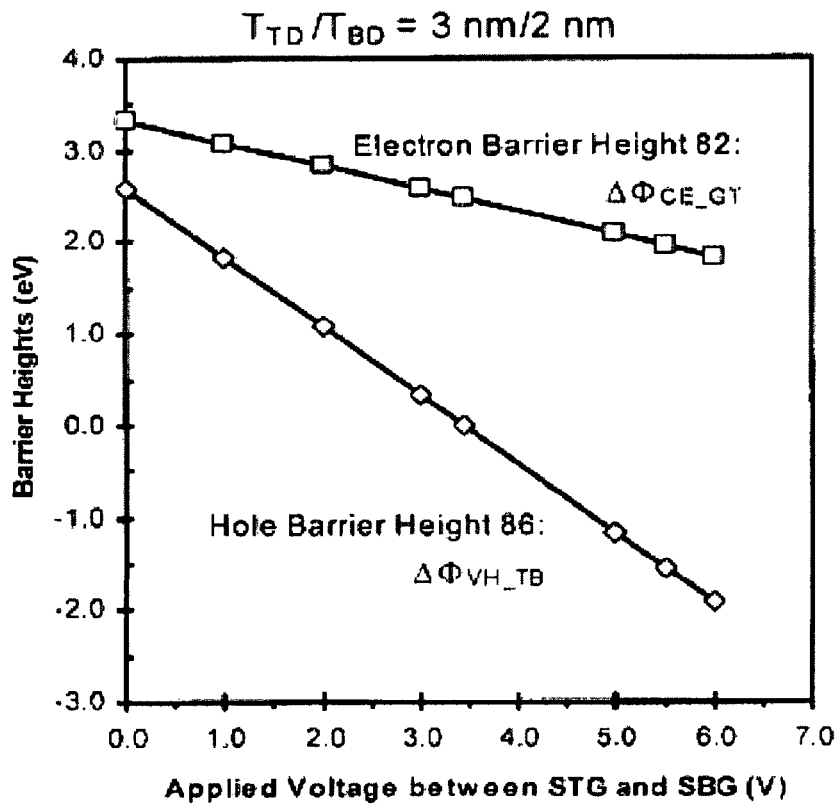
FIG. 14 illustrates the effect of the barrier height engineering in accordance with the present invention for ballistic-holes-injection, wherein the barrier height of the forward transporting holes and the barrier height of the backward transporting electrons can be altered in different degree by voltage between TG and BG.

FIG. 14 illustrates the effect of the barrier height engineering in accordance with the present invention for ballistic-holes-injection, wherein the barrier height $20'_{54b}$ of the backward transporting electrons is shown having a weaker voltage-dependence on voltage drop across filter 52 (i.e. voltage between TG 61 and BG 62) than the barrier height $41_{54b}$ of the forward transporting holes has. Hence, the two barrier heights $20'_{54b}$ and $41_{54b}$ can be altered in different degree by voltage drop across filter 52. This barrier height dependence on voltage is asymmetrical and is primarily governed by the combined effects of dielectric constant and dielectric thickness (i.e. the "∈T effect"), as illustrated in the barrier height engineering theory. As is apparent, when increasing the applied voltage between TG 61 and BG 62, the barrier height $41_{54b}$ for holes 65 and 76 of TG 61 decreases faster than the barrier height $20'_{54b}$ for electrons 84 in BG 62. In other words, barrier height $20'_{54b}$ has a weaker voltage-dependence than barrier height $41_{54b}$. The barrier height $41_{54b}$ in fact is shifted below hole energy (i.e. at barrier height equals zero) at an applied voltage of about +3.5V while there is still a sufficient barrier height of about +2.5 eV remained for the barrier height $20'_{54b}$. FIG. 13 illustrates the energy band diagram for situation when the applied voltage is increased beyond this voltage level. As shown in FIG. 13, the second barrier $42_{54b}$ for holes 75 and 76 is below hole energy as the applied voltage is increased beyond this voltage level. Therefore, holes 75 and 76 of TG 61 can transport through filter 52 without being blocked by BD 64 layer. The much weaker dependence of barrier height $20'_{54b}$ on the applied voltage maintains the barriers $24_{54b}$ and $24_{53b}$ for blocking electrons 84 in this voltage range and hence preventing electrons from backward transporting.

The illustration made in FIG. 14 is by way of example showing the asymmetrical voltage-dependence of barrier heights on two barrier heights $20'_{54b}$ and $41_{54b}$. Similar showing can be readily made on other barrier heights (such as $20_{53b}$ and $41'_{53b}$ of barriers $24_{53b}$ and $42_{53b}$, respectively) of filter 52 in FIG. 13. It is thus clear that the barrier heights of the potential barriers controlling the backward transporting charge carriers have a weaker voltage-dependence on voltage drop across the filter than barrier heights of the potential barriers controlling the forward transporting charge carriers have.

While not shown, the filter also provides voltage divider function while voltage polarity between TG and BG is set for ballistic-hole injection. The voltage divider function for ballistic-hole injection reduces voltage drops in the dielectrics of the filter 52, and is governed by similar effect as that described in connection with FIG. 12B for ballistic-electron injection. For ballistic-hole injection, due to the higher voltage illustrated, the voltage divider function reduces the electric fields within dielectrics of filter 52 by reducing the voltage drops across them and thus prevents the dielectric breakdown problem.

Therefore, the barriers engineering concept here provides a method through which an electrically alterable filter is constructed for ballistic-charge-injection. The filter provides unique feature filtering out the unwanted carriers (i.e. the backward transporting carriers) without affecting the transport of the wanted carriers (i.e. the forward transporting carriers).

The filter 52 further provides another filtering function in accordance with the present invention. Such filtering function permits charge carriers of one polarity type and having lighter mass (e.g. LH) to transport through the filter, and blocks charge carriers of the same polarity type and having a heavier mass (e.g. HH) from transporting there through. Thus, the filter 52 provides a mass-filtering function that can filter the charge carrier flows based on their mass.

Figure 15:
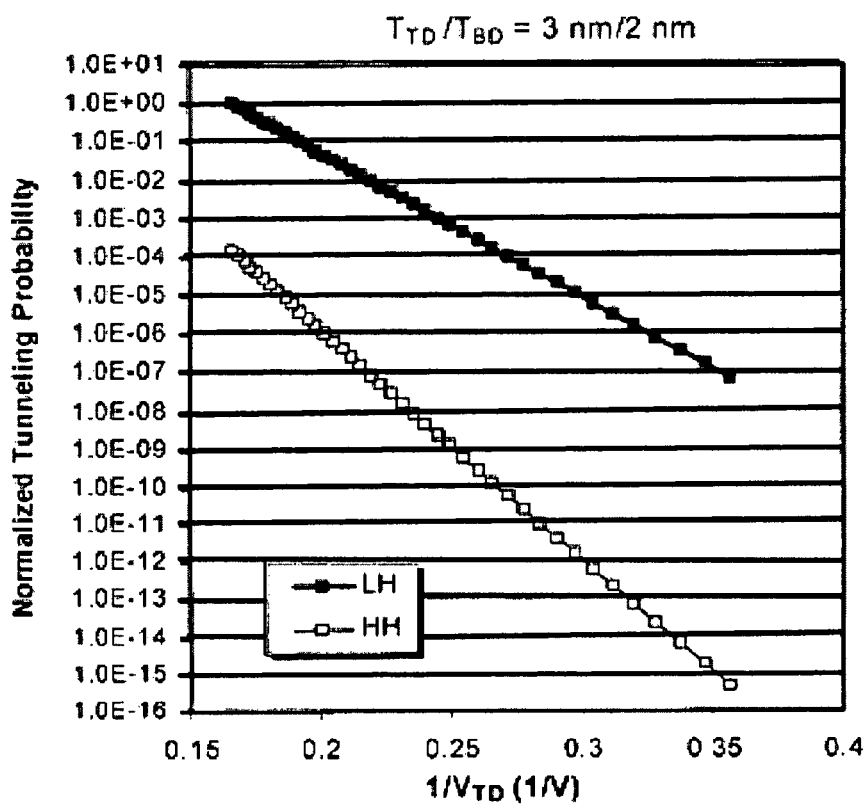
FIG. 15 shows normalized tunneling probability plotted as a function of reciprocal of voltage across TD for LH and HH.

FIG. 15 illustrates the basis of the mass-filtering function of the filter 52. The mass-filtering function can be better captured by referring back to FIG. 13. In the conductor-filter system 59 of FIG. 13, the conductor 61 supplies thermal charge carriers (LH 75 and HH 76). The filter 52 contacts the conductor 61 and includes dielectrics 53 and 54 for providing a filtering function on the charge carriers 75 and 76 of one polarity (positive charge carriers), wherein the filter includes electrically alterable potential barriers $42_{53b}$ and $42_{54b}$ for controlling flow of the charge carriers 75 and 76 of one polarity through the filter 52 in one direction (forward direction 34).

It is known in quantum mechanics theory that tunneling probability of charge carriers is a function of their mass, and the heavier carriers (e.g. HH 76) can have a tunneling probability lower than that of the lighter one (e.g. LH 75). FIG. 15 shows normalized tunneling probability calculated for LH and HH and is plotted as a function of the reciprocal of $V_{TD}$ to illustrate the mass-filtering function of filter 52. In the illustration, filter 52 is assumed comprising TD 53 of oxide having 3 nm on thickness and BD 54 of nitride having 2 nm on thickness. For the range of voltage (+5 V to +6 V) that is applied between TG 61 and BG 62 for ballistic-hole injection, the tunneling probability of HH is shown lower than that of LH by about 4 to about 8 orders of magnitude. The difference on tunneling probability due to the effect of carrier masses permits mass-filtering function realized in the filter 52. Although the illustration made herein is on hole carriers, the same illustration can be readily extended to other types of carriers having same polarity type but different mass (for example, piezo-electrons as described in connection with FIGS. 17B and 17C). The mass-filtering function is another embodiment of the filtering function of filter 52.

The mass-filtering function of filter 52 and its application on passing LH brings desirable advantages to the present invention. For example, it can avoid wasting on the supplied carriers of TG 61 that are used for ballistic injection. This is because the majority population of the hole carriers in TG 61 are of the HH type, which has a shorter mean-free-path and prone to experience scattering events when transporting across BG 62. Such HH cannot efficiently contribute to the ballistic injection and thus are wasted when employed as the supplied carriers. By filtering out the HH through the mass-filter function of filter 52, the primary supplied carriers are now limited to LH carriers only. LH carriers have a longer mean-free-path and can more efficiently contribute to the ballistic injection while transporting through BG 62 via mechanism described in connection with FIG. 13. As a result, the mass-filtering function of filter 52 provides feature on selecting carriers having high ballisticity as the supplied carriers, and hence avoids waste on supplied current by carriers of low ballisticity.

The filter 52 of the conductor-filter system 59 provides unique filtering functions. It provides the band-pass filtering function as described in connection with FIG. 7, the charge-filtering function as described in connection with FIGS. 10, 12A, 13 and 14, and the mass-filtering function as described in connection with FIG. 15. In addition to the filtering function, the filter 52 provides an additional voltage divider function as described in connection with FIG. 12B. It should be clear to those of ordinary skill in the art that the teachings of this disclosure can be applied to modify the dielectrics and/or architecture of the filter through which these functions can be tailored individually or collectively. For example, the filter can contain more than two dielectrics to enhance its voltage-divider function. Further, the dielectrics of filter need not be having a uniform chemical element but rather can have a graded composition on its element that can effectively support these functions. It is thus understood that the present invention is not limited to the illustrated herein and embodiments described above, but encompasses any and all variations falling within the scope of the appended claims.

Figure 16:
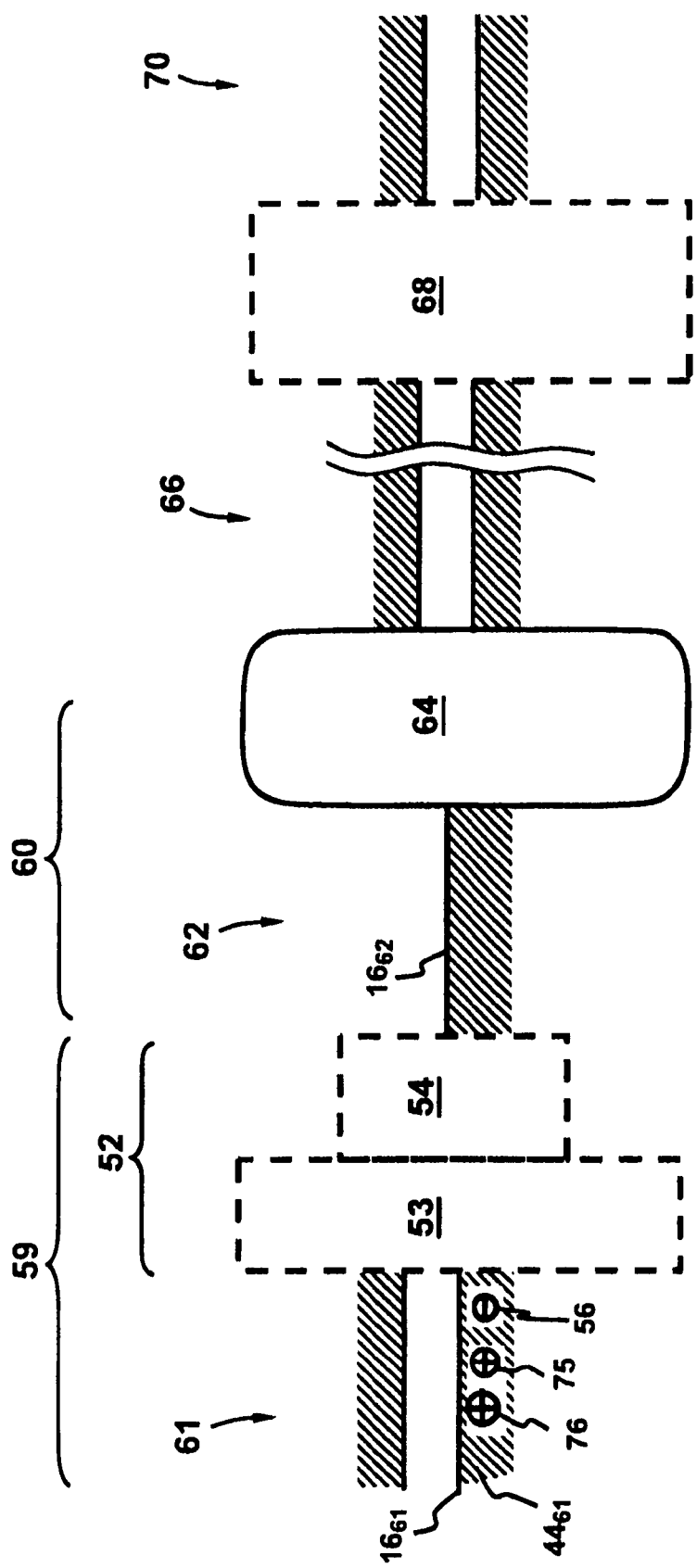
FIG. 16 is an energy band diagram on band structure of another embodiment on charge-injection system in accordance with the present invention.

Now, please turn to FIG. 16. FIG. 16 provides an energy band diagram in flat-band condition for another embodiment on energy band structure of the charge-injection system in accordance with the present invention. The band structure is in all respects except one the same as that of FIG. 11. The difference is that instead of having BG 62 be comprised of a semiconductor, the diagram is provided with BG 62 be comprised of a metal having work function with a Fermi-levels $16_{62}$, such as materials for conductor described in connection with FIG. 1. FIG. 16 further shows charge carriers of electrons 56, LH 75, and HH 76, in valence band $44_{61}$ of TG 61. Such electrons 56 are filtered by filter 52 and are injected onto CSR 66 by applying proper voltage and polarity to TG 61 and BG 62 as described in connection with FIGS. 7, 12A, and FIG. 10. Similarly, LH 75 and HH 76 are filtered by filter 52 and are injected onto CSR 66 by applying proper voltage and polarity to TG 61 and BG 62 as described in connection with FIGS. 14, 15, and FIG. 13.

In the forgoing embodiments on band structure for ballistic-charge-injection, BG 62 forms the active layer for ballistic charges transport and is generally required to have a thickness thinner than a few times of the mean-free path of charge carriers (typically in the range of 10 nm to 20 nm), in order to permit such carriers transporting through BG 62 with good efficiency. The needs on a thin thickness for BG 62 layer unavoidably results in a large sheet resistance R to that layer, and cause fundamental problems in IC applications. For example, it can cause a large signal delay due to a combining effect of the large sheet resistance R and a large C (i.e. the RC delay). This is particularly a main issue on memory operation as the RC delay can limit the speed on accessing a memory cell when embedded in a large memory array. Secondly, for disturb prevention on un-selected cells, an optimum set of predetermined voltages usually are required to be applied to those cells. However, due to the RC delay, voltages on un-selected cells can be different than the desired values, and hence cell disturb is more prone to happen. Furthermore, the large R can combine with a large current I to result in a IR effect, which can cause a voltage drop when passing a voltage in a signal line. The effect prevents the voltage on a designated electrode of a memory cell from reaching its desired level, and hence can adversely impact cell operation. For example, the adverse impact on an unselected cell can be an undesired cell disturb, where the cell state is unintentionally changed from one logic state (e.g. a "0") to the other (e.g. a "1"). The IR impact on a selected cell can be a slower speed on cell operations (i.e. program, erase, and read operations).

These problems can however, be overcome by considering the Piezo-Effect as described hereinafter.

Application of Piezo-Effect to Ballistic-Charge Injection

Piezo-effect is a well-known physical phenomenon in solid-state physics. Piezo-effect can change electrical properties of a semiconductor material when a mechanical stress is applied to such material (see Pikus and Bir, Symmetry and Strain-Induced Effects in Semiconductors, New York: Wiley, 1974). The mechanical stress can be originated from a strain source (also can be termed as "stressor") that is either internal or external to the material. This mechanical stress can be either in compressive form (compression), or in tensile form (tension), and can results in a strain in the material. It breaks the symmetry within the crystal lattice and hence deforms the potential therein. Some well-known applications of the piezo-effect on semiconductors (e.g. silicon) are piezo-resistive effect in resistors, piezo-junction effect in bipolar transistors and diodes, piezo-Hall effect in sensors, and piezo-FETs in MOS transistors ("MOSFETs").

Figures 17A, 17B, 17C:
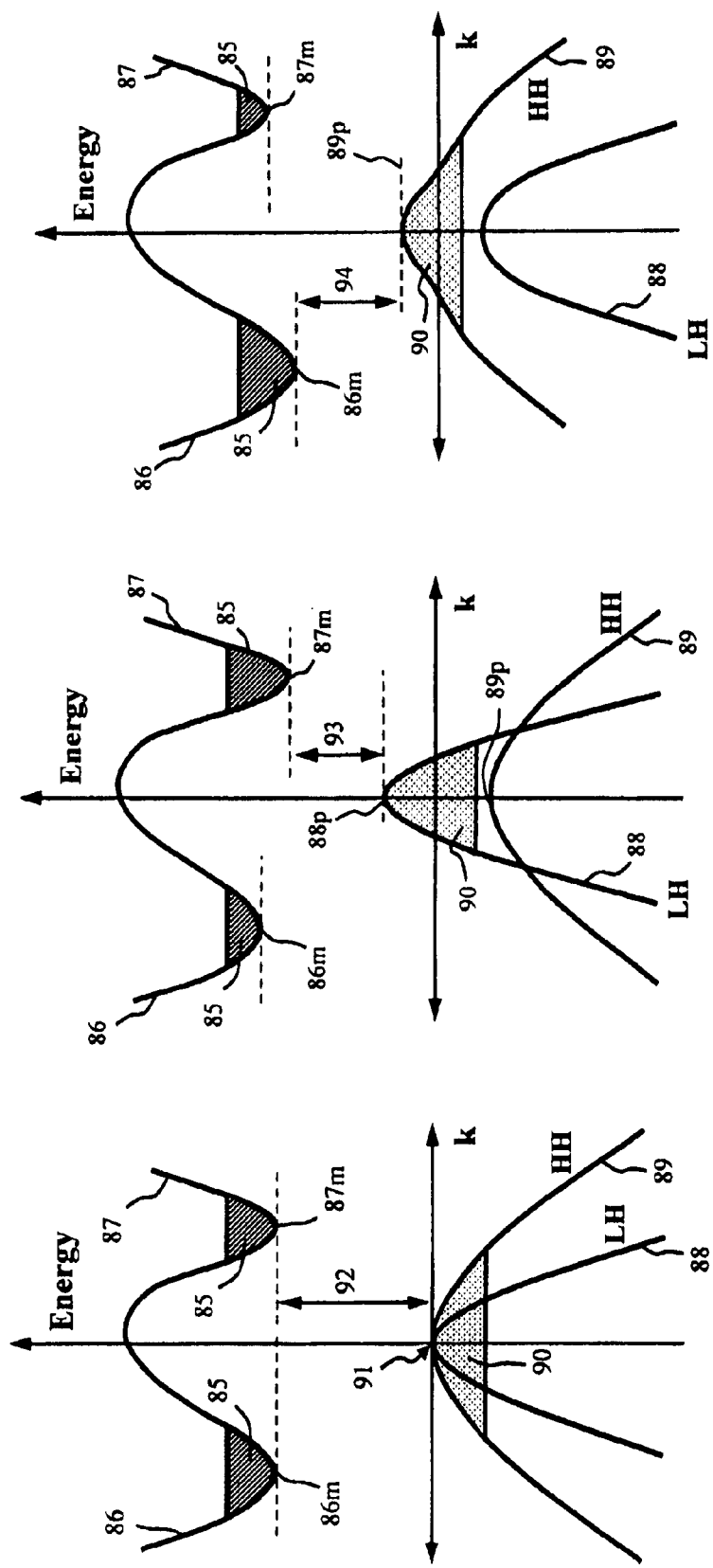
FIG. 17A is a schematic diagram illustrating the dispersion relationship between energy E and momentum vector k for a semiconductor without strain.
FIG. 17B is a schematic diagram illustrating the dispersion relationship between energy E and momentum vector k for a semiconductor under tensile stress.
FIG. 17C is a schematic diagram illustrating the dispersion relationship between energy E and momentum vector k for a semiconductor under compressive stress.

The present invention further provides the application of the piezo-effect to the ballistic charge carrier injection and transport. A novel piezo-ballistic-charge-injection mechanism is provided with illustrations made herein to various embodiments of the present invention Piezo-Ballistic-Charge-Injection Mechanism It is known that when a strain is in presence in semiconductors, it can split valleys in conduction band and degeneracy in valence sub-bands of HH and LH (see Hensel et al., "Cyclotron Resonance Experiments in Uniaxially Stressed Silicon: Valence Band Inverse Mass. Parameters and Deformation Potentials, Phys. Rev. 129, pp. 1141-1062, 1963). FIGS. 17A, 17B and 17C provide schematic diagrams illustrating the dispersion relationship between energy E and momentum vector k for a semiconductor without strain (or "unstrained"), under tensile stress (tensile strained), and under compressive stress (compressive strained), respectively.

FIG. 17A shows dispersion relationship for a semiconductor without strain. There is shown electrons 85 filled in two conduction band valleys, a left valley 86 and a right valley 87, having minima 86*m* and 87*m*, respectively. The minima 86*m* and 87*m* are shown at similar energy level. With the different curvatures on the dispersion curves shown for the valleys, the left valley 86 has a heavier effective mass than the right one 87. Also shown are dispersion curves for LH and HH sub-bands 88 and 89 filled with holes 90. LH and HH sub-bands 88 and 89 are shown having energy degeneracy at a valence band maximum 91. The conduction band minima 86*m* or 87*m* and the valence band maximum 91 are separated by an energy band gap 92.

FIG. 17B shows dispersion relationship similar to FIG. 17A except the semiconductor is strained with tensile stress. The conduction band valleys are shown shifted with their minima moving upward (in the left valley 86) or downward (in the right valley 87). This shift redistributes the electron population within the two valleys, where electrons 85 are more populated in the valley 87 due to a lower energy level on the conduction band minimum 87*m*. Repopulating electrons 85 to reside primarily in valley 87 is desirable for two reasons. First, it provides desirable effect on electron transport in the semiconductor due to the lighter electron effective mass in the conduction valley 87. Second, the separation of the valleys is known being able to reduce inter-valley scattering of electrons. These effects can be more specifically illustrated by using silicon as an example. The strain in silicon can cause splitting of the six-fold degenerate conduction band into two-fold and four-fold degenerate valleys with most electrons (about 100 percent of the entire electrons) populated in the two-fold degenerate valley having lighter effective mass along electron transport direction. This strain effect is known to increase electron mobility by about 50 percent and drift velocity by about 16 percent in strained-Si MOSFETs (a type of piezo-FETs, see Vogelsang et al., "Electron Mobilities and High-Field Drift Velocity in Strained Silicon on Silicon-Germanium Substrate", IEEE Trans. on Electron Devices, pp. 2641-2642, 1992). Similar strain effect can be applied to enhance the transport of ballistic charge carriers. Thus, ballistic electron injection efficiency in silicon can be enhanced by repopulating electrons to the two-fold degenerate valley. This can be achieved through applying stress to silicon to cause strain along direction of electron transport. It is thus clear the piezo-effect can result in heavily populated "piezo"-electrons (i.e. electrons in material under mechanical stress), which have a lighter mass and lower scattering rates. When combining these effects to the ballistic electron injection, it provides a piezo-ballistic-electron-injection mechanism in accordance with one embodiment of the present invention.

While not shown, such piezo-electrons can be employed as the supplied carriers in energy band structures in connection with FIGS. 9 and 10 to go through transport process as described therein.

FIG. 17B also illustrates the strain effect of tensile stress in semiconductor can further remove the degeneracy of valence sub-bands 88 and 89, where the LH sub-band 88 is shown shifted upward and the HH sub-band 89 is shown shifted downward. A maximum 88*p* of the LH sub-band 88 is shown at an energy level higher than a maximum 91 of valence bands of FIG. 17A. A maximum 89*p* of the HH sub-band 89 is shown at an energy level lower than the maximum 91 of valence bands of FIG. 17A. Having this effect and the effect on shifting down the conduction band valley 87, and hence its minimum 87*m*, the energy band gap 93 can be narrower than the energy band gap 92 of the unstrained case of FIG. 17A. Using silicon as an example, for tensile strained silicon layer (e.g. forming a silicon layer on a $Si_{1-x}Ge_x$ layer), the energy level of the two-fold degeneracy in silicon can be shifted down by about 0.18 eV and the LH degeneracy can be shifted up by about 0.12 eV for a Ge mole fraction x equals about 30 percent. The resulted energy band gap 93 thus is about 0.8 eV. Further a LH to HH band splitting is shown between the maxima 88*p* and 89*p* of LH and HH sub-bands 88 and 89, respectively. The band splitting is a result of removing the LH and HH degeneracy and has the effect on reducing inter-band scattering between LH and HH. Moreover, a deformation on valence sub-bands can reduce effective mass of the light-holes. As a result, the mean-free-path of ballistic light-holes can be longer in a strained semiconductor than that in an unstrained one.

FIG. 17B also shows that with lifting the degeneracy of LH and HH sub-bands, holes 90 can be repopulated from the HH sub-band 89 to LH sub-band 88. In fact, with silicon strained under the tensile stress, LH population can be increased from about 20 percent to about 90 percent of entire holes population (see Fischetti et al., Journal of Appl. Physics, vol. 94, pp. 1079-1095, 2003). Further, it is known that LH has a much lower scattering rate than that of HH (see Hinckley et al., "Hole Transport Theory in Pseudomorphic $Si_{1-x}Ge_x$ Alloys Grown on Si(001) Substrates," Phys. Rev. B, 41, pp. 2912-2926, 1990). These effects are further considered in the injection mechanism of the present invention (for example on LH injection as described in connection with FIG. 13). The holes injection efficiency can be enhanced by injecting "piezo" holes (i.e. holes in material under mechanical stress) through repopulating holes from HH to LH sub-bands. This can be achieved through applying tensile stress to regions where holes are injected from, and it provides a method employing piezo-effect on ballistic-charge-injection. With the heavily populated LH and their higher ballisticity, when applying these combined effects through such method to ballistic-charge-injection, it provides a piezo-ballistic-holes injection mechanism as another embodiment of the piezo-ballistic-charge-injection mechanism in accordance with the present invention. The method enhances the ballistic holes injection efficiency through injecting piezo-ballistic-holes (e.g. LH).

FIG. 17C illustrates dispersion relationship similar to FIG. 17B except the semiconductor is under strain of compressive stress. Similar to the tensile stress, the compressive stress can lift the degeneracy of valence sub-bands 88 and 89, but in an opposite order as compared to that shown in FIG. 17B. The LH sub-band 88 is shown shifted downward and the HH sub-band 89 is shown shifted upward. Nevertheless, lifting the HH and LH degeneracy can reduce inter-band scattering between LH and HH. Due to this shift on valence sub-bands, the holes are shown primarily populated in the HH valence sub-band. Further, the valence sub-bands are shown with deformed curvatures as compared to those shown in FIG. 17A of the unstrained case. The deformed HH valence sub-band in FIG. 17C can reduce effective mass of the heavy-holes to a lighter one. As a result, the mean-free-path of holes in a strained semiconductor (i.e. piezo-holes) can be longer than that of an unstrained one. This effect provides another embodiment of the piezo-ballistic-charge-injection mechanism in accordance with the present invention.

Figure 18:
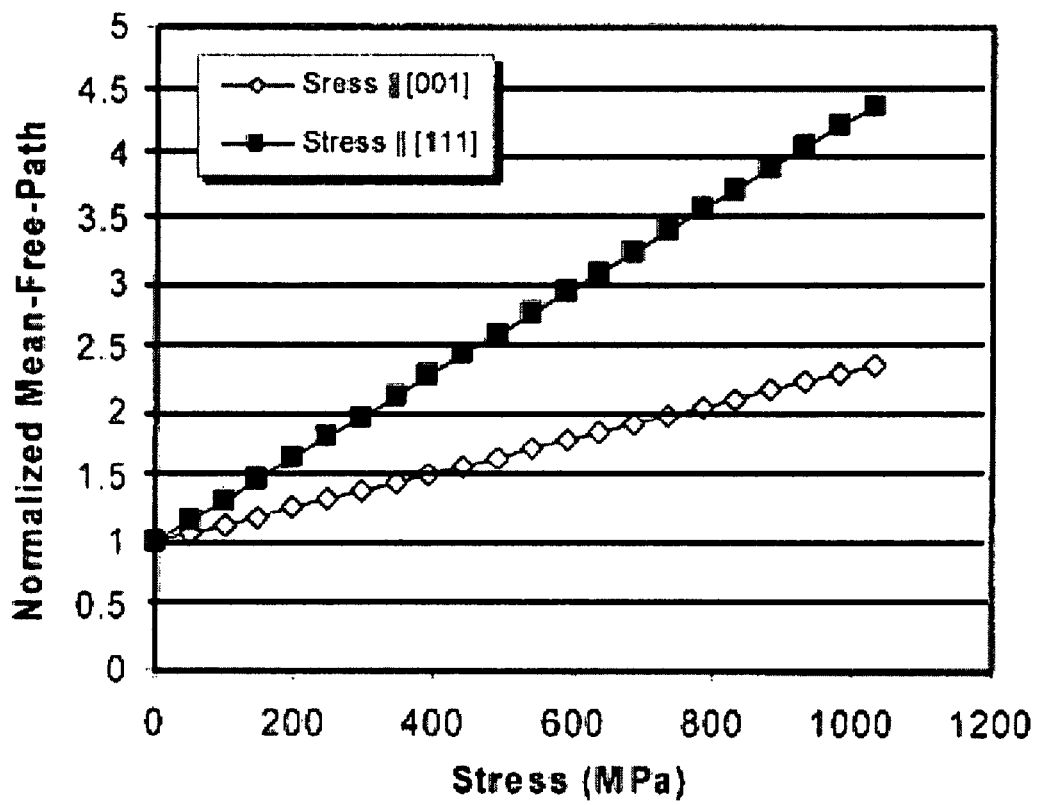
FIG. 18 is a plot illustrating normalized mean-free-path versus stress calculated for compressive strained silicon.

It is known that the effective mass of a lifted valence sub-band to first order can be shifted linearly with stress (see Hensel et al., "Cyclotron Resonance Experiments in Uniaxially Stressed Silicon Valence Band Inverse Mass Parameters and Deformation Potentials, Phys. Rev. 129, pp. 1141-1062, 1963, and see Hinckley et al., "Hole Transport Theory in Pseudomorphic $Si_{1-x}Ge_x$ Alloys Grown on Si(001) Substrates," Phys. Rev. B, 41, pp. 2912-2926, 1990). Employing this relationship in together with the relationship between effective mass and mean-free-path, the present invention provides a method to alter the mean-free-path of piezo-ballistic-charges. This method represents another embodiment of the piezo-ballistic-charge-injection mechanism, and is illustrated by adjusting the level of the stress along direction parallel to the direction of charge transport. FIG. 18 shows an example of the effect of stress on mean-free-path. The compressive stress on strained silicon is used as an example to illustrate the effect on HH. Referring to FIG. 18, the vertical axis represents a normalized mean-free-path, which is the ratio of the mean-free-path in strained silicon to that in unstrained silicon. As can be seen in the plot, the normalized mean-free-path increases linearly with increasing stress. Further, the enhancement effect on mean-free-path is more significant for stress axis parallel to [111] than to [001] of the crystallographic direction in silicon.

Figure 19:
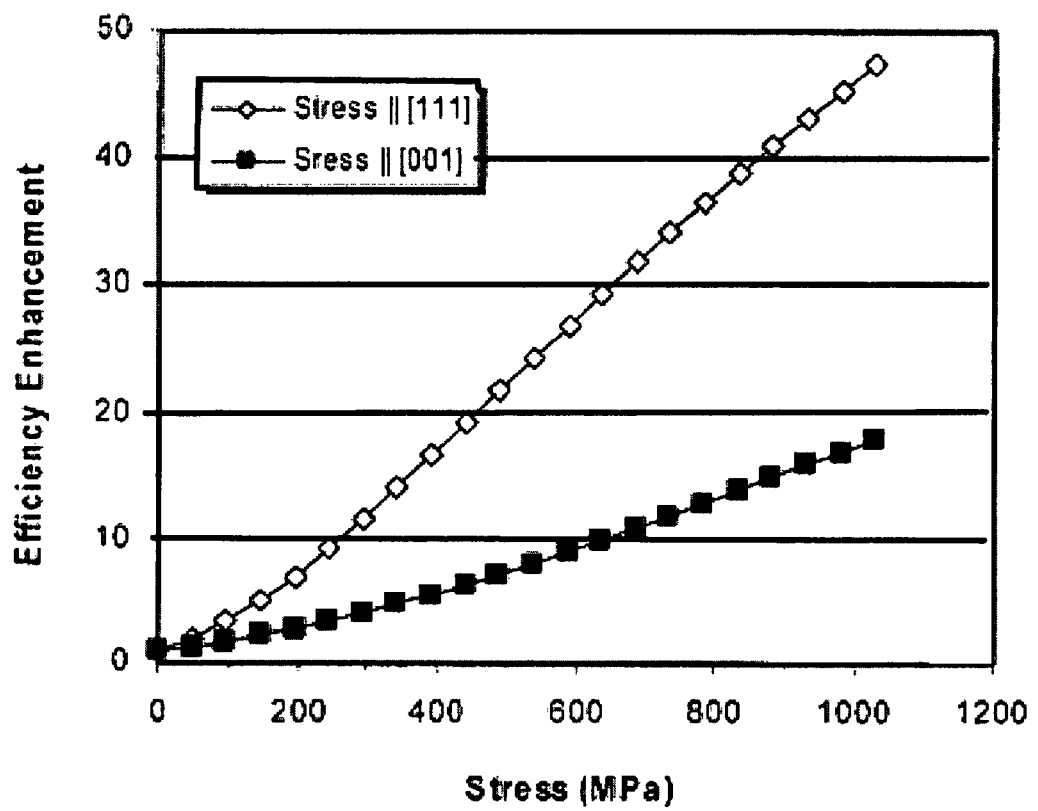
FIG. 19 is a plot illustrating efficiency enhancement versus stress in compressive strained silicon with stress axis as the plotting parameter.

FIG. 19 illustrates the efficiency enhancement versus the compressive stress for the piezo-ballistic hole injection. The efficiency enhancement is the ratio of the efficiency of strained silicon to the efficiency of unstrained silicon. As can be seen in the plot, the enhancement increases super-linearly for stress in a moderate mechanical stress (e.g. in the range of about 200 mega Pascal ("MPa") or lower), and becomes approximately linearly proportional to the stress in a higher range (e.g. in the range of about 400 MPa or higher). Further, the enhancement effect is much more significant for stress axis parallel to [111] than to [001]. About twenty times and about fifty times higher on the efficiency are illustrated achievable for stress axis along [001] and [111] directions, respectively.

Figure 20:
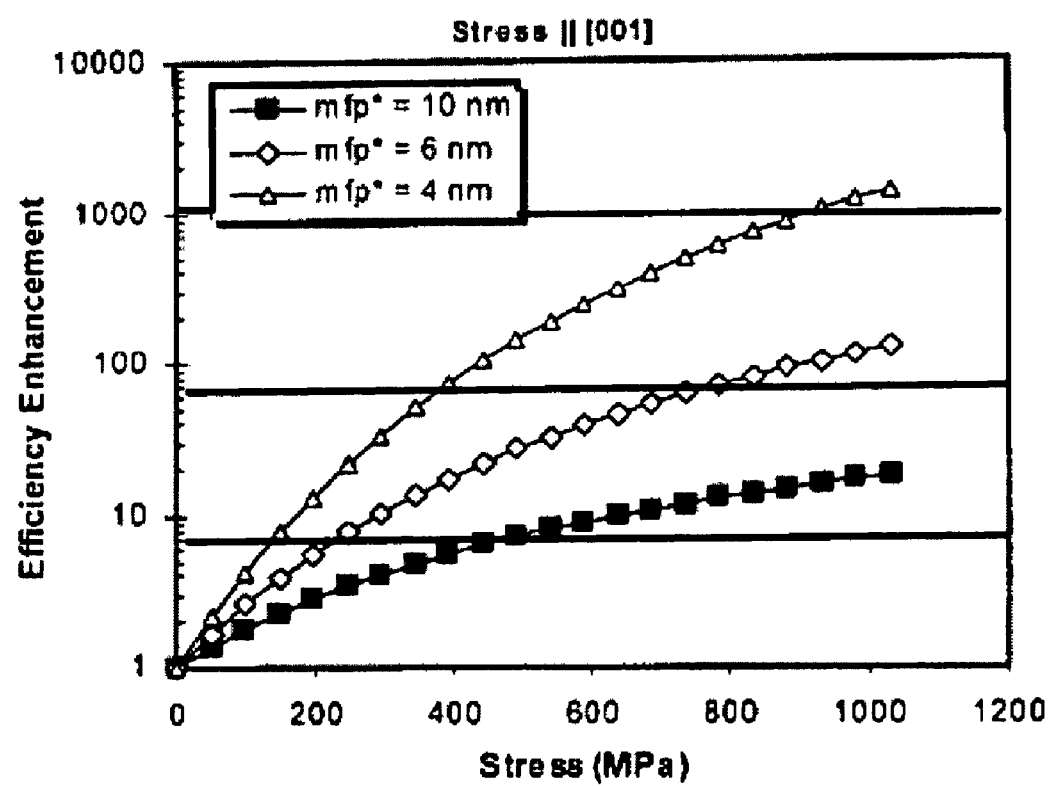
FIG. 20 is a plot illustrating efficiency enhancement versus stress in compressive strained silicon with mean-free-path of unstrained silicon as the plotting parameter.

FIG. 20 illustrates the sensitivity of the efficiency enhancement on the mean-free-path of unstrained silicon ("mfp*" hereinafter). It should be noted that the difference on the mfp* can be due to, for example, different levels of impurity concentration in semiconductor. The stress in parallel with crystallographic direction [001] is chosen in this illustration. Referring to FIG. 20, it is noted that the efficiency enhancement can be more significantly increased in a case having a shorter mfp* (e.g. 4 nm) than in a case having a longer mfp* (e.g. 10 nm) when stresses of both cases are held at a same level. For example, the efficiency enhancement can be 1000 times higher when a stress of 1000 MPa is applied to a silicon having mfp* of 4 nm, whereas the same stress can only achieve 10 times enhancement on efficiency in a silicon having mfp* of 10 nm. The effect demonstrated here is advantageous for scaled memory cell in advanced technologies, where a shorter mfp* is anticipated due to heavier impurity concentration in silicon. This is because a heavier impurity concentration in silicon can assist cell scaling into smaller geometry (for example, it can avoid unduly increase on resistance of regions where ballistic-charges traverse when scaling a memory cell).

It should now be clear that the transport mechanism of ballistic carriers (LH, HH, or electrons) can be altered by employing the piezo-ballistic-charge-injection mechanism. It should also be clear to those of ordinary skill in the art that the teachings of this disclosure can be applied to select different type of stress (e.g. tensile or compressive stress) and to change the axis of the stress through which the holes population and their mean-free-path are altered such that the injection efficiency in these cases can be enhanced.

Although the forgoing discussion has focused on injection of piezo-holes, it will be clear to those ordinary skills in the art that similar considerations, their effects and advantages apply to piezo-ballistic-electrons-injection. Further, although the forgoing discussion has focused on semiconductor (e.g. silicon), it will be clear to those ordinary skills in the art that similar considerations, their effects and advantages apply to other type of conductors (e.g. TiN, TaN, $Si_{1-x}Ge_x$ alloys etc.). Moreover, although the forgoing illustration on charge-injection systems has focused on memory-related application, it will be clear to those ordinary skills in the art that similar considerations, their effects and advantages can be applied to other type of semiconductor devices (e.g. transistors, and amplifiers etc.).

Figure 21A:
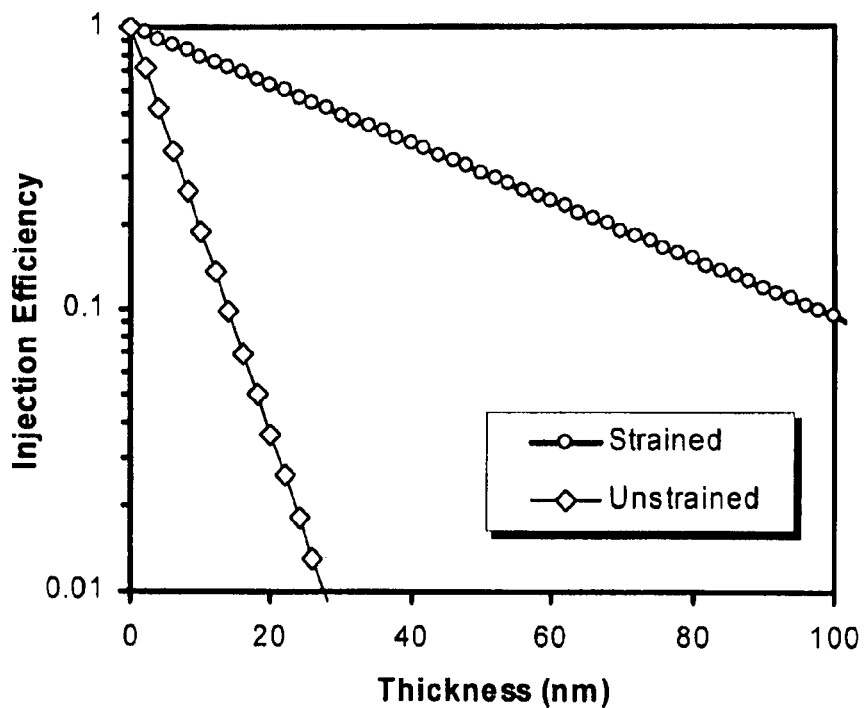
FIG. 21A is a plot illustrating the injection efficiency versus the BG thickness.
Figure 21B:
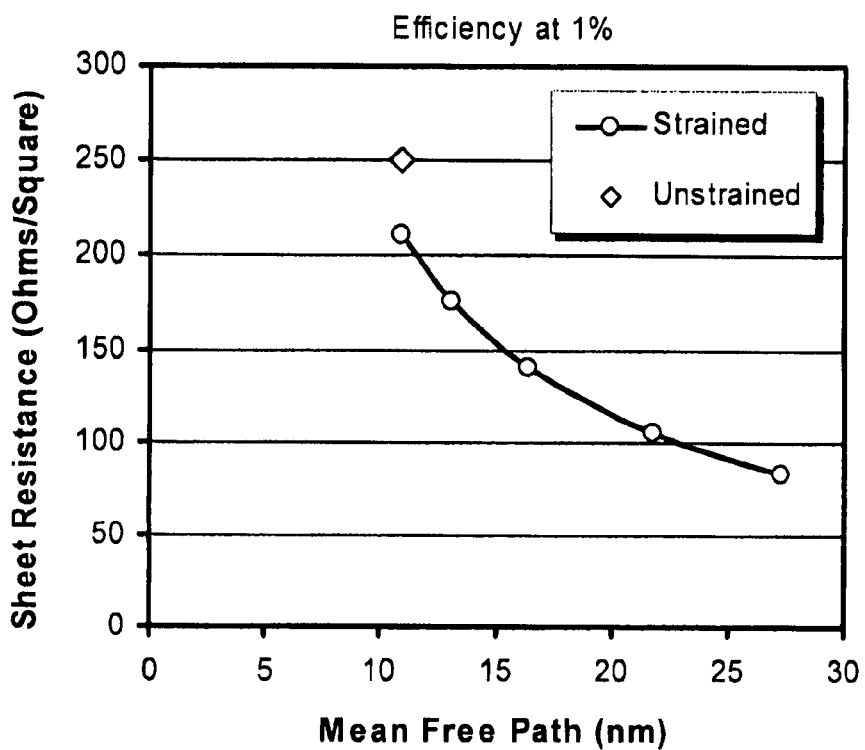
FIG. 21B is a plot illustrating the dependence of sheet resistance of BG on mean-free-path for piezo-electrons injection efficiency at 1 percent.

FIG. 21A shows the injection efficiency plotted versus the thickness of the active layer (BG 62) for ballistic transport comparing results from strained and unstrained silicon. As illustrated, by using the piezo-ballistic-electron-injection mechanism (the strained one), the electrons can be injected onto CSR 66 at much higher efficiency than that achievable by injecting normal electrons of unstrained silicon. This is due to the lower scattering rate and longer mean-free-path of the piezo-electrons, as described earlier (see, e.g. FIG. 17B and its description). This effect provides means in accordance with one aspect of the present invention to fix the problems on large resistance. FIG. 21B shows the dependence of sheet resistance of BG 62 on mean-free-path when injection efficiency is maintained at a fixed value of 1 percent. By employing the piezo-ballistic-electron-injection mechanism, the sheet resistance can be reduced, for example, from 250 Ohms/square for unstrained silicon to about 220 Ohms/square for strained silicon having similar mean-free-path. Employing the mechanism, FIG. 21B also shows that further reduction on sheet resistance can be achieved by increasing the mean-free-path from 10 nm to about 28 nm without compromising injection efficiency.

The piezo-ballistic-charge-injection mechanism can readily be applied to the band structures on charge injection of the present invention. An example is given here by using the energy band structure shown in FIG. 13. Referring to FIG. 13, the TG 61 is now strained to have the majority population of holes be comprised of the LH 75. Having higher LH population in TG 61 is desirable because it provides a higher supplied current for charges having high ballisticity to the injection. This can be done by, for example, applying a tensile stress to TG 61 in accordance with one embodiment of the piezo-ballistic-charge-injection mechanism. With the stress effect, the HH 76, which can coexist with the LH 75 in TG 61, is now at a much lower population (e.g. at about 5 to about 20 percent of the total hole population).

It is noted that while TG 61 is strained under the mechanism described herein, the BG region 62 can be strained under a condition in accordance with another embodiment of the piezo-ballistic-charge-injection mechanism such that the mean-free-path of holes traversing the BG 62 can be longer than mfp* of that region. For example, this can be done by applying a mechanical stress to BG 62 to remove the band degeneracy as described in connection with FIGS. 17B and 17C, which can reduce the inter-band scattering to LH carriers when traversing through that region and hence enhances their injection efficiency.

The Memory Cells of the Present Invention
Embodiment 100

Figure 22:
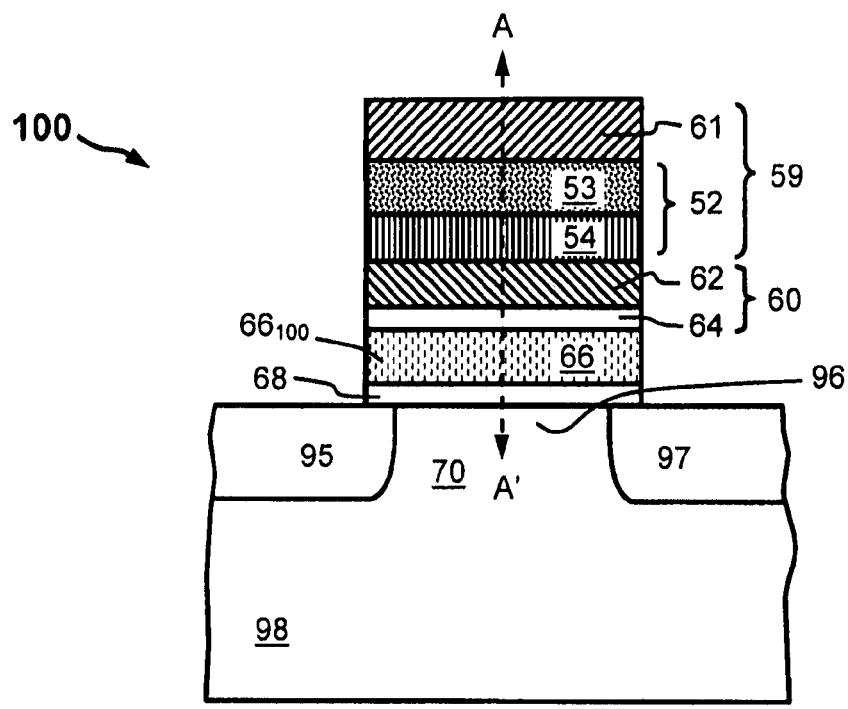
FIG. 22 is the cross sectional view of a cell structure in accordance with one embodiment of the present invention.

FIG. 22 shows a cross-sectional view of cell architecture 100 in accordance with one embodiment on cell structure of the present invention. Referring to cell 100 of FIG. 22, there is shown a conductor-filter system 59 of the type described in connection with FIGS. 7, 9, 11 and 13, a conductor-insulator system 60 of the type described in connection with FIGS. 1, 5 and 6, a charge storage region ("CSR") 66 in the form of a floating gate ("FG") $66_{100}$, and a channel dielectric ("CD") 68. The conductor-filter system 59 comprises a tunneling-gate ("TG") 61, and a filter 52, wherein TG 61 corresponds to the conductor of the system 59. The filter 52 provides the band-pass filtering function as described in connection with FIG. 7, the charge-filtering function as described in connection with FIGS. 10, 12A, 13 and 14, the voltage divider function as described in connection with FIG. 12B, and the mass-filtering function as described in connection with FIG. 15. In a preferred embodiment, the filter 52 comprises a tunneling dielectric ("TD") 53 and a blocking dielectric ("BD") 54 described in connection with FIG. 7. The conductor-insulator system 60 comprises a ballistic gate ("BG") 62 and a retention dielectric ("RD") 64 as the conductor and insulator of the system, respectively. The cell structure in regions from TG 61 to RD 64 is constructed by "contacting" the filter 52 of the conductor-filter system 59 to the conductor (BG 62) of the conductor-insulator system 60. The structure thus formed has TD 53 sandwiched in between the TG 61 and the BD 54 regions, and has BD 54 sandwiched in between the TD 53 and the BG 62 regions. The BG 62 is disposed adjacent to and insulated from the FG $66_{100}$ by the retention dielectric (RD 64). The FG $66_{100}$ is disposed adjacent to and insulated from the body 70 by CD 68. The FG $66_{100}$ is typically encapsulated and insulated by dielectrics such as RD 64, CD 68, or other dielectrics in close proximity having proper thickness and good insulation property to retain charges thereon without leaking. Typically, RD 64 and CD 68 have the thicknesses in the range from about 5 nm to about 20 nm. TD 53 and BD 54 can comprise dielectrics having a uniform chemical element or a graded composition on its element. TD 53 and BD 54 can be dielectric materials from the group comprising oxide, nitride, oxynitride, aluminum oxide ("$Al_2O_3$"), hafnium oxide ("$HfO_2$"), zirconium oxide ("$ZrO_2$"), tantalum pen-oxide ("$Ta_2O_5$"). Furthermore, any composition of those materials and the alloys formed thereof, such as hafnium oxide-oxide alloy ("$HfO_2$—$SiO_2$"), hafnium-aluminum-oxide alloy ("HfAlO"), hafnium-oxynitride alloy ("HfSiON") etc. can be used as dielectric materials for TD and BD. In the preferred embodiment, an oxide dielectric having thickness from 2 nm to 4 nm and a nitride dielectric having thickness ranging from about 2 nm to 5 nm are chosen for TD 53 and BD 54, respectively.

Cell 100 of FIG. 22 further provides a source 95, a channel 96, a drain 97, and a body 70 in a semiconductor substrate 98 (such as a silicon substrate or a silicon-on-insulator substrate). The body 70 comprises a semiconductor material of a first conductivity type (e.g. p-type) having doping level in the range of about $1\times10^{15}$ atoms/cm$^3$ to about $1\times10^{18}$ atoms/cm$^3$. The source 95 and drain 97 are formed in the body 70 with the channel 96 of the body defined therebetween, and are typically heavily doped by impurity of a second conductivity type (e.g. n-type) having doping level in the range of about $1\times10^{18}$ atoms/cm$^3$ to about $5\times10^{21}$ atoms/cm$^3$. These doping regions may be formed by thermal diffusion or by ion implantation.

In FIG. 22, the TG 61 is shown overlapping the BG 62 to form an overlap portion between the two, where at least a portion of FG $66_{100}$ is disposed thereunder. The overlap portion is essential in the cell structure as supplied charge carriers are filtered through that portion in order to be transported through BG 62, RD 64 and finally into the FG $66_{100}$. The FG $66_{100}$ is for collecting and storing such charge carriers and can be polysilicon, poly SiGe or any other types of semiconductor materials that can effectively store charges. The conductivity of FG $66_{100}$ can be an n-type or a p-type. Materials for TG 61 and BG 62 can be from the group comprising a semiconductor, such as n+ polysilicon, p+ polysilicon, heavily-doped poly SiGe etc, or a metal, such as aluminum (Al), platinum (Pt), Au, Tungsten (W), Molybdenum (Mo), ruthenium (Ru), tantalum (Ta), nickel (Ni), tantalum nitride (TaN), titanium nitride (TiN) etc, or alloy thereof, such as tungsten-silicide, nickel-silicide etc. While TG and BG in cell 100 are shown each in a single layer, BG 62 and TG 61 may comprise more than one layer in their respective architecture. For example, TG 61 can comprise a nickel-silicide layer formed atop of a polysilicon layer to form a composite layer for TG 61. The thickness of TG 61 can be in the range from about 80 nm to about 500 nm, and the thickness of BG 62 can be in the range from about 20 nm to about 200 nm.

The energy band structure along line AA' can be the FIG. 9 type, the FIG. 10 type or the FIG. 16 type.

The program operation of memory cell 100 can be done by employing the ballistic-electron injection mechanism as described in connection with FIGS. 9 and 10, or the piezo-ballistic-electron injection mechanism as described in connection with FIG. 17B and FIGS. 9 and 10. These injection mechanisms inject energized charge carriers having energy distribution with an energy spectrum in the range of about 30 meV to about 300 meV onto CSR 66. For the specific embodiment, voltage of TG 61 is chosen in the range of about −3.3 V to about −4.5 V relative to voltage of BG 62 to form a voltage drop therebetween for injecting electrons having tight energy distribution. This can be done, for example, by applying a −3.3 V voltage to TG 61 and a 0 V voltage to BG 62 to generate the −3.3 V voltage drop across TG and BG. Alternately, it can be done by applying other voltage combinations, such as −1.8 V to TG and +1.5 V to BG. The voltage drop across TG and BG can be further lowered by lowering the Image-Force barrier height of the conductor-insulator system 60 as described in connection with FIGS. 3A, 3B and 3C. This can be done by coupling a voltage in the range of about 1 V to about 3 V to CSR 66 through applying voltages in the range of about 1 V to about 3.3 V to source 95, drain 97, and body 70. For example, assuming 8 nm for the thickness of RD, such Image-Force lowering effect can reduce the −3.3 V voltage drop across TG and BG to a range of about −2.8 V to about −3.0 V.

The FG $66_{100}$ of CSR 66 is negatively charged with electron carriers after the cell 100 is programmed to a program state. The programmed state of cell 100 is erased by performing an erase operation. The erase operation can be done by employing the ballistic-hole injection mechanism as described in connection with FIG. 13, or the piezo-ballistic-hole injection mechanism as described in connection with FIGS. 17 B, 17C, and FIG. 13. These injection mechanisms inject energized charge carriers having energy distribution with an energy spectrum in the range of about 30 meV to about 300 meV onto CSR 66. For the specific embodiment, voltage of TG 61 is chosen in the range of about +5 V to about +6 V relative to voltage of BG 62 to form a voltage drop therebetween for injecting light-holes having tight energy distribution. This can be done, for example, by applying a +3 V voltage to TG 61 and a −2 V voltage to BG 62 to generate the +5 V voltage drop across TG and BG. Alternately, it can be done by applying other voltage combinations, such as +2.5 V to TG and −2.5 V to BG. The voltage drop across TG and BG can be further lowered by lowering the Image-Force barrier height of the conductor-insulator system 60 as described in connection with FIG. 6. The Image-Force barrier is somewhat lowered by FG $66_{100}$ when it is negatively charged, and is generally further lowered by coupling a voltage in the range of about −1 V to about −3 V to CSR 66 through applying voltages in the range of about −1 V to about −3.3 V to source 95, drain 97, and body 70. For example, assuming 8 nm for the thickness of RD, such Image-Force lowering effect can reduce the +5 V voltage drop across TG and BG to a range of about +4.5 V to about +4.7 V.

Finally, to read the memory cell, a read voltage of approximately +1V is applied to its drain 97 and approximately +2.5 V (depending upon the power supply voltage of the device) is applied to its BG 62. Other regions (i.e. source 95 and body 70) are at ground potential. If the FG $66_{100}$ is positively charged (i.e. CSR 66 is discharged of electrons), then the channel 96 is turned on. Thus, an electrical current will flow from the source 95 to the drain 97. This would be the "1" state. On the other hand, if the FG $66_{100}$ is negatively charged, the channel 96 is either weakly turned on or is entirely shut off. Even when BG 62 and drain 97 are raised to the read voltage, little or no current will flow through channel 96. In this case, either the current is very small compared to that of the "1" state or there is no current at all. In this manner, the memory cell is sensed to be programmed at the "0" state.

The memory cell 100 of the present invention is illustrated in storing charges on CSR 66 of a conductive or semiconductor material (i.e. FG $66_{100}$) that is electrically insulated from but capacitively coupled to surrounding conductive regions. In such storage scheme, charges are evenly distributed through out CSR 66. However, it should be apparent to those of ordinary skill in the art having the benefit of this disclosure that the present invention is not limited to the illustrated herein and embodiments described above, but can encompass any other type of schemes for storing charges. For example, the memory cells of the present invention can store charges in CSR comprising a plurality of discrete storage sites such as nano-particles or traps in a dielectric layer, as illustrated in FIGS. 23 and 24, respectively.

Embodiment 200

Figure 23:
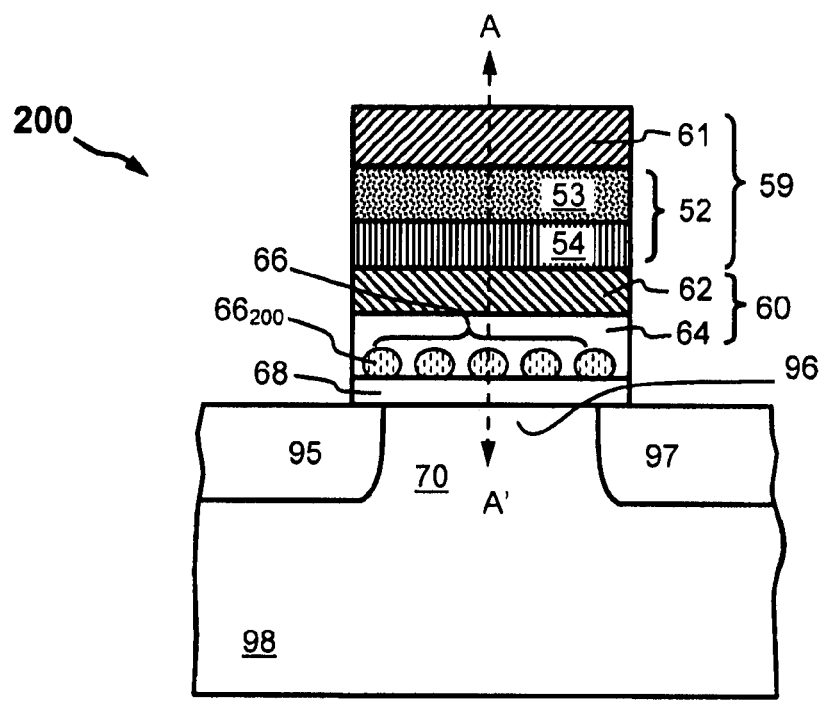
FIG. 23 is the cross sectional view of a cell structure in accordance with another embodiment of the present invention.
Figure 24:
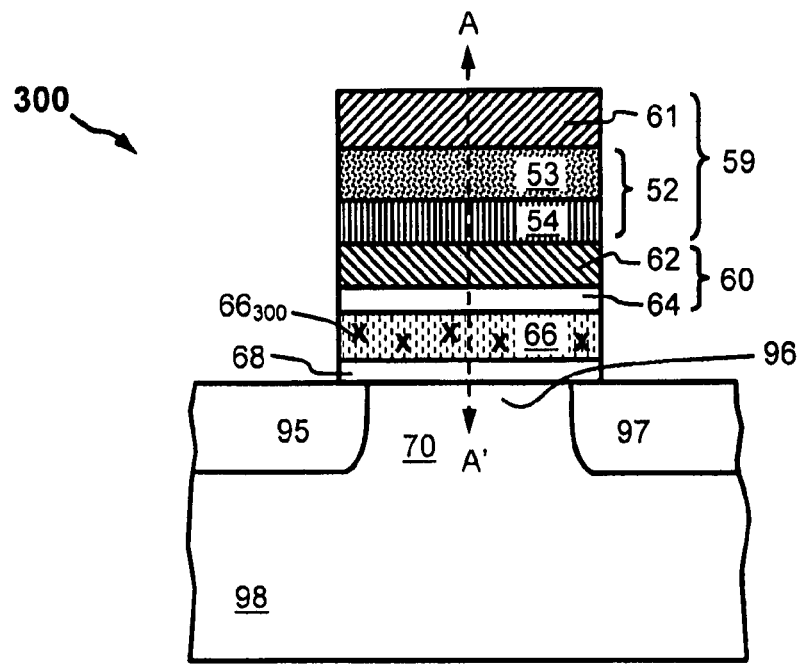
FIG. 24 is the cross sectional view of a cell structure in accordance with another embodiment of the present invention.

Turning now to FIG. 23, a slight variation of the cell 100 of FIG. 22 is presented in a memory cell 200. The cell 200 is in all respect except one the same as cell 100 of FIG. 22. The difference is that instead of a conductive region of FG $66_{100}$ as CSR 66, the cell 200 is provided with a plurality of spaced-apart nano-particles $66_{200}$ formed in nanometer scale as CSR 66. The nano-particles $66_{200}$ is typically in an oval shape having a dimension in the range of about 2 nm to about 10 nm, and is shown contacting CD 68 and formed in RD 64. The RD 64 is shown in a single layer and can be a layer of a stack of different dielectrics, such as a layer of oxide/nitride/oxide stack. The nano-particles as the storage sites can be silicon nano-crystals each in an oval shape having a diameter in the range of about 2 nm to about 7 nm, and can be formed by using well-known CVD technique. The nano-particles can be other types of semiconductor materials (e.g. Ge, SiGe alloy etc.), dielectric particles (e.g. $HfO_2$), or metals (e.g. Au, Ag, Pt etc.) that are in nano-particles form and can effectively store charges.

It should be clear to those of ordinary skill in the art that the nano-particles $66_{200}$ need not be in oval shape in their cross section, need not be co-planar with the substrate surface, but rather can be at any level under or above the substrate surface, and with other shape that can effectively store charge carriers. Moreover, the nano-particles $66_{200}$ need not be contacting the RD 64, need not be fully in the RD 64, but rather can be partially in RD 64 and partially in CD 68, or can be fully in CD 68.

Embodiment 300

FIG. 24 provides cross sectional view on a memory cell 300 of another embodiment in accordance with the present invention. The cell 300 is in all respect except one the same as cell 100 of FIG. 22. The difference is that instead of a conductive region for CSR 66, the cell 300 provides a CSR 66 of trapping dielectric having a plurality of trapping centers (traps $66_{300}$). The dielectric CSR 66 uses traps $66_{300}$ as the charge storage sites and can be a nitride layer formed, for example, by using LPCVD (Low-Pressure-Chemical-Vapor-Deposition) technique well-known in the art. Other dielectrics such as $HfO_2$ and $ZrO_2$ having traps of a deeper trapping energy can also be considered as material for the trapping dielectric.

Both cells 200 and 300 utilize scheme storing charges in localized charge storage sites that are in the form of nano-particles $66_{200}$ and traps $66_{300}$, respectively. These cells can be operated in similar way as that illustrated for cell 100 in connection with FIG. 22. The advantages of these two cell structures are reduced process complexity, and a negligible interference between adjacent cells when such types of cells are arranged in a memory array. Furthermore, in the event there is a local breakdown in surrounding insulators of one of the sites, charges stored at other sites can still be retained to preserve logic data stored thereon.

The dimensions of the cells in accordance with the present inventions are closely related to the design rules of a given generation of process technology. Therefore, the foregoing dimensions on cells and on regions defined therein are only illustrative examples. In general, however, the dimension of the memory cells must be such that supplied charges are filtered and transported through the filter at a higher absolute voltage between TG and BG (e.g. 3 V to 6 V) and blocked by the filter at a lower absolute voltage (e.g. 2.5 V or lower). Furthermore, the dimensions of the BG and RD must be such that a large portion of filtered charges are allowed to transport through that region and be collected by the CSR at an injection efficiency typically ranging from about $10^{-6}$ to about $10^{-1}$.

It is to be understood that the present invention is not limited to the illustrated herein and embodiments described above, but encompasses any and all variations falling within the scope of the appended claims. For example, the cell 100 need not have both the conductor-filter system and the conductor-insulator system in cell structure and operations, but rather can have the conductor-filter system or the conductor-insulator system in the cell structure that effectively filter and transport charge carriers to the CSR.

The memory cells in accordance with the present invention can be formed in an array with peripheral circuitry including conventional row address decoding circuitry, column address decoding circuitry, sense amplifier circuitry, output buffer circuitry and input buffer circuitry, which are well known in the art.

Figure 25:
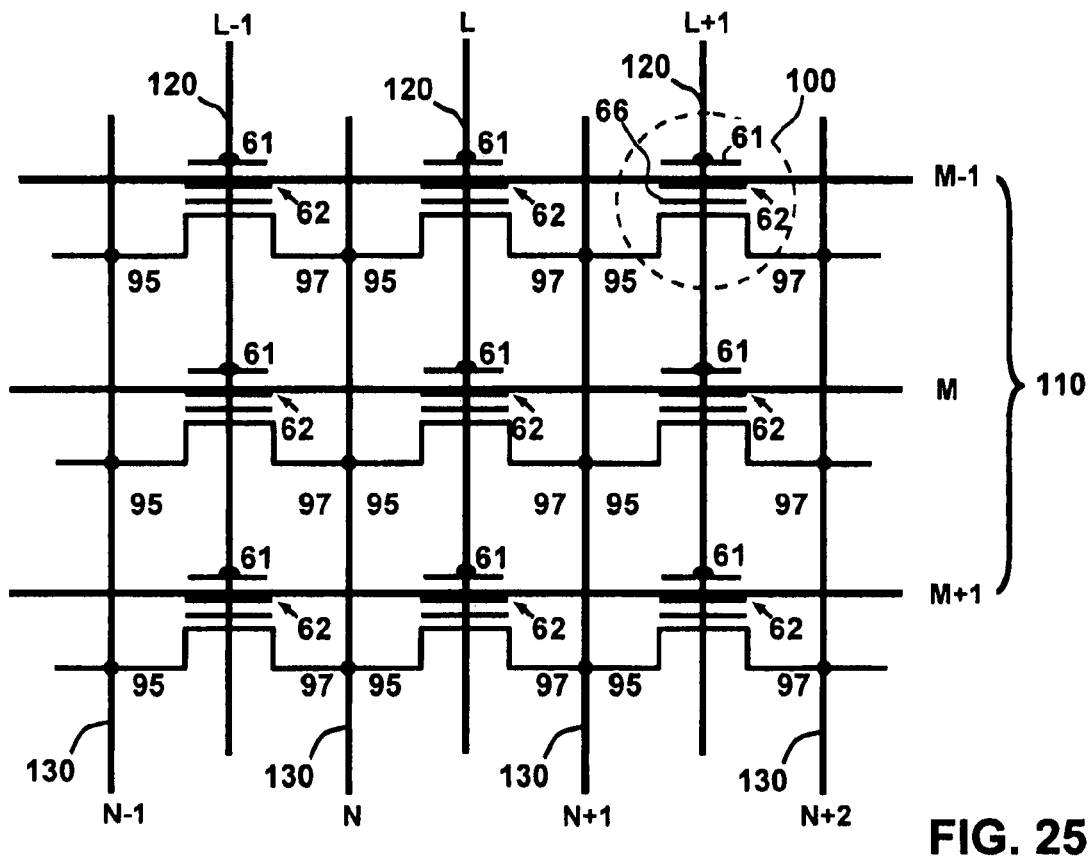
FIG. 25 is the schematics showing the array architecture for memory cells in accordance with the present invention.

The memory cells of these embodiments are typically arranged in a rectangular array of rows and columns, wherein a plurality of cells are constructed in NOR or NAND architecture well-known in the art. FIG. 25 illustrates a NOR array architecture in schematic diagram with illustration made on the memory cell 100. Referring to FIG. 25, there are shown word-lines 110, including word-lines M−1, M, and M+1, oriented in a first direction (row direction). Further, there are shown tunneling-lines 120, including tunneling-lines L−1, L, and L, and bit-lines 130, including N−1, N, N+1, and N+2, all oriented in a second direction (column direction). BG 62 of each of the memory cells 100 in the same row are connected together through one of the word-lines 110. Thereby, the word-line M+1 connects BG 62 of each of the memory cells in the lowermost row. Each of the tunneling-lines 120 connects all the TG 61 of memory cells in the same column. Thereby, the tunneling-line L−1 connects TG 61 of each of the memory cells in the leftmost column of FIG. 25. Likewise, each of the bit-lines 130 connects all the drains 97 of memory cells in the same column. Thereby, the bit-line N connects the drain 97 of each of the memory cells in the leftmost column of FIG. 25. Since the array demonstrated in this example used the virtual ground array architecture, the bit-line N for memory cells on the leftmost column also functioned as the source-line N for memory cells of an adjacent column (i.e. the center column of FIG. 25). Those of skill in the art will recognize that the term source and drain may be interchanged, and the source- and drain-lines or source- and bit-lines may be interchanged. Further, the word-line is connected to BG 62 of the memory cell. Thus, the term BG, BG line may also be used interchangeably with the term word-line.

The NOR array shown in FIG. 25 is a well-known array architecture used as an example to illustrate the array formation using memory cells of the present invention. It should be appreciated that while only a small segment of array region is shown, the example in FIG. 25 illustrates any size of array of such regions. Additionally, the memory cells of the present invention can be applied to other types of NOR array architecture. For example, while each of the bit lines 130 is arranged to share with cells on an adjacent column as a source line, a memory array can be arranged with cells on each column having their own dedicated source line. Furthermore, although the present invention is illustrated in a single cell and in a NOR array, it should be apparent to those of ordinary skill in the art that a plurality of cells of the present invention can be arranged in a rectangular array of rows and columns, wherein the plurality of cells are constructed in NAND array architecture well-known in the art or a combination of a NAND and a NOR array structure.

For memory cells in accordance with the present inventions, it should be noted that both program and erase operations can be done with absolute bias at a level less than or equal to 3.3V. Furthermore, the erase mechanism and cell architecture enable the individually erasable cells feature, which is ideal for storing data such as constants that required periodically changed. The same feature is further extendable to small group of such cells which are erased simultaneously (e.g. cells storing a digital word, which contains 8 cells). Additionally, the same feature is also further extendable to such cells which are erasable simultaneously in large group (e.g. cells storing code for software program, which can contain 2048 cells configured in page, or contain a plurality of pages in block in array architecture).

Methods of Manufacturing

The present invention further provides self-alignment techniques and manufacturing methods to form memory cells and memory array with illustration made on cell of the FIG. 22 type (cell 100) and on array of the FIG. 25 type. While illustration is made on cell 100, such illustration is only by way of example and can be readily modified and applied to other cells in accordance with the present invention.

Figure 26A:
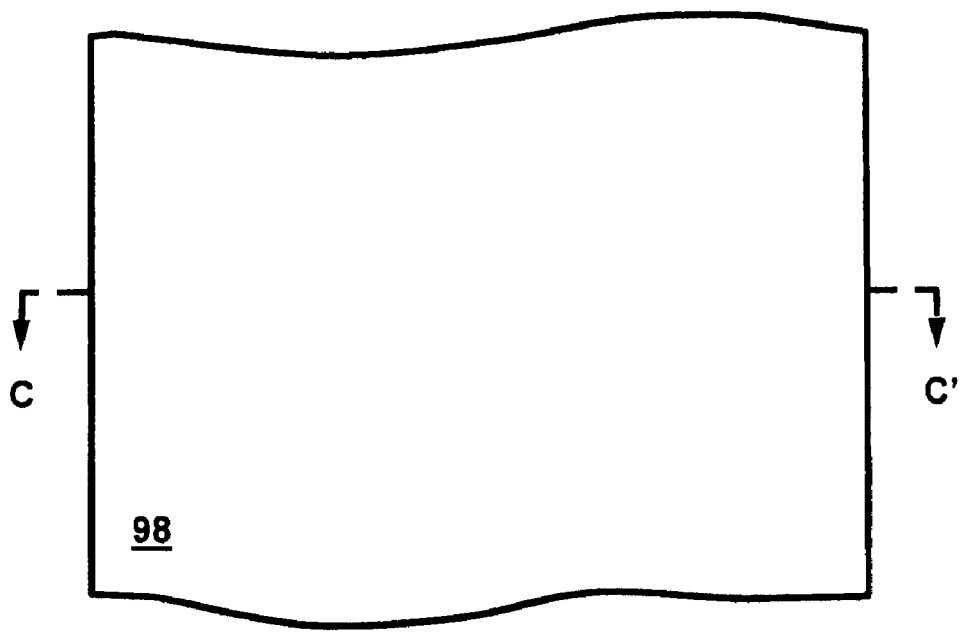
FIG. 26A is a top view of a semiconductor substrate used in the first step of the method of manufacturing memory cells in present invention.
Figure 26B:
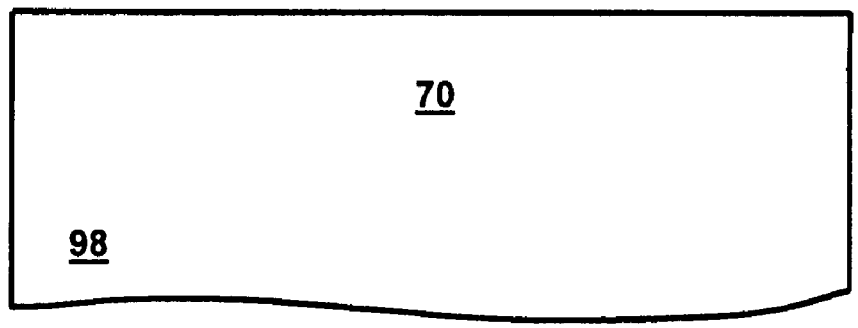
FIG. 26B is a cross sectional view of the structure taken along the line CC' in FIG. 26A.

Referring to FIG. 26A there is shown a top plan view of a semiconductor substrate 98 used as the starting material for forming memory cells and array. A cross-sectional view of the material thus described is shown in FIG. 26B, wherein the substrate 98 is preferably a silicon of a first conductivity type (e.g. p-type). A body 70 is formed in the substrate by well-known techniques such as ion implantation, and is assumed having the first conductivity type. The body 70 can be optionally isolated from the substrate 98 by semiconductor region having a second type of conductivity (e.g. n-type).

With the structure shown in FIG. 26B, the structure is further processed as follows. A first insulator 68 is formed over the substrate 98 with thickness preferably at about 5 nm to about 50 nm. The insulator can be, e.g., oxide deposited by employing conventional thermal oxidation, HTO, TEOS deposition processes, or by in-situ steam generation ("ISSG") techniques well-known in the art The insulator can be in single layer form or in composite layers form with other types of insulator (e.g. combination of oxide and nitride). Next a layer of charge storage material 66a such as polysilicon is deposited over the structure using, for example, conventional LPCVD technique with polysilicon film doped in-situ or by a subsequent ion implantation. The polysilicon layer 66a thus formed is used for forming CSR 66 of memory cell of the FIG. 22 type (cell 100), and can be doped with impurity of a second conductivity type at a doping level in the range of about $1 \times 10^{18}$ atoms/cm$^3$ to about $5 \times 10^{21}$ atoms/cm$^3$. The polysilicon layer 66a is with a thickness, for example, in the range from about 50 nm to 500 nm. Preferably, the topography of the polysilicon layer 66a thus formed is substantially planar. It should be noted that polysilicon is chosen as material for the charge storage layer 66a for illustrating cell 100. In general, other suitable materials having charge storing capability (e.g. nano-particles, trapping dielectrics) can be employed instead for other cell types in accordance with the present invention.

Next, a photo-resistant material ("photo-resist" hereinafter) on the structure surface is suitably applied followed by a masking step using conventional photo-lithography technique to selectively remove the photo-resist leaving a plurality of photo-resist line traces oriented in the second direction (column direction) over the charge storage layer 66a. The process is continued by etching the exposed layer 66a until the insulator 68 is observed, which acts as an etch stop. The portions of layer 66a still underneath the remaining photo-resist are unaffected by this etch process. This step forms a plurality of poly lines 66b orientated in the second direction (or "column direction") with each pair of them spaced apart by a first trench 142. The width of the poly lines 66b and the distance between adjacent poly lines can be as small as the smallest lithographic feature of the process used. An ion implant step is then performed to dope the exposed silicon region in the second type of conductivity to form diffusion regions self-aligned to the first trench 142. Such diffusion regions form the bit-lines 130. The remaining photo-resist is then removed using conventional means.

The process is continued by forming a second insulator layer 64a over the exposed charge storage layer 66a with thickness preferably at about 5 nm to about 50 nm. The insulator can be, e.g., oxide deposited by employing conventional thermal oxidation, HTO, TEOS or ISSG deposition techniques. The insulator can be in single layer form or in composite layers form with other types of insulator (e.g. composite layers of oxide and FSG). The second insulator 64a is used primarily for forming the RD 64 of the memory cells in accordance with the present invention.

Next a layer of conductive material 62a such as polysilicon is deposited over the structure using, for example, conventional LPCVD technique with polysilicon film doped in-situ or by a subsequent ion implantation. The conductive material 62a is for forming BG 62 of memory cells and word-lines 110 of memory array. Typically, the conductive material 62a is with a thickness thick enough to fill the first trenches 142 and can be on the order of, for example, about 20 nm to 200 nm. Preferably, the topography of the conductive material 62a thus formed is substantially planar, and an optional planarization process (i.e. CMP) can be used for achieving the planar topography. The resulted word-line structure 110 generally has a thinner region over the CSR 66 (used for BG 62 of each cell), and a thicker region over the bit-line diffusions 130 for interconnecting BG 62 between cells. It should be noted that polysilicon is chosen for material 62a for illustration purpose (due to process simplicity). In general, any other conductive materials that have a low sheet resistance, a good trench-gap filling capability, and stable material property at high temperature (e.g. 900° C.) can be employed instead. For example, a metalized polysilicon layer such as polysilicon with tungsten-polycide atop can be employed for the conductive layer 62a by using well-known CVD technique. Tungsten-polycide has a sheet-resistance typically about 5 to 10 Ohms/square, and is significantly lower than that in an un-metalized heavily doped polysilicon, whose sheet-resistance is typically about 100 to 300 Ohms/square. Other conductors that are readily available in semiconductor manufacturing, such as TiN, TaN etc., can also be considered as conductive layer 62a.

The process is continued by forming a dielectric 143 over the conductive layer 62a with thickness preferably at about 10 nm to about 50 nm. The dielectric 143 can be a nitride deposited by LPCVD technique well-known in the art.

Next, a photo-resist on the structure surface is suitably applied followed by a masking step using conventional photo-lithography technique to selectively remove the photo-resist leaving a plurality of photo-resist line traces 140 oriented in the first direction (row direction) over the dielectric layer 143. The process is continued by etching the exposed dielectric 143 followed by etching the exposed conductive layer 62a until the insulator 64a is observed, which acts as an etch stop. The portions of layers 143 and 62a still underneath the remaining photo-resist 140 are unaffected by this etch process. This step forms a plurality of word lines 110 orientated in the first direction (or "row direction") with each pair of them spaced apart by a second trench 144. The width of the word-lines 110 and the distance between adjacent word-lines can be as small as the smallest lithographic feature of the process used. The top plan view of the resulting structure is shown in FIG. 27 and the cross-sectional views along lines AA', BB', CC' and DD' of the resulting structure are collectively illustrated in FIGS. 27A, 27B, 27C, and 27D, respectively.

The process is continued by etching the exposed second layer 64a followed by etching the exposed charge storage layer 66a until the first insulator 68 is observed, which acts as an etch stop. The portions of layer 66a underneath the remaining photo-resist are unaffected by this etch process. This step forms a plurality of CSR 66. The remaining photo-resist is then removed using conventional means. The top plan view of the resulting structure is shown in FIG. 28 with word-lines line 110 interlaced with the second trenches 144. The cross-sectional views along lines AA', BB', CC' and DD' of the resulting structure are collectively illustrated in FIGS. 28A, 28B, 28C, and 28D, respectively.

The process is continued by optionally forming an insulating layer (not shown) such as oxide on sidewalls of word-lines 110 and CSR 66 exposed to the trench 144. The oxide can be formed by for example performing a thermal oxidation step using rapid-thermal-oxidation (RTO) technique, and can have a thickness at about 2 nm to about 8 nm. Next, a relative thick dielectric layer (e.g. oxide) is formed to fill the trenches 144 by using well-known techniques such as conventional LPCVD. The oxide dielectric is then selectively removed to leave oxide blocks 146 in region within the trenches 144. The preferable structure is with the top surface of the oxide blocks 146 substantially co-planar with the top surface of the nitride dielectric 143. This can be done by, for example, employing a chemical-mechanical polishing (CMP) process to planarize the thick oxide followed by an RIE (reactive ion etch) using nitride dielectric 143 as a polishing and/or etching stopper. An optional oxide over-etching step follows if necessary to clear any oxide residue on the nitride dielectric 143. Thereby, the process leaves oxide only in trenches 144 to form oxide blocks 146 self-aligned to the trenches 144. The top plan view of the resulting structure is illustrated in FIG. 29 with word-lines 110 interlaced with the oxide line blocks 146. The cross-sectional views along lines AA', BB', CC' and DD' of the resulting structure are collectively illustrated in FIGS. 29A, 29B, 29C, and 29D.

The process is continued by an etching step removing the nitride dielectric 143 (e.g. using hot phosphoric acid). Next, a filter 52 having multi-layers dielectrics is formed over the word-lines 110. In a specific embodiment, a third insulator 54a and a fourth insulator 53a are considered as the multi-layers dielectrics for the filter 52. The third insulator layer 54a such as nitride is formed over the word-lines 110 by employing thermal nitridation such as rapid-thermal-nitridation (RTN) in NH3 ambient at 1050 C. The third insulator 54a has a thickness preferably at about 2 nm to about 5 nm. The process is continued by forming the fourth insulator layer 53a such as oxide over the third insulator 54a. The fourth insulator can be formed by using thermal oxidation, HTO, TEOS, or ISSG techniques well-known in the art. The fourth insulator 53a has a thickness preferably at about 2 nm to about 4 nm. The third and fourth insulator layers 54a and 53a are used as BD 54 and TD 53, respectively, of the memory cells in accordance with the present invention. The top plan view of the resulting structure is illustrated in FIG. 30, and the cross-sectional views along lines AA', BB', CC' and DD' of the resulting structure are collectively illustrated in FIGS. 30A, 30B, 30C, and 30D.

The process is continued by forming a layer of conductive material 61a such as polysilicon over the structure using, for example, conventional LPCVD technique with polysilicon film doped in-situ or by a subsequent ion implantation. The conductive material 61a is for forming tunneling-lines 120 of memory array and TG 61 of memory cells. Typically, the conductive material 61a has a thickness at about 50 nm to 500 nm. Preferably, the topography of the conductive material 61a thus formed is substantially planar, and an optional planarization process (i.e. CMP) can be used for achieving the planar topography. It should be noted that polysilicon is chosen for material 61a for illustration purpose (due to process simplicity). In general, any other conductive materials that have a low sheet resistance, and stable material property at high temperature (e.g. 900° C.) as described in connection with FIG. 27, can be employed instead. Other conductors that are readily available in semiconductor manufacturing, such as platinum-silicide, nickel-silicide, cobalt-silicide, titanium-silicide, TiN, TaN etc., can also be considered as conductive layer 61a. Further, such types of conductors can be formed atop of polysilicon to form a composite conductor for use as layer 61a.

Next, a photo-resist on the structure surface is suitably applied followed by a masking step using conventional photo-lithography technique to selectively remove the photo-resist leaving a plurality of photo-resist line traces oriented in the second direction (column direction) over the conductive layer 61a. The process is continued by etching the exposed conductive layer 61a until the insulator 53a is observed, which acts as an etch stop. The portions of conductive layer 61a still underneath the remaining photo-resist are unaffected by this etch process. This step forms a plurality of tunneling-lines 120 orientated in the second direction (or "column direction") with each pair of them spaced apart by a third trench 147. The width of the tunneling-lines 120 and the distance between adjacent tunneling-lines can be as small as the smallest lithographic feature of the process used. The top plan view of the resulting structure is illustrated in FIG. 31 with tunneling-lines 120 interlaced with the third trenches 147. The cross-sectional views along lines AA', BB', CC' and DD' of the resulting structure are collectively illustrated in FIGS. 31A, 31B, 31C, and 31D.

FIG. 31C also shows various regions of a memory cell of the FIG. 22 type (cell 100). The bit-line $130_1$ and the bit-line $130_2$ correspond to the source 95 and drain 97 of cell 100. Further shown are CD 68, CSR 66, RD 64, BG 62, BD 54, TD 53, and TG 61 identical to their respective regions in cell 100 described in connection with FIG. 22.

Figure 32:
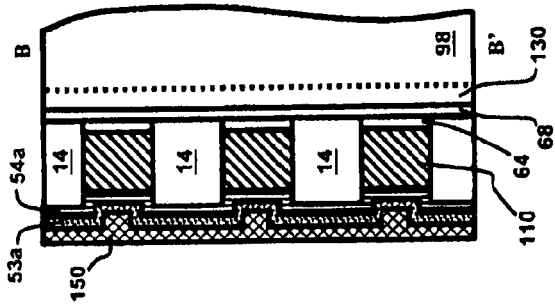
Figures 32A, 32B:
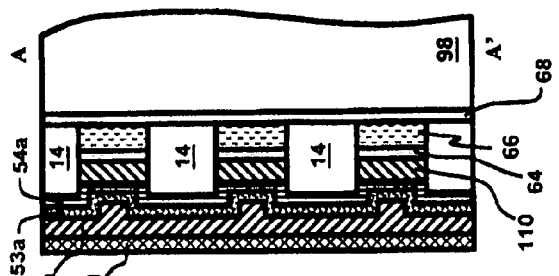
Figure 32C:
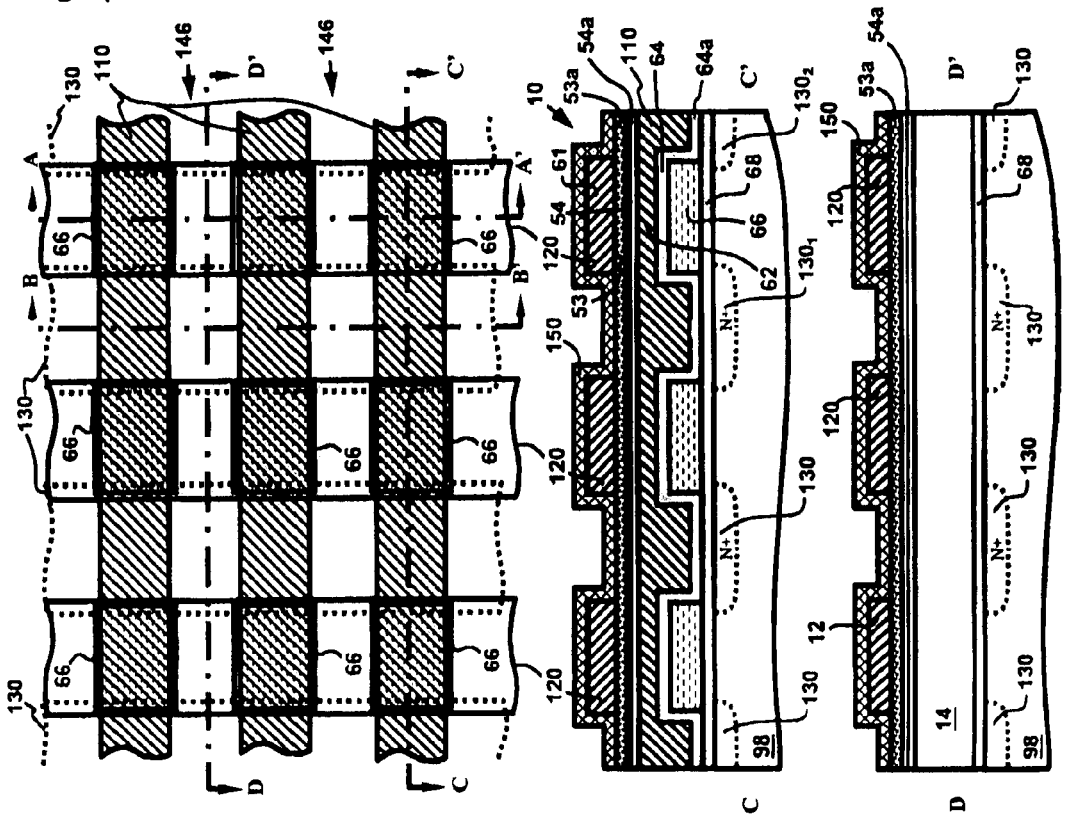
Figure 32D:
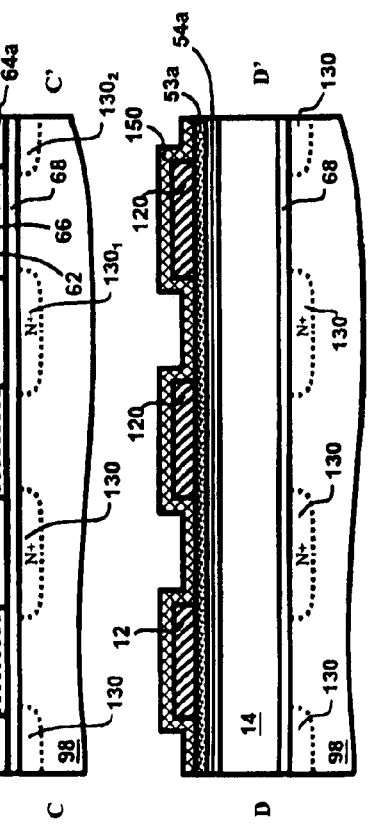

The structure on memory cells and array can be further processed by depositing a layer of strain material 150 having mechanical stresses (e.g. tensile stress or compressive stress). The strain material serves as a stress source providing piezo-ballistic-charge-injection mechanism as described in connection with FIGS. 17B and 17C, and can be deposited over the structure shown in FIG. 31, or can be deposited after removing the exposed insulators 53a and 54a in third trenches 147 by using conventional etching techniques such as RIE. In the former case, the stress material 150 provides stress primarily to TG 61. In the later case, the strain material also contacts word-lines 110 and hence provides stress to TG 61 and BG 62 of each of memory cells. The strain material 150 can be a dielectric providing different types of stress and is used for generating piezo-effect in TG 61 and/or BG 62 for the piezo-ballistic-charge-injection. The stress can be a uniaxial stress with a stress axis generally parallel to the surface TG 61 and along the first direction (row direction). A preferred embodiment for the strain material 150 comprises nitride. The stress level and physical properties of the nitride can be controlled by the thickness and process conditions in its formation. For example, by changing the pressure on chemical elements (e.g. silane) during its formation, magnitude on stress level in the range of about 50 MPa to about 1 giga Pascal ("GPa") can be achieved. The nitride can be formed to have either tensile stress or compressive stress by employing well-known chemical-vapor-deposition ("CVD") techniques such as thermal-CVD (for tensile stress nitride) or plasma-CVD (for compressive stress nitride). Further, the stress level of nitride can be tailored or even be relaxed if necessary by using well-known technique, such as ion implanting Ge into the nitride with implant dosage above a threshold level (e.g. about $1 \times 10^{14}$ atoms/cm$^2$). The top plan view of the resulting structure of the former case is illustrated in FIG. 32 with strain material 150 disposed over the entire array. The cross-sectional views along lines AA', BB', CC' and DD' of the resulting structure are collectively illustrated in FIGS. 32A, 32B, 32C, and 32D.

It should be clear to those of ordinary skill in the art having the benefit of this disclosure that the strain source resulting in piezo-effect on BG 62 and TG 61 in the present invention need not be originated from the strain material 150 and need not be from its shown location, but rather can be from any other means and in any other regions in the memory cell. Further, the stress need not be of the uniaxial type but rather can be other type (e.g. biaxial type). For example, the strain source can be from the BG 62 when polysilicon is employed as material for that region. This is because polysilicon can provide tensile stress with stress level typically in the range of about 200 MPa to about 500 MPa. Another material for the strain source is tungsten-silicide, which is a widely used material in manufacturing semiconductor IC. Tungsten-silicide provides stress level in the range of about 1.5 GPa to about 2 GPa, and can be employed alone to form BG. Further, it can be deposited atop a polysilicon layer such that both layers collectively form the BG 62. Other materials such as amorphous silicon, poly SiGe, TaN, TiN etc. can also be considered as materials. Moreover, means introducing strain need not be from employing strain materials, but rather can be through other approaches, such as ion implanting heavy atoms (e.g. Si, Ge, As etc.) into the regions of crystal to be strained. Implanting heavy atoms at dosage above a critical dosage can disturb the periodicity of crystal lattice, and create dislocation loops and hence stress in that region. Further the stress in that region can provide strain to region adjacent to it.

The stress in the implanted region can be preserved by implanting atom such as nitrogen in that region to prevent stress from being relaxed in later processing steps during cell manufacturing. The ion implantation approach has the advantage on process simplicity as it does not require depositing and etching strain material. Further it can form stress in implanted regions and hence can localize the stress in regions where strain effect is most desired. Among all these approaches, they all provide desired piezo-effect for the piezo-ballistic-charge-injection in accordance with the present invention. Additionally, although one strain source is illustrated in memory cells in accordance with the present invention, it should be clear to those of ordinary skill in the art that two or more strain sources can coexist in the same cell to provide any variations on stress (tensile or compressive) to various regions of memory cell falling within the scope of the appended claims.

Furthermore, the strain material of the present invention need not be disposed on both sides of TG, need not be disposed over BG, need not be rectangular in their cross-sections, need not be in direct contact with TG, need not be in direct contact with BG, but rather can be disposed over TG, can be disposed under BG, can be in any position adjacent to TG and BG, can be any size and shape in their cross-sections, can be in indirect contact with TG, and can be in indirect contact with BG that effectively provide strain to TG and to BG in each memory cell. Moreover, those of skill in the art will recognize the source resulting in strain need not be termed "strain source" but can be in any other terms (e.g. "stressor", "stress source" etc.) that can provide mechanical stress to generate piezo-effect on charge injection and transports.

Moreover, the charge storage region of the present invention need not be in rectangular shape in their top view, need not be in rectangular in their cross-sections, but rather can be any size and shape in their top view and in their cross-sections that effectively store charges and effectively connects the drain 97 and source 95 in each memory cell. Additionally, the top and the bottom surface of filter 52 need not be parallel to the substrate surface, need not be flat, need not be co-planar with the substrate surface, but rather can be at any level under or above the substrate surface, in any angle with the substrate surface, and with other shape that can effectively perform the filtering function.

The invention claimed is:

1. A method of forming a memory cell, the method comprising:
    forming a body of a first conductivity type in a semiconductor substrate;
    forming a first insulator layer adjacent to the substrate;
    forming a charge storage region adjacent to the first insulator layer;
    forming first and second regions of a second conductivity type in the body;
    forming a channel region in the body between the first region and the second region, and generally disposed adjacent to and insulated from the charge storage region;
    forming a second insulator layer adjacent to the charge storage region;
    forming a first electrically conductive region comprising at least a portion thereof disposed adjacent to and insulated from the charge storage region by the second insulator layer;
    forming a layer adjacent to the first electrically conductive region;
    forming a second electrically conductive region adjacent to and separated from the first electrically conductive region by the layer; and
    forming a strain source that provides mechanical stress to at least one of the first and second electrically conductive regions,
    wherein:
        the second electrically conductive region overlaps the first electrically conductive region at an overlap surface; and
        a line perpendicular to the overlap surface intersects at least a portion of the charge storage region.

2. The method of claim 1, wherein at least a portion of the charge storage region is disposed under the overlap surface.

3. The method of claim 1, wherein the strain source comprises a material selected from the group consisting of thermal-CVD nitride, plasma-CVD nitride, tungsten-silicide, amorphous silicon, poly SiGe, TaN, and TiN.

4. The method of claim 1, wherein the strain source imposes a compressive stress.

5. The method of claim 1, wherein the strain source imposes a tensile stress.

6. The method of claim 1, further comprising ion implanting one or more impurities into the strain source for tailoring a stress level of the mechanical stress.

7. The method of claim 1, wherein the strain source comprises dislocation loops in at least one of the first and second electrically conductive regions.

8. The method of claim 1, further comprising ion implanting atoms at a predetermined dosage into at least one of the first and second electrically conductive regions.

9. The method of claim 1, wherein the atoms comprise at least one material selected from the group consisting of Si, Ge, As, and nitrogen.

10. The method of claim 1, wherein:
    the layer comprises a filter;
    the filter includes a multi-layer dielectric and further comprises a voltage-divider function for reducing voltage drops in the multi-layer dielectric; and
    the filter provides a filtering function selected from a group consisting of band-pass filtering, mass-filtering, and charge-filtering.

11. The method of claim 10, wherein:
    the layer comprises a filter; and
    the filter provides a filtering function selected from a group consisting of band-pass filtering, mass-filtering, and charge-filtering.

12. The method of claim 1, wherein the forming the layer comprises:
    forming a first dielectric adjacent to the second electrically conductive region; and
    forming a second dielectric adjacent to the first dielectric, wherein the second dielectric has an energy band gap narrower than an energy band gap of the first dielectric.

13. The method of claim 12, wherein a product of a dielectric constant of the second dielectric and a thickness of the first dielectric is substantially greater than a product of a dielectric constant of the first dielectric and a thickness of the second dielectric.

14. The method of claim 12, wherein the first dielectric comprises oxide, and the second dielectric comprises a material selected from the group consisting of nitride, oxynitride, $Al_2O_3$, $HfO_2$, $TiO_2$, $ZrO_2$, $Ta_2O_5$, and alloys formed thereof.

15. The method of claim 14, wherein the oxide is formed using at least one technique selected from the group consisting of thermal oxidation, HTO, TEOS, and ISSG.

16. The method of claim 12, wherein the first dielectric comprises oxynitride, and the second dielectric comprises a material selected from the group consisting of nitride, $Al_2O_3$, $HfO_2$, $TiO_2$, $ZrO_2$, $Ta_2O_5$, and alloys formed thereof.

17. The method of claim 12, wherein the second dielectric is arranged between the first dielectric and the second electrically conductive region.

18. The method of claim 12, wherein the first dielectric and the second dielectric are arranged between said second electrically conductive region and one of a drain and a source.

19. The method of claim 1, wherein the charge storage region comprises a plurality of spaced-apart nano-particles.

20. The method of claim 1, wherein the charge storage region comprises a trapping dielectric comprising a plurality of trapping centers.

21. The method of claim 1, wherein the forming the first and second regions is performed before the forming the first insulator layer adjacent to the substrate.

22. The method of claim 1, wherein the forming the first and second regions is performed after the forming the charge storage region adjacent to the first insulator.

23. The method of claim 1, further comprising arranging the strain source adjacent to a first surface of the second electrically conductive region,
wherein:
the strain source adjusts the mechanical stress including one of tensile stress and compressive stress of at least one of the second electrically conductive region and the first electrically conductive region;
the layer is adjacent a second surface of the second electrically conductive region; and
the first surface opposes the second surface.

24. The method of claim 23, wherein the strain source provides a piezo-effect in at least one of the first electrically conductive region and the second electrically conductive region.

25. The method of claim 23, wherein:
the strain source is fabricated using chemical-vapor-deposition; and
the strain source comprises nitride.

26. The method of claim 23, wherein:
the strain source is arranged adjacent to the first surface of the second electrically conductive region and adjacent to a tunneling dielectric; and
the tunneling dielectric is arranged between the second electrically conductive region and a blocking dielectric.

27. The method of claim 23, wherein:
the first insulator layer is a channel dielectric;
the charge storage region is a floating gate;
the first and second regions include a source and a drain;
the second insulator layer is a retention dielectric;
the first electrically conductive region is a ballistic gate;
the layer comprises a plurality of dielectrics; and
the second electrically conductive region is a tunneling gate.

28. The method of claim 1, wherein:
the layer comprises a filter; and
the method further comprises controlling flow of charge carriers of one polarity through the filter in a first direction using a first set of electrically alterable potential barriers of the layer.

29. The method of claim 28, further comprising controlling flow of charge carriers of an opposite polarity through the layer in a second direction using a second set of electrically alterable potential barriers,
wherein the second direction is substantially opposite to the first direction.

30. The method of claim 28, further comprising applying an electric field to alter height of at least one of said electrically alterable potential barriers.

31. A method of providing an array of memory cells, the method comprising:
forming a body of a first conductivity type in a semiconductor substrate;
forming a first insulator layer adjacent to the substrate;
forming a plurality of charge storage regions adjacent to the first insulator layer and arranged in an array of columns extending in a first direction and rows in a second direction generally perpendicular to the first direction;
forming a plurality of first regions of a second conductivity type;
forming a plurality of second regions of the second conductivity type;
forming a plurality of channel regions in the body each extending between one of the first regions and one of the second regions, and generally disposed adjacent to and insulated from one of the charge storage regions;
forming a second insulator layer adjacent to each of the charge storage regions;
forming a plurality of first electrically conductive regions each comprising at least a portion thereof disposed adjacent to and insulated from one of the charge storage regions by the second insulator layer;
forming a plurality of layers each comprising at least a portion disposed adjacent to one of the first electrically conductive regions;
forming a plurality of second electrically conductive regions each comprising charge carriers with an energy distribution and each disposed adjacent to and separated from one of the first electrically conductive regions by one of the layers;
forming a plurality of parallel spaced apart bit-lines extending in the first direction with at least one of the bit-lines electrically connected to at least one of the second regions; and
forming a plurality of strain sources, each strain source providing a mechanical stress to at least one of the first and second electrically conductive regions,
wherein:
each of the first electrically conductive regions overlaps one of the second electrically conductive regions at an overlap surface; and
lines perpendicular to the overlap surfaces intersect corresponding ones of the charge storage regions.

32. The method of claim 31, wherein each of the strain sources comprises a material selected from the group consisting of thermal-CVD nitride, plasma-CVD nitride, tungsten-silicide, amorphous silicon, poly SiGe, TaN, and TiN.

33. The method of claim 31, wherein each of the strain sources imposes a compressive stress.

34. The method of claim 31, wherein each of the strain sources imposes a tensile stress.

35. The method of claim 31, further comprising:
forming a plurality of parallel spaced apart word-lines of conductive material each extending across the bit-lines in the second direction, wherein each of the word-lines is electrically connected to at least one of the first electrically conductive regions; and
forming a plurality of parallel spaced apart tunneling-lines of conductive material each extending in the first direction and electrically connected to at least one of the second electrically conductive regions.

36. The method of claim 35, further comprising forming a plurality of oxide line blocks interlaced with the word-lines.

37. The method of claim 31, wherein the at least a portion of each of charge storage regions is disposed under a corresponding one of the overlap surfaces.

38. The method of claim 31, wherein each of the bit-lines is formed in at least a portion of the body.

39. The method of claim 31, wherein at least one of the bit-lines is electrically connected to at least one of the first regions.

40. The method of claim 31, wherein each of the plurality of layers comprises a filter.

41. The method of claim 31, wherein each of the filters includes a multi-layer dielectric and further comprises a voltage-divider function for reducing voltage drops in the multi-layer dielectric.

42. The method of claim 31, wherein each of the filters includes at least one filtering function selected from a group consisting of band-pass filtering, mass-filtering, and charge-filtering.

43. The method of claim 31, wherein the forming the plurality of layers comprises:
    forming a plurality of first dielectrics each adjacent to one of the second electrically conductive regions; and
    forming a plurality of second dielectrics each adjacent to one of the first dielectrics, wherein each of the second dielectrics has an energy band gap narrower than an energy band gap of each of the first dielectrics.

44. The method of claim 43, wherein a product of a dielectric constant of each of the second dielectrics and a thickness of each of the first dielectrics is substantially greater than a product of a dielectric constant of each of the first dielectrics and a thickness of each of the second dielectrics.

45. The method of claim 43, wherein each of the first dielectrics comprises oxide, and each of the second dielectrics comprises a material selected from the group consisting of nitride, oxynitride, $Al_2O_3$, $HfO_2$, $TiO_2$, $ZrO_2$, $Ta_2O_5$, and alloys formed thereof.

46. The method of claim 43, wherein each of the first dielectrics comprises oxynitride, and each of the second dielectrics comprises a material selected from the group consisting of nitride, $Al_2O_3$, $HfO_2$, $TiO_2$, $ZrO_2$, $Ta_2O_5$, and alloys formed thereof.

47. The method of claim 31, wherein the forming the plurality of first and second regions is performed before the forming the first insulator layer adjacent to the substrate.

48. The method of claim 31, wherein the forming the plurality of first and second regions is performed after the forming the plurality of charge storage region adjacent to the first insulator.

49. A method of providing a memory cell, the method comprising:
    providing a semiconductor substrate including a body of a first conductivity type, first and second regions of a second conductivity type and a channel between the first and second regions;
    arranging a first insulator layer adjacent to the substrate;
    arranging a charge storage region adjacent to the first insulator layer;
    arranging a second insulator layer adjacent to the charge storage region;
    arranging a first conductive region adjacent to the second insulator layer;
    arranging a layer adjacent to the first conductive region;
    arranging a second conductive region adjacent to and separated from the first conductive region by the layer; and
    increasing mechanical stress of at least one of the first and second conductive regions,
    wherein:
        the second conductive region overlaps the first conductive region at an overlap surface; and
        a line perpendicular to the overlap surface intersects at least a portion of the charge storage region.

50. The method of claim 49, wherein the at least a portion of the charge storage region is disposed under the overlap surface.

51. The method of claim 49, wherein increasing mechanical stress comprises providing a material selected from the group consisting of thermal-CVD nitride, plasma-CVD nitride, tungsten-suicide, amorphous silicon, poly SiGe, TaN, and TiN.

52. The method of claim 51, further comprising ion implanting an impurity into the material.

53. The method of claim 49, wherein the mechanical stress comprises compressive stress.

54. The method of claim 49, wherein the mechanical stress comprises tensile stress.

55. The method of claim 49, further comprising providing dislocation loops in at least one of the first and second conductive regions.

56. The method of claim 49, further comprising ion implanting atoms at a predetermined dosage into at least one of the first and second conductive regions.

57. The method of claim 56, wherein the atoms comprise at least one material selected from the group consisting of Si, Ge, As, and nitrogen.

58. The method of claim 49, wherein the layer comprises a filter.

59. The method of claim 58, wherein the filter includes a multi-layer dielectric.

60. The method of claim 58, further comprising performing at least one of band-pass filtering, mass-filtering, and charge-filtering using the filter.

61. The method of claim 49, wherein arranging the layer comprises:
    forming a first dielectric adjacent to the second conductive region; and
    forming a second dielectric adjacent to the first dielectric, wherein the second dielectric has an energy band gap narrower than an energy band gap of the first dielectric.

62. The method of claim 61, wherein a first product of a dielectric constant of the second dielectric and a thickness of the first dielectric is substantially greater than a second product of a dielectric constant of the first dielectric and a thickness of the second dielectric.

63. The method of claim 61, wherein the first dielectric comprises oxide, and the second dielectric comprises a material selected from the group consisting of nitride, oxynitride, $Al_2O_3$, $HfO_2$, $TiO_2$, $ZrO_2$, $Ta_2O_5$, and alloys formed thereof.

64. The method of claim 63, wherein the oxide is formed using at least one technique selected from the group consisting of thermal oxidation, HTO, TEOS, and ISSG.

65. The method of claim 61, wherein the first dielectric comprises oxynitride, and the second dielectric comprises a material selected from the group consisting of nitride, $Al_2O_3$, $HfO_2$, $TiO_2$, $ZrO_2$, $Ta_2O_5$, and alloys formed thereof.

66. The method of claim 49, wherein the charge storage region comprises a plurality of spaced-apart nano-particles.

67. The method of claim 49, wherein the charge storage region comprises a trapping dielectric comprising a plurality of trapping centers.

68. A method of providing a memory cell, the method comprising:

providing a semiconductor substrate including a body of a first conductivity type, first and second regions of a second conductivity type and a channel between the first and second regions;

forming a first insulator layer adjacent to the substrate;

forming a charge storage region adjacent to the first insulator layer;

forming a second insulator layer adjacent to the charge storage region;

forming a first conductive region adjacent to the second insulator layer;

forming a layer adjacent to the first conductive region;

forming a second conductive region adjacent to and separated from the first conductive region by the layer; and increasing mechanical stress of at least one of the first and second conductive regions, wherein:
  the second conductive region overlaps the first conductive region at an overlap surface; and
  a line perpendicular to the overlap surface intersects at least a portion of the charge storage region.

* * * * *